US006591402B1

United States Patent
Chandra et al.

(10) Patent No.: US 6,591,402 B1
(45) Date of Patent: Jul. 8, 2003

(54) SYSTEM AND METHOD FOR PERFORMING ASSERTION-BASED ANALYSIS OF CIRCUIT DESIGNS

(75) Inventors: Rajit Chandra, Cupertino, CA (US); Joydeep Mitra, San Jose, CA (US); Steven B. Parks, Santa Clara, CA (US); Chandrasekhara Somanathan, Milpitas, CA (US)

(73) Assignee: Moscape, Inc., Santa Clara, CA (US)

( * ) Notice: Subject to any disclaimer, the term of this patent is extended or adjusted under 35 U.S.C. 154(b) by 0 days.

(21) Appl. No.: 09/528,088

(22) Filed: Mar. 17, 2000

Related U.S. Application Data

(60) Provisional application No. 60/125,365, filed on Mar. 19, 1999.

(51) Int. Cl.[7] ............................................. G06F 17/50
(52) U.S. Cl. ........................................................ 716/5
(58) Field of Search ............................... 706/50; 716/2, 716/4, 5, 18

(56) References Cited

U.S. PATENT DOCUMENTS

| 5,381,417 A | 1/1995 | Loopik et al. ............. 371/15.1 |
| 5,383,167 A | 1/1995 | Weil |
| 5,557,531 A | 9/1996 | Rostoker et al. |
| 5,634,115 A | 5/1997 | Fitzpatrick et al. |
| 5,648,909 A | 7/1997 | Biro et al. |
| 5,650,938 A | 7/1997 | Bootehsaz et al. |
| 5,805,861 A | 9/1998 | Gilbert et al. |
| 5,850,348 A | 12/1998 | Berman |
| 5,995,955 A | * 11/1999 | Oatman et al. ............... 706/50 |
| 6,026,220 A | 2/2000 | Cleereman et al. ............ 716/3 |
| 6,026,228 A | 2/2000 | Imai et al. ..................... 716/18 |

* cited by examiner

Primary Examiner—Matthew Smith
Assistant Examiner—Thuan Do
(74) Attorney, Agent, or Firm—Townsend and Townsend and Crew LLP

(57) ABSTRACT

Techniques for analyzing circuit designs based on assertions. An assertion is associated with a circuit structure from the circuit design. The assertion specifies a context of the circuit design in which the circuit structure is to be analyzed, an attribute associated with the circuit structure, and a constraint associated with the attribute. The present invention analyzes the circuit design based on assertions and checks to identify one or more instances of the circuit structure in the circuit design which do not satisfy the constraint specified in the assertion. An assertion may also indicate an action to be performed if the circuit structure does not satisfy the constraint specified in the assertion.

81 Claims, 18 Drawing Sheets

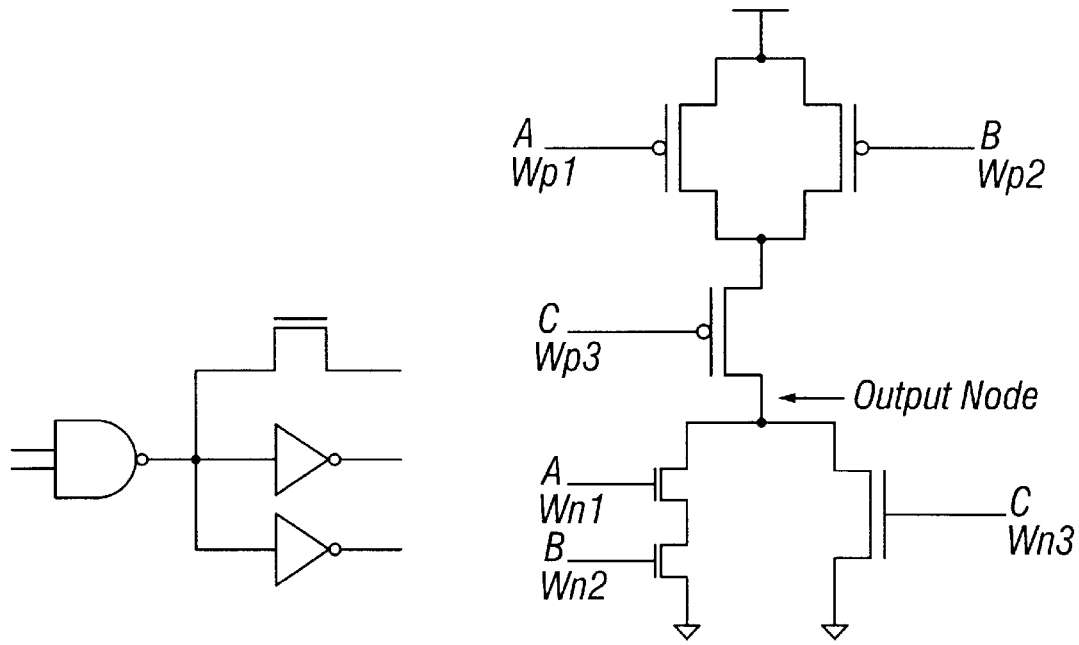
FIG. 15  FIG. 16
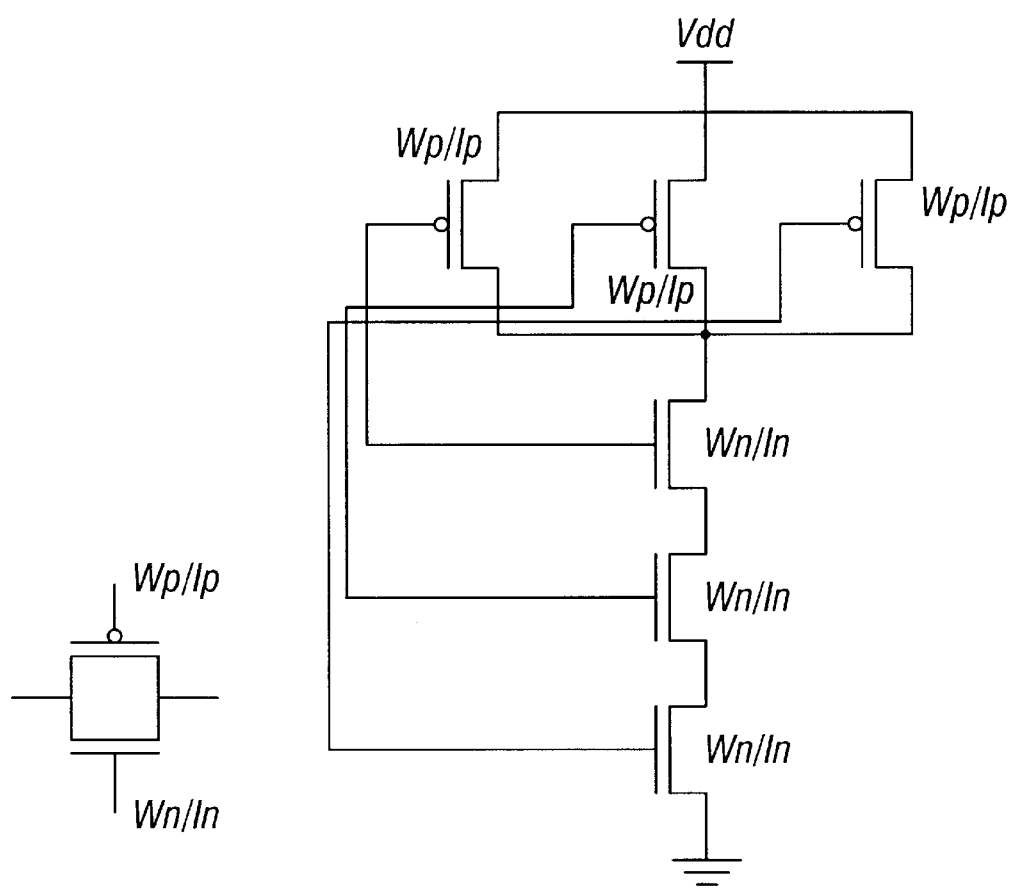
FIG. 17  FIG. 18

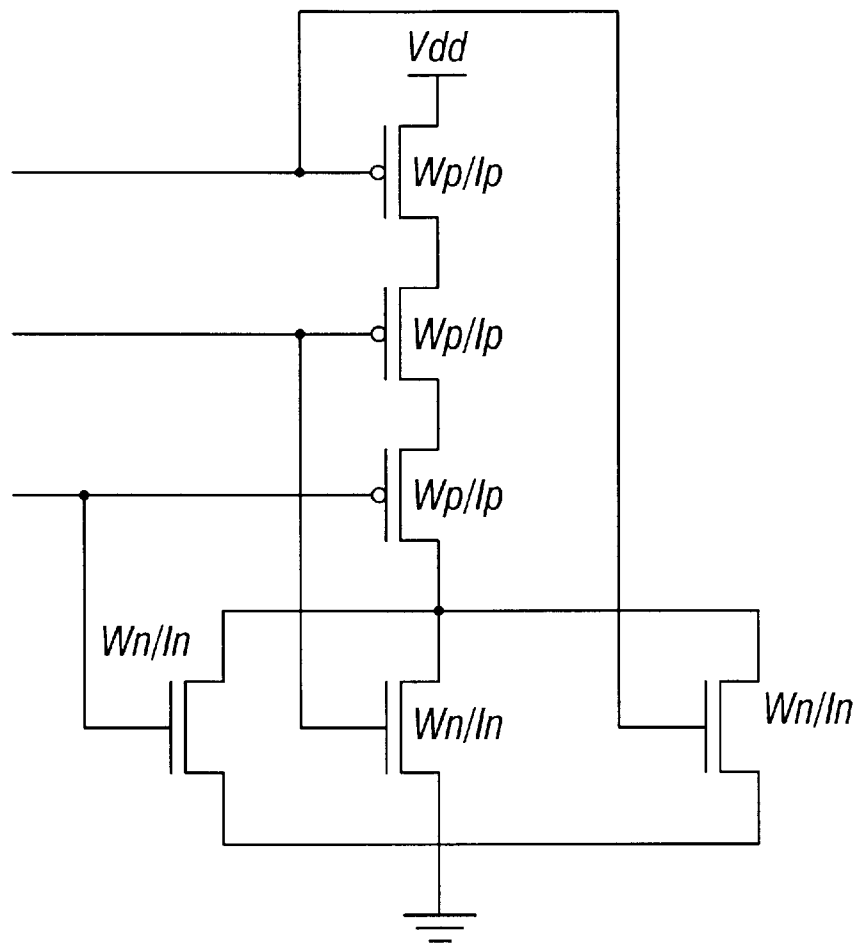
FIG. 19
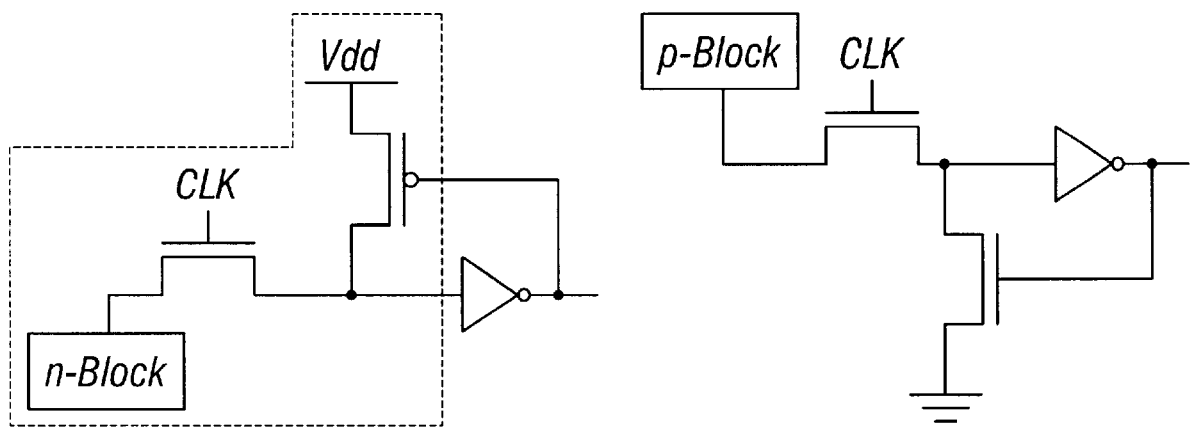
FIG. 20  FIG. 21

SYSTEM AND METHOD FOR PERFORMING ASSERTION-BASED ANALYSIS OF CIRCUIT DESIGNS

CROSS-REFERENCES TO RELATED APPLICATIONS

This application claims priority from U.S. Provisional Patent Application No. 60/125,365, entitled "SYSTEM AND METHOD FOR PERFORMING ASSERTION-BASED STATIC ANALYSIS OF CIRCUIT DESIGNS," filed Mar. 19, 1999, the entire disclosure of which is herein incorporated by reference for all purposes.

COPYRIGHT NOTICE

A portion of the disclosure of this patent document contains material which is subject to copyright protection. The copyright owner has no objection to the xerographic reproduction by anyone of the patent document or the patent disclosure in exactly the form it appears in the U.S. Patent and Trademark Office patent file or records, but otherwise reserves all copyright rights whatsoever.

APPENDIX

The following appendix is being filed with this application, the entire contents of which are herein incorporated by reference for all purposes:

Appendix A (127 pages)—CircuitScope User Guide.

BACKGROUND OF THE INVENTION

The present invention relates to the field of electronic design automation, and more particularly to techniques, including methods, system, and computer code, for performing analysis of circuit designs based on assertions.

The typical design methodology for integrated circuit designs such as very large scale integrated (VLSI) circuits, application specific integrated circuits (ASICs), and so on, is conventionally divided into the following three stages: first a design capture step is performed using for example a high level language synthesis package. Next, design verification is made on the resulting design. This includes simulations, timing analysis, automatic test pattern generation (ATPG) tools, and so on. Then, there is layout and eventual tape out of the device. The device is then tested and the process may need to be reiterated one or more times until the desired design criteria are satisfied.

Currently, electronic design automation (EDA) tools are used to define and verify prototype systems. Conventional EDA tools provide computer-aided facilities for electronic engineers to define prototype designs, typically by generating either netlist files, which specify components and their interconnections, or hardware description files, which specify prototype system functionality according to a hardware description language (HDL).

Initially, the desired functionality for a circuit is analyzed by one or more designers. They define the logical components of the circuit and their interactions by specifying the logic design using design capture tools.

Two common methods for specifying the design are schematic capture and hardware description languages. Both of these methods allow a circuit designer to specify the circuit at the register transfer level. The schematic capture method provides a user interface which allows a logic circuit to be drawn in graphical form on a computer display. Using this method, the circuit is defined as small building blocks, which can be used to develop higher level designs with increasing degrees of abstraction.

Encoding the design in a hardware description language (HDL) is the other major design entry technique used to specify modern integrated circuits. Hardware description languages are specially developed to aid a designer in describing a circuit. The HDL program specifying the design may be compiled into the same data format produced by schematic capture. This capability provides the designer great flexibility in methods used for specifying a logic design.

Next, it is necessary to verify that the logic definition is correct and that the circuit implements the function expected by the designers. Typically, this involves timing analysis and simulation tools. The data representation in the logic design database may be reformatted as needed prior to use by the timing analysis and simulation tools. The design undergoes design verification analysis in order to detect flaws in the design. The design is also analyzed by simulating the device resulting from the design to assess the functionality of the design. If errors are found or the resulting functionality is unacceptable, the designer modifies the design as needed. These design iterations help to ensure that the design satisfies its requirements.

Other verification methods include generating software models of the logic circuit design and testing the software model of the design with designer-specified test cases. Because it is not possible to check every possible condition which may be generated in the actual logic design, faulty logic may remain because it would not have been exercised by any of the test cases. Errors in the logic design may remain undetected until the release of a product on the marketplace, where it may cause costly redesigns.

Formal verification is another way to check logic design prior to the fabrication of a device. Formal verification is a technique wherein a logic circuit is modeled as a state transition system, and specifications are provided for components in the system. One way in which specifications may be made is through the use of logic formulas. Each of the components in the logic design is specified, and all possible behaviors of the design may be exercised by a tool which confirms that these specifications are met.

Once a netlist has been generated, there are a number of commercially available silicon compilers, also called place and route tools, that are used to convert the netlist into a semiconductor circuit layout. The semiconductor circuit layout specifies the physical implementation of the circuit in silicon or other semiconductor materials.

As can be seen, the design verification step can be quite resource intensive in terms of computational requirements and time. When large and very large scale integrated circuits are considered, the data size requirements can easily exceed the capacity of present day computer technology. Consequently, the inability to make such tests can lead to missed design errors. In addition, many run-time tools are non-linear, making design iterations expensive in terms of time and resource allocation. While there are industry formats and commercial products for describing and checking the layout rules, we are not aware of any corresponding commercially available products to address circuit rule verification which are flexible and can be easily customized for circuit analysis.

Market requirements are driving chip designers to integrate ever higher levels of functionality on silicon. Doing this within the manufacturing guidelines and within the market window of opportunity is the key challenge facing designers today. Though deeper sub-micron feature sizes allow greater integration, the technology brings with it circuit and interconnect issues which exacerbate the problems designers must overcome. This increases the likelihood of unpredictable side effects which leads to costly design iterations and sometimes malfunctioning products.

What is needed is a design tool which can overcome the computational costs of conventional brute-force simulation methods. It is desirable to provide a design tool which facilitates locating and repairing circuit integrity failure points. The design tool should also facilitate locating and correcting noise failure conditions. What is needed is a design tool that can reduce failure conditions in the early phases of a design cycle and so reduce the number of needed design iterations, while at the same time improving the quality of the design.

SUMMARY OF THE INVENTION

The present invention provides techniques for locating and repairing integrity problems associated with circuit designs including complex deep submicron (DSM) integrated circuit (IC) designs. The techniques according to the present invention perform fast and exhaustive analysis of circuit designs based on circuit rules or "assertions" which encapsulate a circuit designer's assumptions and expectations of a good circuit design. By performing the analysis at the pre-layout and/or post-layout phase, the present invention reduces the need for extensive back-end circuit and timing simulations while assuring greater probability of success with first silicon of circuit design. The present invention provides an enhanced circuit design methodology which increases the predictability of the circuit design, which significantly reduces design iterations typically associated with conventional analysis techniques, and which in turn reduces the time to market.

According to an embodiment, the present invention receives circuit design information describing the circuit design to be analyzed, assertions associated with circuit structures in the circuit design, and checks to be applied to the circuit design. An assertion is associated with a circuit structure and specifies a context of the circuit design in which the circuit structure is to be analyzed, an attribute associated with the circuit structure, and a constraint associated with the attribute. The present invention analyzes the circuit design based on the check and the assertion to generate analysis results data which identifies one or more instances of the circuit structure in the circuit design which do not satisfy the constraint specified in the assertion.

According to another embodiment of the present invention, the assertion associated with a circuit structure also indicates an action to be performed if the circuit structure does not satisfy the constraint specified in the assertion. According to an embodiment, the present invention performs the action when an assertion violation is identified. Examples of actions include generating a circuit representation of a portion of the circuit design including instances of the circuit structure which do not satisfy the constraint specified in the assertion, performing further analysis on the circuit representation, generating stimuli for analyzing the circuit portion, and the like.

According to yet another embodiment, the present invention generates reports based on the assertion-based analysis. These reports may identify instances of circuit structures which violate one or more assertions associated with the circuit structures. The reports may also list information about the circuit structures included in the circuit design.

According to another embodiment of the present invention, the context information specified in an assertion indicates a driver structure and a receiver structure connected either serially or in parallel to the circuit structure under analysis. The driver structure drives signals to the circuit structure under analysis and may comprise one or more circuit structures. The receiver structure receives signals from the circuit structure under analysis and may also comprise one or more circuit structures.

According to yet another embodiment, the present invention provides features for automatically detecting missing assertions. The present invention identifies and flags circuit structures for which no assertions have been specified. This identification may be performed at various hierarchical levels of circuit structures and helps reduce unexpected design errors associated with the circuit design. This feature of the present invention also helps identify circuit structures which may have been inadvertently introduced in the circuit design.

According to another embodiment, the present invention extracts transistor-level information from the circuit design information. The present invention then determines the signal flow direction in the circuit design. The present invention. identifies a plurality of circuit structures from the transistor-level information. The circuit structures may then be classified according to a hierarchical classification of circuit structure classes. Assertions may be associated with the classes of circuit structures such that a circuit structure class inherits assertions from all its ancestor classes. Assertions associated with a circuit structure include those assertions which have been specified for the circuit structure class to which the circuit structure belongs and assertions which have been inherited by the circuit structure class.

The foregoing, together with other features, embodiments, and advantages of the present invention, will become more apparent when referring to the following specification, claims, and accompanying drawings.

BRIEF DESCRIPTION OF THE DRAWINGS

FIGS. 14–32 depict examples of circuit structures which are analyzed according to an embodiment of the present invention.

DESCRIPTION OF THE SPECIFIC EMBODIMENTS

The present invention provides techniques for locating and repairing integrity problems associated with circuit designs including complex deep submicron (DSM) integrated circuit (IC) designs. The techniques according to the present invention perform fast and exhaustive analysis of circuit designs based on circuit rules or "assertions" which encapsulate a circuit designer's assumptions and expectations of a good circuit design. The present invention thus provides a way for the circuit designer to apply the designer's "knowledge" to the circuit design verification and repair phases using assertions on what constitutes a "good design." The "assertions" are typically associated with circuit structures within the circuit design and specify design or connectivity constraints associated with the circuit structures. The assertions also enable context sensitive analysis of circuit designs aimed at improving circuit integrity, performance, and quality of the circuit designs. The integrity problems identified by the present invention may include structural, electrical, and other integrity issues associated with circuit designs during the pre-layout and/or post-layout phases of the circuit design. The circuit integrity problems detected by the present invention may include design problems associated with inconsistent circuit topologies, beta mismatches, charge-sharing, noise sensitivity including static noise margins, circuits susceptible to cross-talk and cross-coupling, hazardous circuit topologies, drive strength, electromigration, and several other critical design integrity problems.

By performing the analysis at the pre-layout and/or post-layout phase, the present invention reduces the need for extensive back-end circuit and timing simulations while assuring greater probability of success with first silicon of circuit design. The present invention also helps to increase "predictability" of the entire circuit design. Increased predictability implies that the various design phases can be accomplished without encountering unexpected problems due to design integrity which compromise the quality and performance of the design. By building predictability in the design flow, the sub-optimal design iterations and expensive silicon re-spins can be eliminated while preserving the quality of the circuit design.

Figure 1:
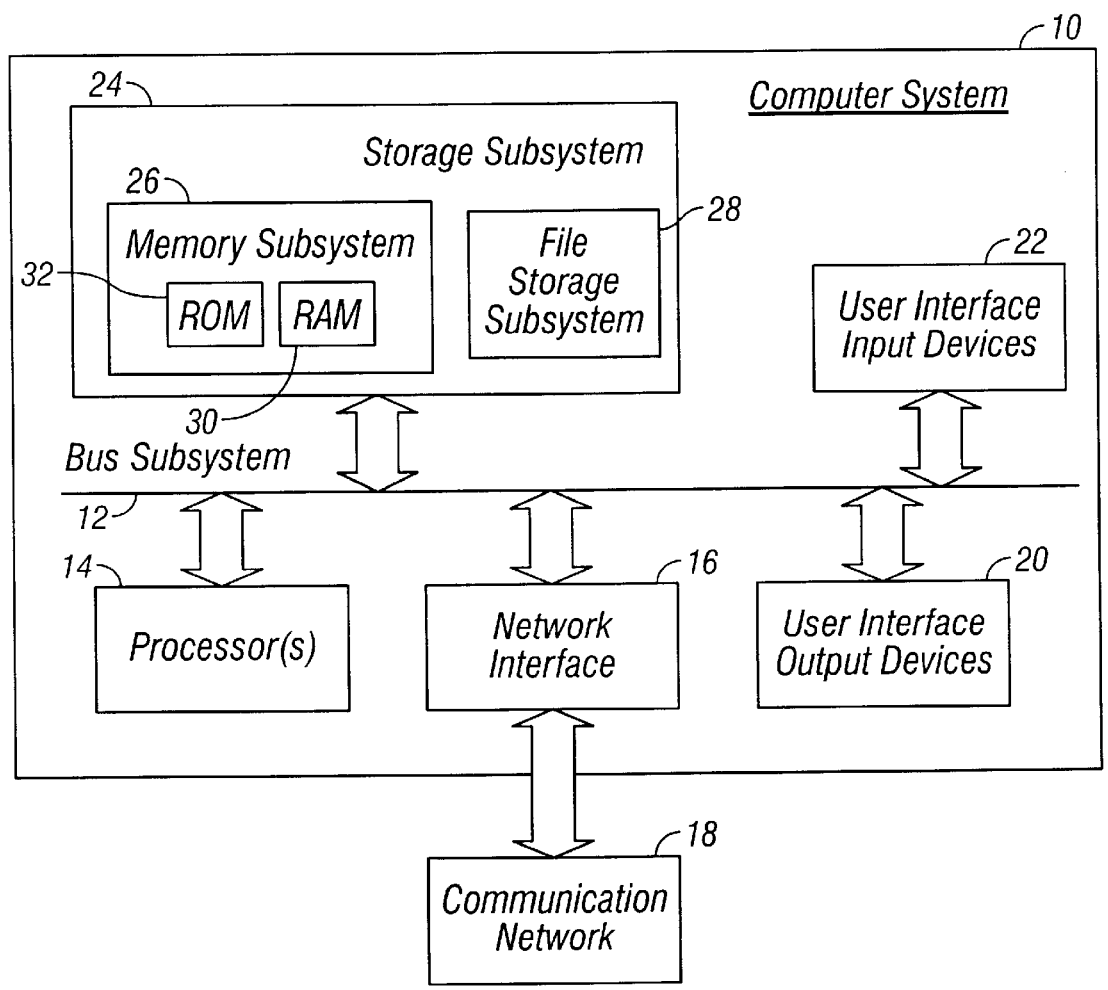
FIG. 1 is a simplified block diagram of a computer system 10 suitable for use with the present invention.

FIG. 1 is a simplified block diagram of a computer system 10 suitable for use with the present invention. Computer system 10 typically includes at least one processor 14 which communicates with a number of peripheral devices via bus subsystem 12. These peripheral devices may include a storage subsystem 24, comprising a memory subsystem 26 and a file storage subsystem 28, user interface input devices 22, user interface output devices 20, and a network interface subsystem 16. The input and output devices allow user interaction with computer system 10. Network interface subsystem 16 provides an interface to outside networks, including an interface to communication network 18, and is coupled via communication network 18 to corresponding interface devices in other computer systems. Communication network 18 may itself be comprised of many interconnected computer systems and communication links. These communication links may be hardwire links, optical links, satellite or other wireless communications links, wave propagation links, or any other mechanisms for communication of information. While in one embodiment, communication network 18 is the Internet, in other embodiments, communication network 18 may be any suitable computer network.

User interface input devices 22 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 10 or onto computer network 18.

User interface output devices 20 may include a display subsystem, a printer, a fax machine, or non-visual displays such as audio output devices. The display subsystem may be a cathode ray tube (CRT), a flat-panel device such as a liquid crystal display (LCD), or a projection device. The display subsystem may also provide non-visual display such as via audio output devices. In general, use of the term "output device" is intended to include all possible types of devices and ways to output information from computer system 10 to the user or to another machine or computer system.

Storage subsystem 24 stores the basic programming and data constructs that provide the functionality of the present invention. For example, the various modules implementing the functionality of the present invention may be stored in storage subsystem 24. These software modules are generally executed by processor 14.

Memory subsystem 26 typically includes a number of memories including a main random access memory (RAM) 30 for storage of instructions and data during program execution and a read only memory (ROM) 32 in which fixed instructions are stored. File storage subsystem 28 provides persistent (non-volatile) storage for program and data files, and may include a hard disk drive, a floppy disk drive along with associated removable media, a Compact Digital read Only Memory (CD-ROM) drive, an optical drive, or removable media cartridges. The databases and modules implementing the functionality of the present invention may be stored by file storage subsystem 28.

Bus subsystem 12 provides a mechanism for letting the various components and subsystems of computer system 10 communicate with each other as intended. Although bus subsystem 12 is shown schematically as a single bus, alternate embodiments of the bus subsystem may utilize multiple busses.

Computer system 10 itself can be of varying types including a personal computer, a portable computer, a workstation, a computer terminal, a network computer, a television, a mainframe, or any other data processing system or user device. Due to the ever-changing nature of computers and networks, the description of computer system 10 depicted in FIG. 1 is intended only as a specific example for purposes of illustrating the preferred embodiment of the present invention. Many other configurations of computer system 10 are possible having more or less components than the computer system depicted in FIG. 1.

Figure 2:
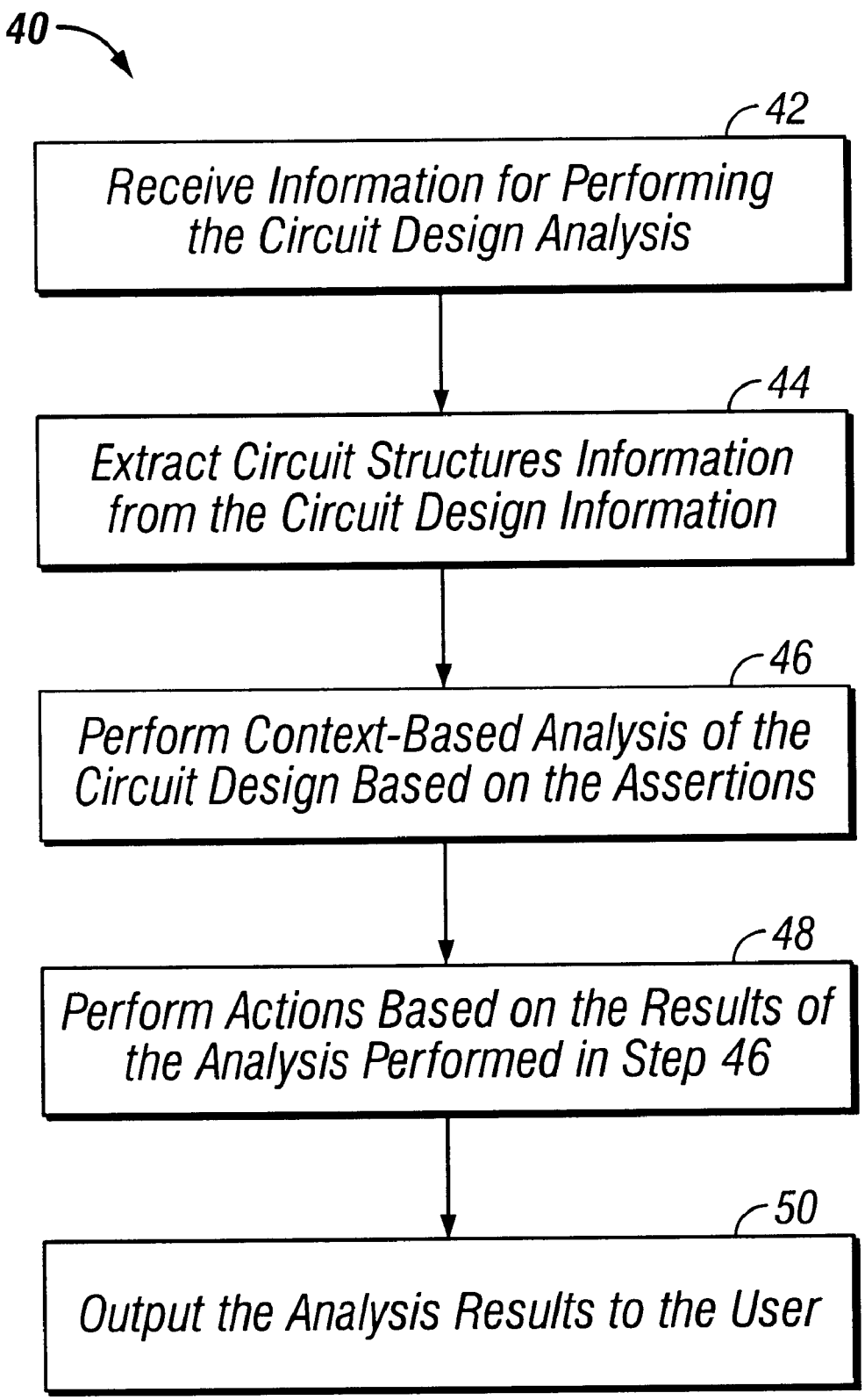
FIG. 2 is a simplified flowchart depicting the general steps for analyzing circuit designs according to an embodiment of the present invention.

FIG. 2 is a simplified flow chart 40 showing the general steps for analyzing circuit designs according to an embodiment of the present invention. Although FIG. 2 depicts a particular series of transactions and steps, it should be apparent to those skilled in the art that the scope of the present invention is not limited to the described series of transactions and steps. According to the embodiment of the present invention depicted in FIG. 2, the analysis process is initiated when the present invention receives input information for performing the circuit design analysis (step 42). The input information typically includes circuit design information describing the circuit design to be analyzed, information about assertions associated with the circuit design, information specifying checks to be performed on the circuit design based on the assertions, and other information used for the analysis. The circuit design information may include netlist information, process specific information, library information, parasitics information, and other like information. A command file may also be optionally input to the present invention to set attributes of the nodes or.devices of the circuit deign, to suppress checks a performed by the present invention, and to perform other like functions. The information may be input to the present invention in a variety of ways including via a command line interface, via a graphical user interface (GUI), via a file interface, via a network interface such as using the Internet, or via other interfaces. For example, in an embodiment using a file interface, a "technology" file may be used to input assertions, library, and process specific information, and other like information to the present invention.

The circuit design information describes the circuit design to be analyzed. This information typically includes netlist information, parasitics information, process-specific information, library information, information related to technology parameters, and other types of information which describe the circuit design and may be used for analysis. Several industry standard formats are supported by the present invention including Spice netlists, Detailed Standard Parasitics Format (DSPF) formats, Standard Parasitic Extended Format (SPEF), various hardware definition language formats such as Verilog formats, and others. Single or multiple netlists may be input to the present invention for analysis. The process-specific information may include parameters which define the environment or process parameters for the circuit design. The parasitic data may be input using industry standard formats and is typically used for post-layout coupling noise analysis. As described above, the circuit design information may be input using a technology file.

The present invention analyzes a circuit design based on assertions associated with the circuit design and checks which apply the assertions. As previously stated, an assertion is generally associated with a circuit structure in the circuit design and specifies operational limits or constraints associated with attributes of the circuit structure. The attributes may include topological attributes, interconnectivity attributes, charge share attributes, noise attributes, and other like attributes associated with circuit structures within the circuit design. The assertion also includes contextual information specifying the context in which the assertion is to be applied to the circuit structure. In one embodiment of the present invention, the contextual information specifies a driver circuit structure which drives signals to the circuit structure for which the assertion is specified (also called the gate-under-analysis (GUA) circuit structure), and a receiver circuit structure which receives signals from the GUA, or in other words which is driven by the GUA.

The circuit designer or user of the present invention may input assertions via a command line interface, a GUI, a network interface, a file interface ("technology" file), or other interfaces known to those of ordinary skill in the art. According to the present invention, assertions may be defined for a particular circuit design, for a plurality of circuit designs, for one or more projects, and the like. Accordingly, the present invention allows circuit designers to share assertions across several projects. This sharing of assertions helps to ensure that the various circuit designs are subjected to a common and consistent analysis methodology and standard of quality. This helps promote uniformity, predictability, and reliability of circuit design across projects. The present invention thus provides a design methodology which can be applied consistently across circuit designs, projects, and teams.

In addition to assertions, the present invention receive as input checks which indicate the type of analysis to be performed on the circuit design. According to the teachings of the present invention, the checks indicate the assertions to be applied to the circuit design during the analysis. Examples of checks performed by the present invention include checks to test noise conditions, coupling conditions, charge share conditions, off-specification device sizes, excessive or insufficient drive, inconsistent circuit topologies, and the like. More information about the various checks which may be performed by the present invention are provided below.

Figure 3:
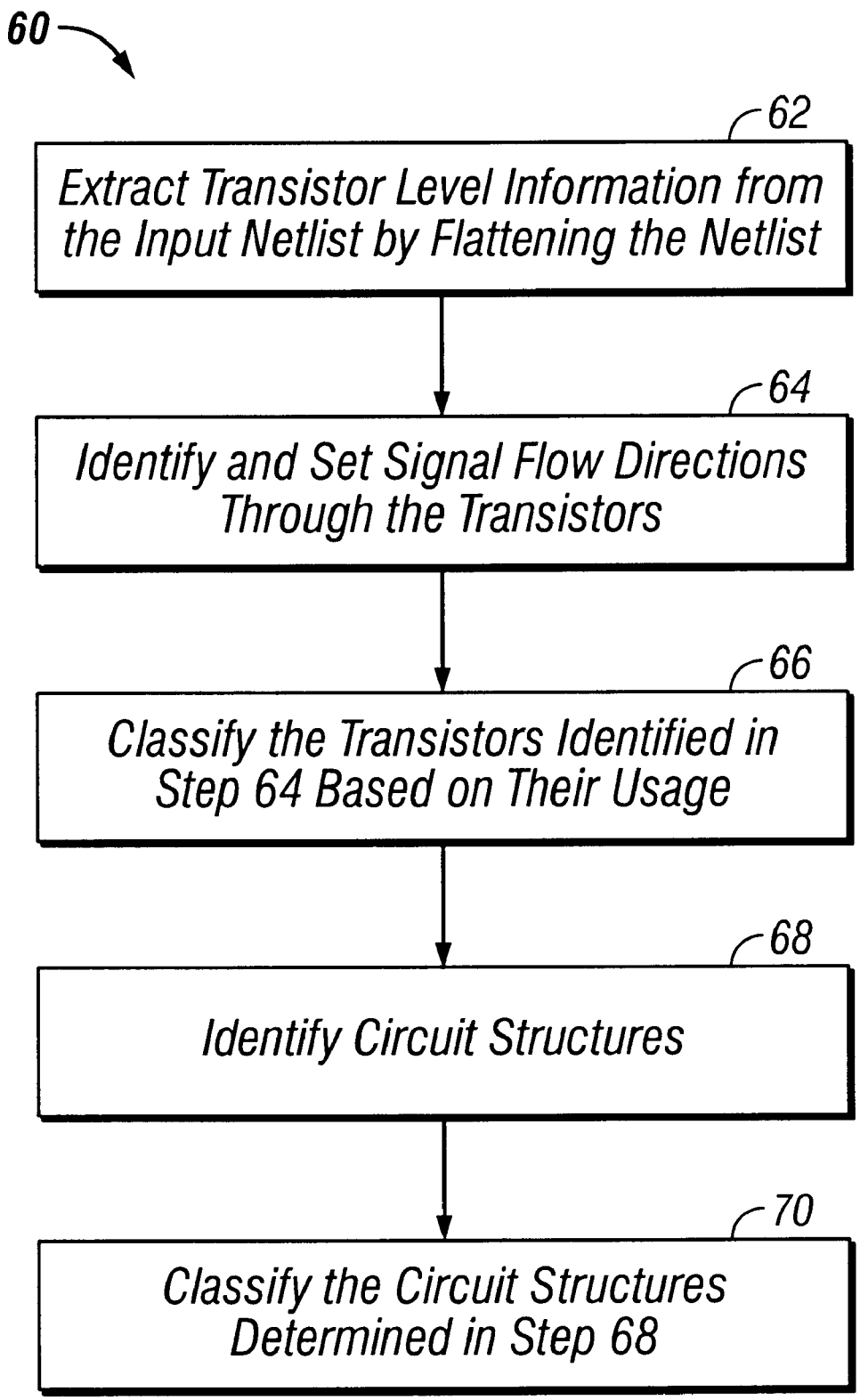
FIG. 3 is a simplified flowchart depicting the general steps for extracting circuit structured information from the circuit design information according to an embodiment of the present invention.

After receiving the input information according to step 42, the present invention then extracts circuit structures information from the circuit design information (step 44). The details of step 44 are shown in simplified flow chart 60 depicted in FIG. 3. As shown in FIG. 3, the present invention reads the input netlist(s) and flattens it to generate a flat wirelist (step 62). This involves extracting transistor level information from the input netlist. The present invention then identifies and sets signal flow directions through the transistors identified in step 62 (step 64). If a signal flow direction cannot be determined from the circuit design, the present invention automatically sets a signal flow direction based on the circuit design information. The automatically determined signal flow is usually documented in a file for review and verification by the circuit designer.

The present invention then classifies the transistors based on their usage (step 66). For example, a transistor may be classified as a pull-up (pu) transistor, a pull-down (pd) transistor, a pass gate or transmission gate (tgate) transistor, a load (load) transistor, and the like. The present invention then identifies various circuit structures based on the extracted transistor level information (step 68). This is usually accomplished by detecting logical groups of transistors and associating the transistors to form circuit structures. Various types of circuit structures may be identified such as complementary circuit structures, dynamic circuit structures, static circuit structures, ratioed structures, cascode structures, and the like. The present invention also recognizes various types of circuit structures defined in circuit structure libraries such as random access memories (RAM) circuit structures, multiplexers (muxes), tristates, complementary structures, latches, and several other structures. The present invention is also capable of identifying user customized circuit structures. The present invention also determines the finctionality of the circuit structures, for example, an inverter, a NOR gate, a NAND gate, a MUX, a RAM, a tristate, a latch, and the like.

Figure 4:
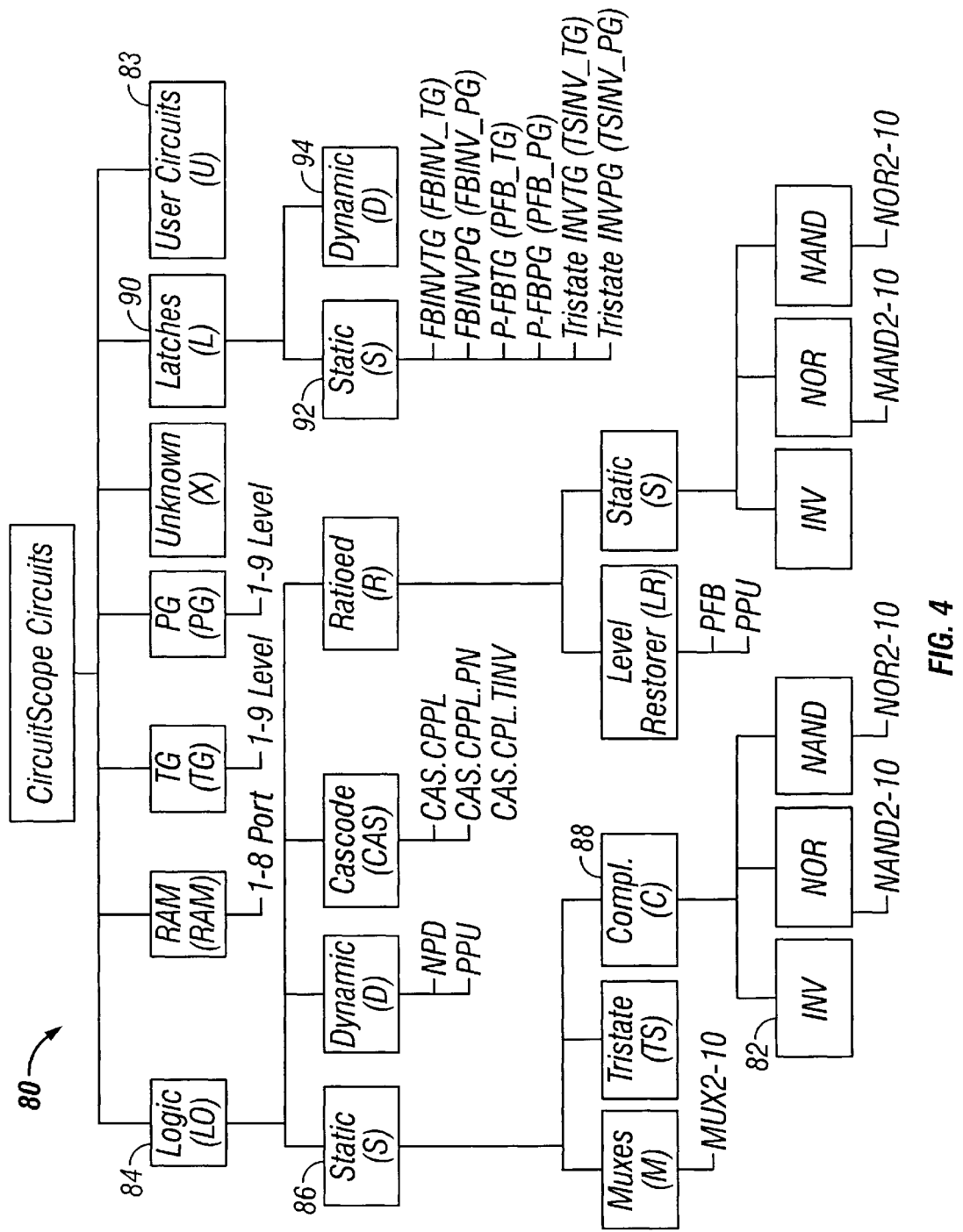
FIG. 4 depicts hierarchical relationships between classes of circuit structures according to an embodiment of the present invention.

The circuit structures identified in step 68 are then classified into a hierarchical classification of circuit structures (step 70). The hierarchical classification includes classes of circuit structures which are hierarchically related to one another. The hierarchical classification encapsulates circuit structures at different levels of abstraction. In one embodiment, the hierarchical information may be represented by a circuit structures tree 80 depicted in FIG. 4. As shown in FIG. 4, tree 80 comprises a plurality of nodes each representing a class of circuit structures. The parent-child relationships between the nodes of tree 80 encapsulate the hierarchical relationships between the various classes of circuit structures. For example, a child node "is a type of" circuit structure indicated by the parent node and inherits all properties of the parent node. Accordingly, an inverter 82 may be classified as a logic-static-complementary circuit structure (nodes 84-86-88). As shown in FIG. 4, the present invention classifies circuit structures in many classes including complementary structures, dynamic structures, ratioed structures, latches, RAMs, tristates, multiplexers (muxes), cascodes, and others. Circuit structures may also be classified into categories customized by the user (node 83).

According to the present invention, assertions may be associated with circuit structures at various levels of abstraction. For example, in the circuit structure hierarchy represented by tree 80 shown in FIG. 4, assertions may be associated with one or more nodes at various levels of tree 80. According to the present invention, an assertion associated with a node is inherited by all descendants (children, grand-children, and so on) of that node. In other words, a class of circuit structures at a given node inherits assertions associated with classes of circuit structures which are its ancestors (parents, grand-parents, and so on). For example, assertions associated with latches (node 90) in FIG. 4 are inherited by static latches structures (node 92) and dynamic latches structures (node 94), in addition to assertions specifically associated with nodes 92 and 94. Likewise, inverter 82 inherits all assertions from logic circuit structures (node 84), static circuit structures (node 86), and complementary circuit structures (node 88). In this manner the present invention enables users/circuit designers to conveniently define assertions for a whole category of circuit structures.

Referring back to FIG. 2, after the circuit structures information has been extracted from the circuit design information (step 44), the present invention performs context-based analysis of the circuit design based on the assertions and the checks (step 46). Based on the checks and the assertions, the present invention analyzes the circuit design to determine one or more instances of circuit structures within the circuit design assertions which violate one or more assertions associated with the circuit structures. For a circuit structure under analysis, both driver and receiver contexts are analyzed to locate integrity problems and assertion violations. Since assertions specify topological, connectivity, and/or operational tolerances associated with circuit structures within the circuit design, unlike conventional analysis techniques, the analysis according to the present invention does not depend on user provided vectors, and is hence static, exhaustive, and efficient. Context based analysis may be performed to identify problems associated with circuit designs, including problems associated with deep submicron designs, such as coupling, cross-talk noise margins, drive strengths, topology checks, charge sharing, interaction of circuits, and other like problems. The present invention also ensures that only those assertions and checks applicable to a circuit structure in a particular context are applied. This minimizes the number of false errors being reported to the user.

The present invention also provides features for automatically detecting missing assertions. As part of the analysis, the present invention identifies and flags circuit structures for which no assertions have been specified. This identification may be performed at various hierarchies levels of the circuit structures and helps to reduce unexpected design errors before the circuit design is put into silicon. Further, since a circuit designer would typically specify an assertion for each circuit structure in the circuit design, circuit structures with no associated assertions may also indicate circuit structures which have been inadvertently introduced in the circuit design. Accordingly, the ability to detect missing assertions helps ensure completeness of analysis coverage in detecting unintentional circuit structures introduced in the circuit design.

The present invention may then perform a plurality of actions based on the results of the analysis performed in step 46 (step 48). These actions may include flagging portions of the circuit design which violate the assertions, performing further analysis of the circuit design using the present invention or using other analysis tools such as HSpice, suggesting techniques for "repairing" the violation, and the like. For example, the present invention may generate a netlist corresponding to a portion of the circuit design which violates the assertions, and the generated netlist may then be forwarded to a circuit simulator for further analysis. The present invention may also generate input stimuli, for e.g. vectors, to facilitate analysis of the circuit design portion which violates an assertion. The present invention may also perform other actions for optimizing and improving circuit quality and performance. User defined or user customized actions may also be performed by the present invention.

The results of the analysis performed in step 48 are then output to the user (step 50). According to an embodiment, the results of the analysis are presented to the user in the form of reports generated by the present invention. The reports are typically sorted based on the degree of violation of an assertion, which is ascertained by determining by how much a violation deviates from the specification or assertions. The present invention processes all the violations, sorts the violations based on severity or based on any other user-specified criteria, and then reports the violations to the user. In addition to reporting violations, the present invention may also be configured to display information about the circuit design and the technology file to the user. For example, the present invention provides features to report information related to primary input signals, primary output signals, technology file parameters, signal capacitances, nodes and their associated attributes, transistors and their associated attributes, circuit classification, clocknodes, rams, latches, muxes, tristates, complementaries, exclusive signals, static complementary logic output signals, merged transistor stacks, fanouts, electrical fanouts, netlists, and the like. It should be apparent that other information determinedfrom the analysis performed in step 46 may also be presented to the user.

Figure 5:
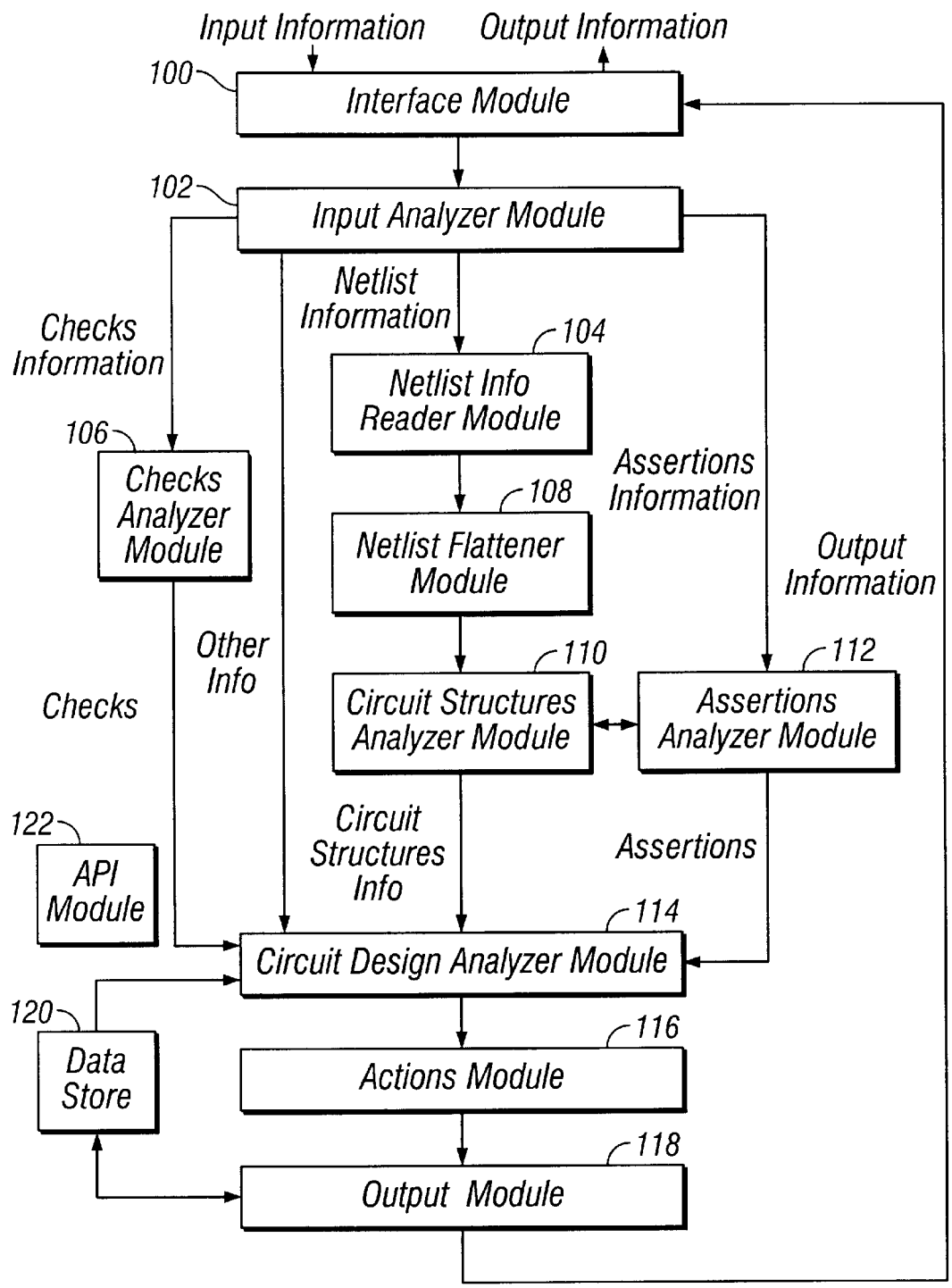
FIG. 5 depicts various modules for analyzing circuit designs according to an embodiment of the present invention.

FIG. 5 depicts various modules for analyzing circuit designs according to an embodiment of the present invention. The modules depicted in FIG. 5 include an interface module 100, an input analyzer module 102, a netlist information reader module 104, a netlist flattener module 108, a circuit structures analyzer module 110, a checks analyzer module 106, an assertions analyzer module 112, a circuit design analyzer module 114, an actions module 116, an output module 118, and an applications programmer interface (API) module 122. FIG. 5 also depicts a data store 120 which may be used to store information used by or generated by the present invention.

Interface module 100 is responsible for receiving input information used for analyzing circuit designs and for outputting results of the analysis to users of the present invention. The users may include human users such as a circuit designers, or may alternatively include processes or applications which provide input information to the present invention and which receive output information from the present invention. Examples of such processes/applications include electronic design automation (EDA) tools which may be used in conjunction with the present invention. Interface module 100 thus enables the present invention to be easily integrated with existing design flows and third-party tools, resulting in quick migrations to new processes and projects.

Interface module 100 supports various interfaces which may be used to provide input information to the present invention. As previously stated, these interfaces may include a GUI interactive interface, a command interface, a file interface, and many other interfaces. The input information may also be provided to/accessed by interface module 100 from communication network 18 using network interface subsystem 16 (depicted in FIG. 1). As previously described, the input information may include circuit design information describing the circuit design to be analyzed, information about assertions associated with the circuit design, information specifying checks to be applied to the circuit design, process specific information, library information, parasitics information, command file information, and other like information. Interface module 100 forwards the input information to input analyzer module 102 for further processing.

As previously stated, the information may be input to the present invention using a file interface. In one embodiment, a "technology" file is used to input the information. A technology file generally contains process-specific information specifying parameters which are specific to a circuit design, library information containing library parameters for the circuit design, and design information including design specific parameters for the circuit under analysis. Usually a default technology file with default parameters is provided which may be customized by the user to meet process and design requirements specific to the circuit design under analysis. A technology file may also include or provide references to other technology files.

Table 1 lists examples of process-specific parameters which may be specified according to the present invention. The first column of Table 1 titled "Parameter" lists the process-specific parameter identifier, the second column titled "Meaning" indicates the meaning of the parameter, the third column titled "Default" specifies the default values which may be associated with the parameter, the fourth column titled "Units" indicates measurement units for the parameter, and column five titled "Check" identifies the check with which the parameter is associated. It should be apparent that Table 1 merely provides examples of process-specific parameters and that other parameters not listed in Table 1 may also be used in embodiments of the present invention.

TABLE 1

Technology File-Process Specific Parameters

| Parameter | Meaning | Default | Units | Check |
|---|---|---|---|---|
| vtn(1), vtn(2) | nmos transistor voltages | vtn(1) 0.350<br>vtn(2) 0.350 | volts | all |
| vtp(1), vtp(2) | pmos transistor voltages | vtp(1) 0.350<br>vtp(2) 0.350 | volts | all |
| n_cox | nmos gate oxide capacitance | 4.000 | ff/um$^2$ | drive, em, coup, cshare |
| p_cox | pmos gate oxide capacitance | 4.000 | ff/um$^2$ | drive, em, coup, cshare |
| cgbo | gate-bulk overlap capacitance | 0.00 | ff/um | drive, em, coup, cshare |
| cgso | gate-source overlap capacitance | 0.00 | ff/um | drive, em, coup, cshare |
| cgdo | gate-drain overlap capacitance | 0.00 | ff/um | drive, em, coup, cshare |
| cjgaten | nmos gate-edge side-wall junction capacitance | 0.0 | ff/um | drive, em, coup, cshare |
| cjgatep | pmos gate-edge side-wall junction capacitance | 0.0 | ff/um | drive, em, coup, cshare |
| hdif | length of heavily doped diffusion from middle of contact to gate edge used for diffusion capacitance estimation with -estcaps option if AD, AS, PD and PS are not specified in the Spice netlist | 0.200 | um | used with estcaps |
| num_metal_layers | number of metal layers in process | 6 | | |
| m1_metal_width | minimum width for metal layer 1 | 0.350 | um | em |
| m2_metal_width | minimum width for metal layer 2 | 0.350 | um | em |
| m3_metal_width | minimum width for metal layer 3 | 0.350 | um | em |
| m4_metal_width | minimum width for metal layer 4 | 0.450 | um | em |
| m5_metal_width | minimum width for metal layer 5 | 0.950 | um | em |
| m6_metal_width | minimum width for metal layer 6 | 1.700 | um | em |
| m1_dc_iavg | average DC current carrying capability of metal layer 1 | 1.050 | ma/um | em |
| m2_dc_iavg | average DC current carrying capability of metal layer 2 | 1.050 | ma/um | em |
| m3_dc_iavg | average DC current carrying capability of metal layer 3 | 1.250 | ma/um | em |
| m4_dc_iavg | average DC current carrying capability of metal layer 4 | 1.250 | ma/um | em |
| m5_dc_iavg | average DC current carrying capability of metal layer 5 | 1.800 | ma/um | em |
| m6_dc_iavg | average DC current carrying capability of metal layer 6 | 2.350 | ma/um | em |
| m1_ac_iavg | average AC current carrying capability of metal layer 1 | 10.200 | ma/um | em |

TABLE 1-continued

Technology File-Process Specific Parameters

| Parameter | Meaning | Default | Units | Check |
|---|---|---|---|---|
| m2_ac_iavg | average AC current carrying capability of metal layer 2 | 10.200 | ma/um | em |
| m3_ac_iavg | average AC current carrying capability of metal layer 3 | 10.200 | ma/um | em |
| m4_ac_iavg | average AC current carrying capability of metal layer 4 | 18.500 | ma/um | em |
| m5_ac_iavg | average AC current carrying capability of metal layer 5 | 25.500 | ma/um | em |
| m6_ac_iavg | average AC current carrying capability of metal layer 6 | 25.050 | ma/um | em |
| contact_dc_iavg | average DC current carrying capability of diffusion contacts | 0.250 | ma/contact | em |
| contact_ac_iavg | average AC current carrying capability of diffusion contacts | 2.500 | ma/contact | em |
| via_m1_m2_ac_iavg | number of vias required between metal layers 1 and 2 | 0.8 | ma/via | em |
| via_m2_m3_ac_iavg | number of vias required between metal layers 2 and 3 | 0.7 | ma/via | em |
| via_m3_m4_ac_iavg | number of vias required between metal layers 3 and 4 | 0.6 | ma/via | em |
| via_m4_m5_ac_iavg | number of vias required between metal layers 4 and 5 | 0.6 | ma/via | em |
| via_m5_m6_ac_iavg | number of vias required between metal layers 5 and 6 | 1.4 | ma/via | em |
| offset_length_n | amount of length to add to every nmos transistor in design useful for long channel devices; size is added or subtracted to transistors without changing the size of the rest of the design for example, if you apply an offset of −0.01 to transistor length, with an original transistor length of 0.16, the resulting transistor length would be 0.14 um, or 0.01 um shorter on each side of the transistor channel | 0.000 | um | all |
| offset_length_p | amount of length to add to every pmos transistor in design | 0.000 | um | all |
| offset_width_n | amount of width to add to every nmos transistor in design | 0.000 | um | all |
| offset_width_p | amount of width to add to every pmos transistor in design | 0.000 | um | all |

Table 2 lists examples of library parameters which may be specified according to the present invention. The first column of Table 2 titled "Parameter" lists the library parameters, the second column titled "Meaning" indicates the meaning of the parameter, the third column titled "Default" specifies the default values which may be associated with the parameter, the fourth column titled "Units" indicates measurement units for the parameter, and column five titled "Check" identifies the check with which the parameter is associated. It should be apparent that Table 2 merely provides examples of library parameters and that other parameters not listed in Table 2 may also be used in embodiments of the present invention.

TABLE 2

Technology File-Library Parameters

| Parameter | Meaning | Default | Units | Check |
|---|---|---|---|---|
| n_modelname(1) | valid nmos device type names | | | all |
| n_modelname(2) | valid nmos device type names | | | |
| p_modelname(1) | valid pmos device type names | | | all |
| p_modelname(2) | valid pmos device type names | | | |
| vdd_nodename | valid vdd node names | | | all |
| vss_nodename | valid vss node names | | | all |
| vdd | nominal vdd supply voltage level | 2.000 | volts | all |
| psub_nodename | valid p-substrate node names | | | all |
| nsub_nodename | valid n-substrate node names | | | all |
| n_cap_area | diffusion capacitance per unit area of transistor equivalent to the CJ HSpice parameter for nmos and pmos | 1.700 | ff/um$^2$ | drive, em, coup, cshare with estcaps |

TABLE 2-continued

Technology File-Library Parameters

| Parameter | Meaning | Default | Units | Check |
|---|---|---|---|---|
| p_cap_area | diffusion capacitance per unit area of transistor equivalent to the CJ HSpice parameter for nmos and pmos | 1.200 | ff/um$^2$ | drive, em, coup, cshare with estcaps |
| n_cap_peri | sidewall diffusion capacitance per unit perimeter of gate | 0.220 | ff/um | drive, em, coup, cshare with estcaps |
| p_cap_peri | sidewall diffusion capacitance per unit perimeter of gate | 0.250 | ff/um | drive, em, coup, cshare with estcaps |
| cgate_use_coeff | cgate coefficients (typical, slow, fast) | off if off, the present invention uses the n_cox and p_cox values to calculate gate capacitance if on, the gate coefficients; i.e., (typical, slow, fast) need to be specified | c gate coefficient | drive, em, coup, cshare with estcaps |
| acm | area calculation method (acm) used to model substrate-drain and substrate-gate diodes affects calculation for source and drain diffusion capacitance with the -estcaps option supports models 2 and 3 hspice parameter GEO is 0 | 3 | hspice acm | drive |
| drivefast: (n_delay_ratio_min, p_delay_ratio_min) context | load capacitance per micron of n-device width used to specify edge rate | | pf/um | drive |
| driveslow: (n_delay_ratio_max, p_delay_ratio_max) context | load capacitance per micron of p-device width used to specify edge rate | | pf/um | drive |
| fanout: range context | fanout of node in context of the gate under analysis | | | fanout |
| n_reff | n-device effective resistance | 11.000 | Kohm | drive |
| p_reff | p-device effective resistance | 32.000 | Kohm | drive |
| n_len: (min, max, def) | allowable length of n-device | min = 0.18 max = 1.00 def = 0.18 | um | crc, drive |
| p_len: (min, max, def) | allowable length of p-device | min = 0.18 max = 1.00 def = 0.18 | um | crc, drive |
| n_wid: (min, max, def) | allowable width of n-device | min = 1 max = 100 def = 10 | um | crc, drive |
| p_wid: (min, max, def) | allowable width of p-device | min = 1.2 max = 100 def = 10 | um | crc, drive |
| n_prech_len: (min, max, def) | allowable length of precharge n-device | if no value is supplied for this parameter, the values for n_len are used | um | offspec |
| n_prech_wid: (min, max, def) | allowable width of precharge n-device | if no value is supplied for this parameter, the values for n_wid are used | um | offspec |
| p_prech_len: (min, max, def) | allowable length of precharge p-device | if no value is supplied for this parameter, the values for p_len are used | um | offspec |
| p_prech_wid: (min, max, def) | allowable width of precharge p-device | if no value is supplied for this parameter, the values for p_wid are used | um | offspec |
| trans_unit_len | factor to verify if length is a multiple | 0.000 | | crc |

TABLE 2-continued

Technology File-Library Parameters

| Parameter | Meaning | Default | Units | Check |
|---|---|---|---|---|
| trans_unit_wid | factor to verify if width is a multiple | 0.000 | | crc |
| n_fb_len | nominal feedback length for n-device | 1.000 | um | crc |
| p_fb_len | nominal feedback length for p-device | 1.000 | um | crc |
| n_fb_wid | nominal feedback width for n-device | 1.000 | um | crc |
| p_fb_wid | nominal feedback width for p-device | 1.000 | um | crc |
| n_fb_ratio: (min, max, tol) | allowable W/L ratio for n feedback device | min = 1, max = 1, tol = 0.1 | um | crc |
| p_fb_ratio: (min, max, tol) | allowable W/L ratio for p feedback device | min = 1, max = 1, tol = 0.1 | um | crc |
| betar: (min, max, tol) context | allowable beta ratios for noise check, based on context specified in technology file assertion. | | | noise |
| betar_path: (min, max, tol) context | allowable beta ratio for latch structures, based on context specified in technology file assertion | | | noise |
| ratio_prech: (min, max, tol) | allowable ratio ($W_n/L_n$) | min = 6, max = 7, tol = 0.1 | | cshare |
| ratio_pprech: (min, max, tol) | allowable ratio ($W_p/L_p$) | min = 1, max = 1, tol = 0.1 | | cshare |
| nstack_height range context | maximum nstack height allowed to switch a logic node | | | topology |
| pstack_height: range context | maximum pstack height allowed to switch a logic node | | | topology |
| nstack_taper: (min, max, tol) context | ratio checks for each individual nstack from output node to ground | | | topology |
| pstack_taper: (min, max, tol) context | ratio checks for each individual pstack from output node to power | | | topology |
| nstack_width: range context | total number of path to power rail from output node through stacks | | | topology |
| pstack_width: range context | total number of path to power rail from output node through stacks | | | topology |
| connect: action context | connectivity check on circuit structures based on driver-gate under analysis-receiver | | | topology |
| weak_nodes: action context | flags circuit structures with weak logic levels | | | topology |
| vt_class: integer context | used to assign vt classes to different contexts | | | vt |
| pkeep_leakage_ratio: (min, max, tol) | leakage ratio of a PPU keeper to nmos stacks | min = 0.5, max = 1, tol = 0.1 | | leakage |
| nkeep_leakage_ratio: (min, max, tol) | leakage ratio of an NPD keeper to pmos stacks | min = 0.5, max = 1, tol = 0.1 | | leakage |
| cppl_ratio: (min, max, tol) | ratio for cross-coupled inverters | min = 1, max = 1, tol = 0.1 | | library |
| cppl_width_ratio: (min, max, tol) | ratio for cross-coupled pmos transistors | min = 1, max = 1, tol = 0.1 | | cppl |
| cppl_nwidth_ratio: (min, max, tol) | ratio for each nmos transistor in the push-pull stack with common gate inputs | min = 1, max = 1, tol = 0.1 | | cppl |
| cppl_tinvpwidth_ratio: (min, max, tol) | ratio for pmos transistors of terminating inverters | min = 1, max = 1, tol = 0.1 | | cppl |
| cppl_tinvnwidth_ratio: (min, max, tol) | ratio of nmos transistors of terminating inverters | min = 1, max = 1, tol = 0.1 | | cppl |
| cshare_capsratio: (min, max, tol) | charge share thresholds used for dynamic nodes Cstack/Cnode capacitance ratio limit | min = 0.1, max = 0.1, tol = 0.1 | | cshare |
| cshare_vdrop_max | maximum voltage drop limit due to charge share | 0.500 | volts | cshare |
| ram_mode | indicates whether ram is in read or write mode | read | read or write | ram |
| betar: (min, max, tol) RAM | allowable beta ratios for noise check | | | ram |
| ram_ratio_npd_nps (min, max, tol) | ram allowable ($W_{nmos\_pd}/W_{pass}$) ratios Used to ensure proper noise margins and crossover currents during port | min = 0.5, max = 0.5, tol = 0.01 | | ram |

TABLE 2-continued

Technology File-Library Parameters

| Parameter | Meaning | Default | Units | Check |
|---|---|---|---|---|
| ram_ratio_ppu_nps: (min, max, tol) | switching in rams. ram allowable ($W_{pmos\_pu}/W_{pass}$) ratios Used to ensure proper noise margins and crossover currents during port switching in rams. | min = 1 max = 1 tol = 0.01 | | ram |

Table 3 lists examples of design parameters which may be specified according to the present invention. The first column of Table 3 titled "Parameter" lists the process-specific parameter identifier, the second column titled "Meaning" indicates the meaning of the parameter, the third column titled "Default" specifies the default values which may be associated with the parameter, the fourth column titled "Units" indicates measurement units for the parameter, and column five titled "Check" identifies the check with which the parameter is associated. It should be apparent that Table 3 merely provides examples of design parameters and that other parameters not listed in Table 3 may also be used in embodiments of the present invention.

TABLE 3

Technology File-Design Parameters

| Parameter | Meaning | Default | Units | Check |
|---|---|---|---|---|
| print_items_threshold | maximum number of errors printed for each analysis category | 50 | | all |
| print_cap_threshold | nodes with capacitance below this level are not listed in output | 10.000 | ff | all |
| common_ancestor_limit | determines number of violations listed based on hierarchical information in your netlist (equivalent to -common command line option) parameter in technology file takes priority over command line option 0 suppresses hierarchical listing | 0 | | all |
| spice_scale | scaling factor for spice netlist | | | all |
| clock_nodename | clock name used in design; use only one clock name with this parameter; for example, clock_nodename CLK Important: do not use both clock_nodename and clock_hierarchy to define clock names | | | necessary for clock propagation |
| clockb_nodename | clockbar name used in design; use only one clockbar name with this parameter; for example, clockbar_nodename CLKb Important: do not use both clockb_nodename and clock_hierarchy to define clock names | | | necessary for clock propagation |
| clock_hierarchy clock 1 phase 1 \| phase 2 clocknames | clock names used in design hierarchy from the top down Important: do not use clock_hierarchy with either clock_nodename or clockb_nodename; also, do not use clock names as signal names | | | necessary for clock propagation |
| scanen_nodename | scan enable names used in design | | | necessary for scan propagation |
| scanclk_nodename | scan clock names used in design | | | necessary for scan propagation |
| tcycle | nominal cycle time for design | 4.000 | ns | em |
| switch_factor | switching propensity of signals in design valid values range from 0–2, indicating the number of transitions per clock cycle | 0.500 | ns | em |
| tedge_rise | nominal edge rate allowed at node tedge_rise is used for Vspike | min = 0.8 max = 1 typ = 0.5 | ns | coup only the min value is used in this check |
| tedge_fall | normal edge rate allowed at node tedge_fall is used for Vdrop | min = 0.8 max = 1 typ = 0.5 | ns | coup only the min value is used in this check |
| em_cap_threshold | maximum capacitive load seen at node | 50.00 | pf | em |

TABLE 3-continued

Technology File-Design Parameters

| Parameter | Meaning | Default | Units | Check |
| --- | --- | --- | --- | --- |
| wirecap_default | generic wire capacitance to be added to nodes | 0.000 | ff | em, cshare, coup, drive |
| coup_static_ratio | static coupling ratio used for noise checks ($C_{coup}$)/($C_{coup}$ + $C_{node}$) | min = 0.2<br>max = 0.2<br>tol = 0.1 | | coup |
| coup_vrise_max | maximum allowable voltage spike due to coupling on the victim node | if no value is supplied for this parameter, values for coup_static_ratio are used | volts | coup |
| coup_vfall_max | maximum allowable voltage drop due to coupling on the victim node | if no value is supplied for this parameter, values for coup_static_ratio are used | volts | coup |
| coup_dynamic_ratio | dynamic coupling ratio used for noise checks ($C_{coup}$)/($C_{coup}$ + $C_{node}$) | min = 0.1<br>max = 0.1<br>tol = 0.1 | | coup |
| coup_cap_threshold | percentage to prune coupling capacitances of insignificant value<br>valid values are from 0.0 to 1.0 | min = 0.1 | | |

Referring back to FIG. 5, input analyzer module 102 receives the input information from interface module 100 and processes the input information to extract information related to checks, netlist information, information related to assertions, and other information such as library information, process-specific information and the like provided by the user. Input analyzer module 102 forwards the checks information to checks analyzer module 106, the netlist information to netlist information reader module 104, the assertions information to assertions analyzer module 112, and the other information to circuit design analyzer module 114. Information may also be stored in data store 120.

Assertions analyzer module 112 is responsible for processing information related to the assertions. As previously described, an assertion specifies design constraints and limits associated with circuit structures within the circuit design. An assertion is associated with a circuit structure in the circuit design and specifies operational limits or constraints associated with attributes of the circuit structure. The attributes may include topological attributes, interconnectivity attributes, charge share attributes, noise attributes, and other like attributes associated with circuit structures within the circuit design. The assertion also includes contextual information specifying the context in which the assertion is to be applied to the circuit structure.

Compound assertions may also be specified according to an embodiment of the present invention. In a compound assertion, two or more assertions may be specified for a circuit structure and a conditional relationship may be specified between the assertions. Example of conditional relationships include an "if" clause, an "if-then" clause, an "if-then-else" clause, and several other conditional clauses.

In one embodiment of the present invention, the contextual information specifies a driver circuit structure which drives signals to the circuit structure for which the assertion is specified (also called the gate-under-analysis (GUA) circuit structure), and a receiver circuit structure which receives signals from the GUA, or in other words which is driven by the GUA. According to an embodiment, an assertion may be defined using the following basic format:

attribute: constraint action context

The "attribute" keyword identifies an attribute associated with a circuit structure which is to be analyzed. Examples of attributes include betar (beta ratios for standard gates), betar_path, connect, drivefast, driveslow, fanout, nstack_height, pstack_height, nstack_taper, pstack_taper, nstack_width, pstack_width, weak_nodes, vt_class drive_path, and others (examples of attributes are listed in Table 2).

The "constraint" keyword specifies the limits, operational margins, or parameters associated with the attributes. A constraint may be specified in a variety of ways including using a minimum value, a maximum value, tolerance values, a range of values (for example, 1 . . . 4), a number, a floating point, etc. The "action" keyword specifies the action to be performed by the present invention if the circuit under analysis violates the assertion constraint. Examples of actions include flagging violations, performing further analysis of the violating circuit, reporting the violation in an appropriate format, generating a netlist including the violating circuit structures for further analysis, and the like. Actions may also include steps for repairing the "violating" circuit design. These actions may include generating a netlist corresponding to a portion of the circuit design which violates the assertions, and forwarding to a circuit simulator for further analysis. The present invention may also generate input stimuli, for e.g. vectors, to facilitate analysis of the circuit design portion which violates an assertion. The present invention may also perform other actions for optimizing and improving circuit quality and performance. Actions may also be defined or customized by the circuit designer using API module 122 and specified in the assertions. The action field is optional and in the default mode (i.e. when no specific action has been specified) may be configured to report instances of circuit structures which violate one or more assertions.

Figure 6:
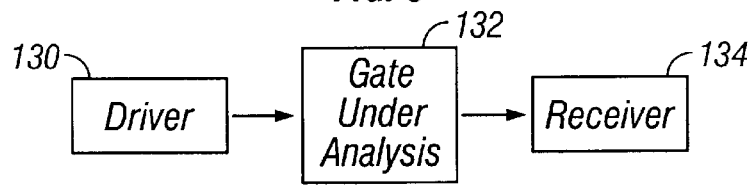
FIG. 6 depicts a format for specifying contextual information including a driver circuit structure, a gate-under-analysis circuit structure (GUA), and a receiver circuit structure according to an embodiment of the present invention.
Figure 7:
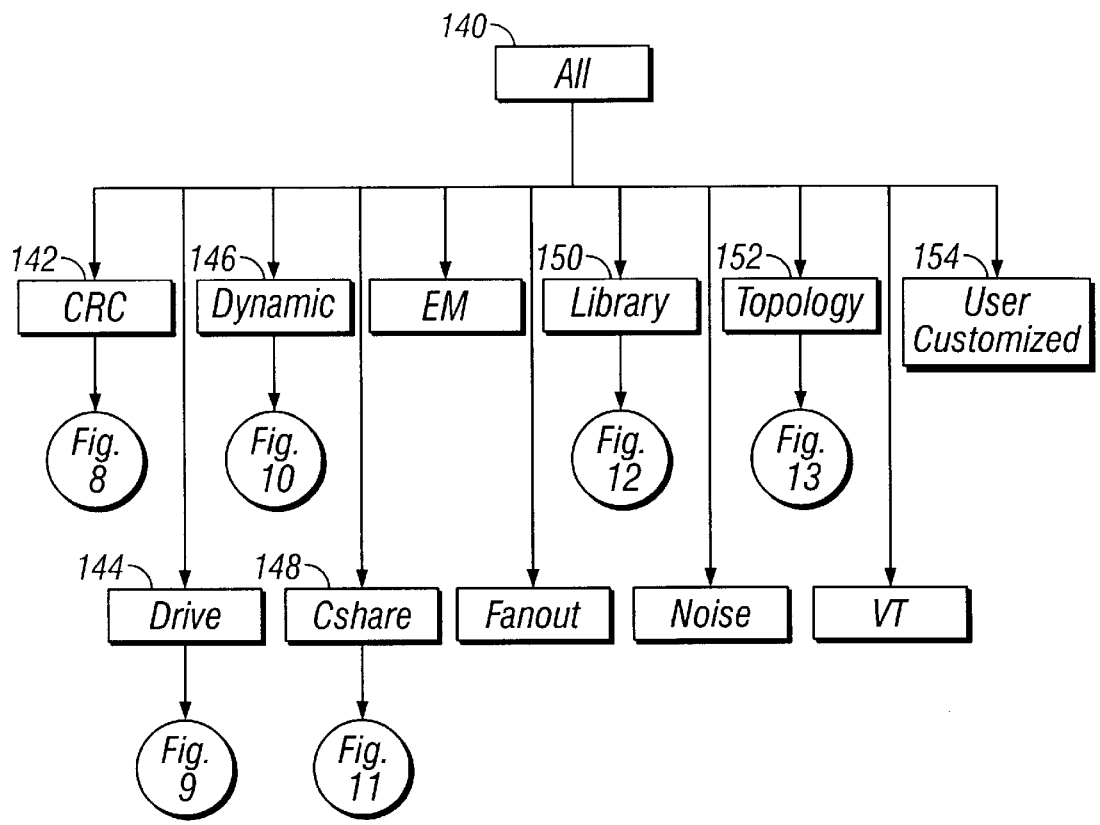
FIGS. 7–13 depicts hierarchical relationships between various checks according to an embodiment of the present invention.
Figure 8:
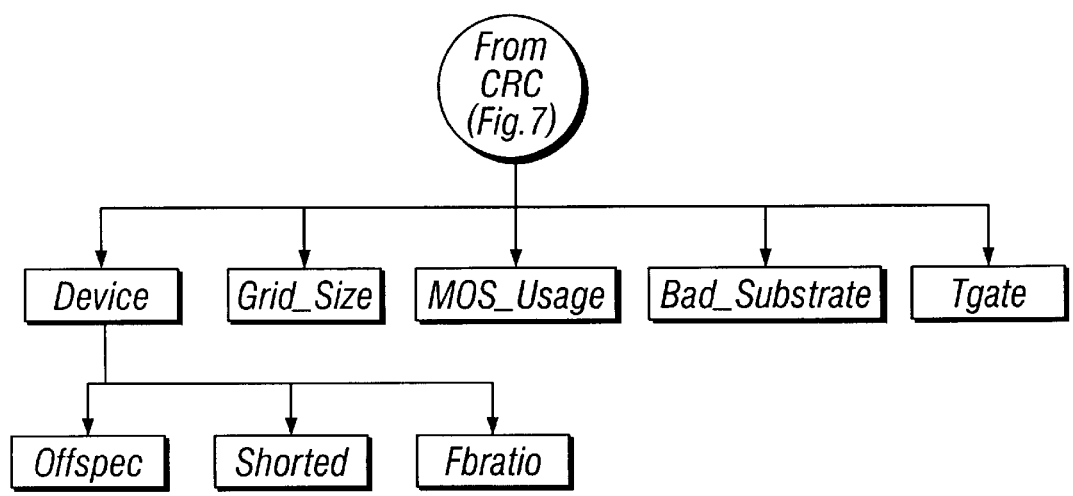
Figure 9:
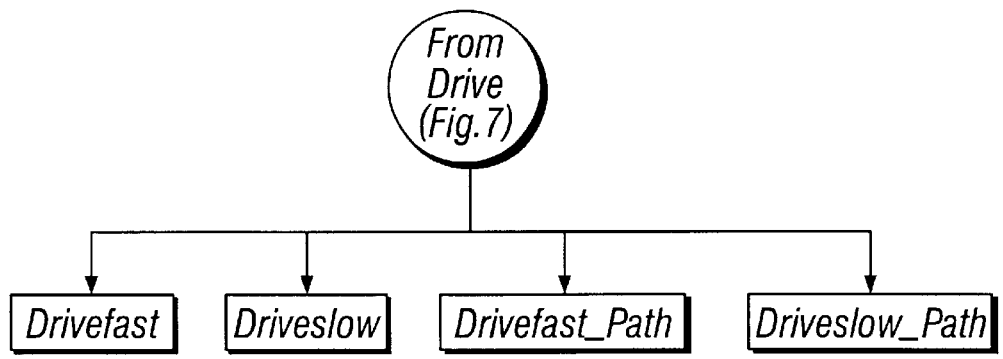
Figure 10:
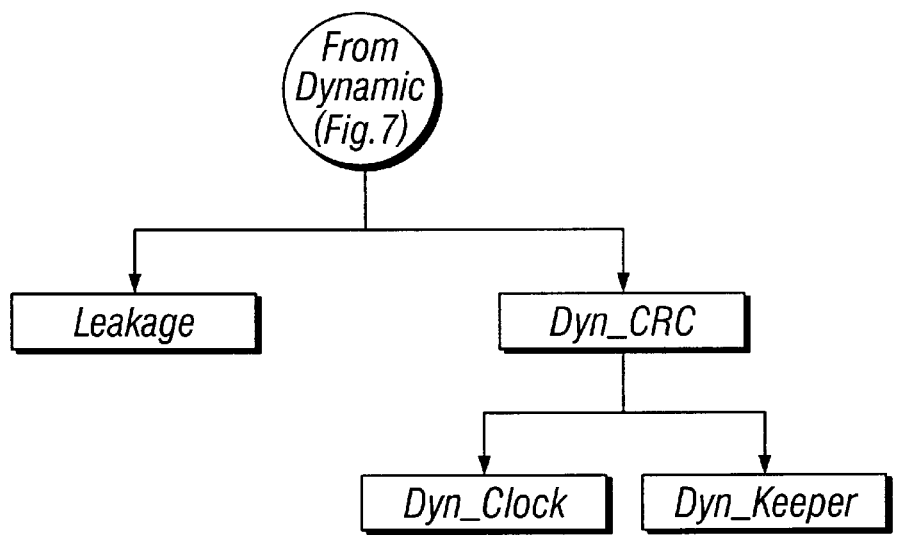
Figure 11:
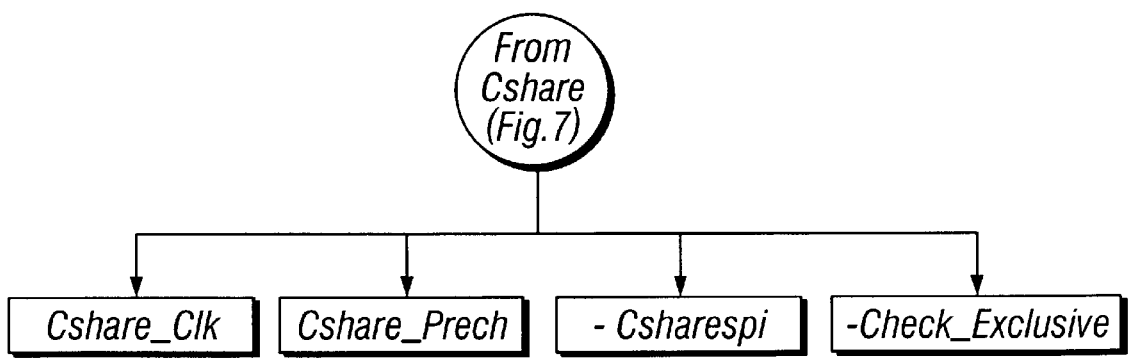
Figure 12:
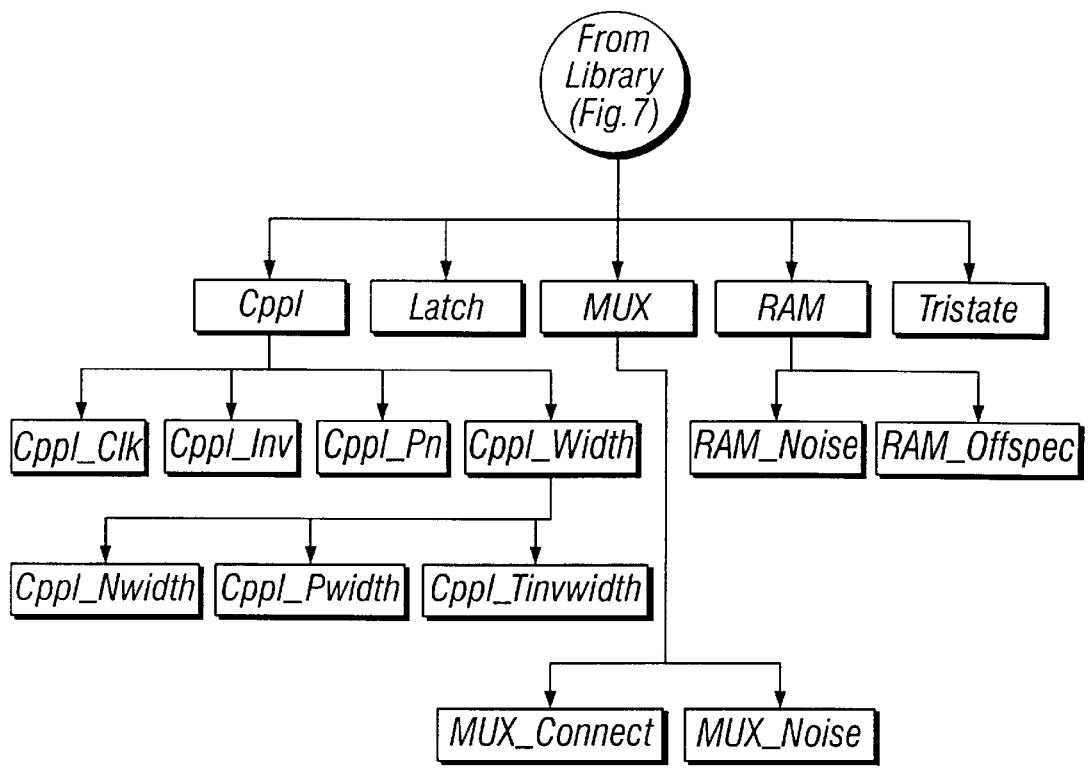
Figure 13:
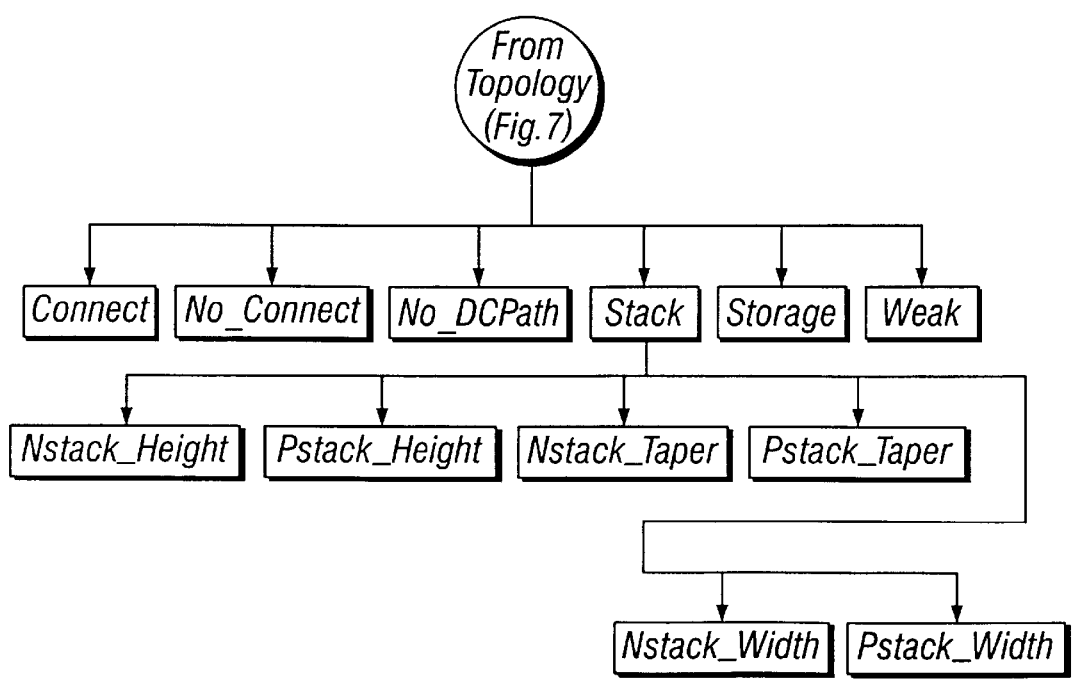

The "context" keyword describes the context in which the assertion is to be applied to the circuit structure. As depicted in FIG. 6, the contextual description typically includes a driver structure 130, a gate-under-analysis (GUA) 132, and a receiver structure 134 context. The following format may be used to specify the context according to an embodiment of the present invention:

Driver-GUA-Receiver GUA 132 indicates the circuit structure with which the assertion is associated and which is to be analyzed. Driver structure 130 indicates a structure which is connected to the GUA and which drives the GUA, and receiver 134 indicates a circuit structure which is connected to the GUA and receives signals from the GUA. Cells and blocks are analyzed using the surrounding context. Driver structure 130 may in turn include a plurality of circuit structures both in depth (connected in serial to GUA 132) and in height (fanin, connected in parallel to GUA 132). Similarly receiver structure 120 may include a plurality of circuit structures both in depth (connected in serial to GUA 132) and in height (fanout, connected in parallel to GUA 132).

According to the present invention, various notations may be used to describe circuit structures which embody the driver, GUA, and receiver. Table 4 depicts an exemplary short-hand notation for describing circuit structures.

TABLE 4

Notations to describe circuit structure

| Type of Circuit Structure | Notation |
| --- | --- |
| Logic | LO |
| Static | S |
| Dynamic | D |
| Ratioed | R |
| Mux | M |
| Tristate | TS |
| Complementary | C |
| Level Restorer | LR |
| Ram | RAM |
| Transmission Gate | TS |
| Pass Gate | PG |
| Latch | L |
| Unknown | X |
| Inverter | INV |
| Nand gate | NAND |
| Nor gate | NOR |
| Any structure | * |

As shown in Table 4, circuit structures may be specified at various levels of abstraction. These levels of abstraction generally correspond to various classes of circuit structures depicted in FIG. 4. It should, however, be apparent that various other notations may also be used to specify the circuit structures.

Using the notations depicted in Table 4, a logic static pass gate mux may be denoted as "LO.S.M.PG," a static logic circuit structure may be denoted as "[LO.]S," a complementary NAND gate as "C.NAND," a complementary inverter as "C.INV," a complementary NOR gate as "C.NOR," and the like. Likewise, several other circuit structures may be specified. Contexts may then be defined using the circuit structure notations. For example, a context wherein a complementary NAND gate is the driver, a complementary NOR gate is the GUA, and a complementary inverter is the receiver, may be specified as:

(C.NAND-C.NOR-C.INV)

If the driver and receiver may include any circuit structure, the context may be defined as:

(*-C.NOR-*)

where the "*" indicates that the driver and receiver can be any circuit structure. The "*" may also be omitted where appropriate.

Based on the previous description, assertions may be specified as follows:

Example Assertion (1) betar:(1, 5, 0.01) (C-C-C)

which asserts that the beta ratios (attribute) for all complementary gates (GUA) when driven by any complementary gate (driver) and driving any complementary gate (receiver) is minimum 1, maximum 5, with a 10% tolerance (constraint). Since no action has been specified, the present invention will perform the default action which may be to report all instances of the circuit structure which does not satisfy the assertion constraints.

Example Assertion (2): nstack_height: 2 (C-C-TG.2 )

which asserts that a complementary logic gate (GUA) connected to a complementary gate driver (driver), and driving 2 levels of logic (Receiver), should have a maximum stack height (attribute) of 2 (constraint).

Example Assertion (3): nstack_height: 3 (D-C-*)

which asserts that the output stage maximum nstack height (attribute) for a complementary gate (GUA) driven by a dynamic gate (driver) is 3 (constraint). The receiver in this assertion may be any ("*") circuit structure.

Example Assertion (4): connect: error (*-D-D)

which provides a connectivity related assertion asserting that any dynamic gate (GUA) driven by any circuit structure (driver) and which drives a dynamic gate (receiver) is an erroneous connection (constraint).

Example Assertion (5): connect: error (*-D-D+5)

This assertion is quite similar to assertion (4). However, this assertion indicates that the receiver circuit structure includes five dynamic gates serially connected to the GUA. This is an example of an assertion where the receiver circuit itself includes a plurality of circuit structures. Several notations may be used to indicate the number of structures included in the receiver and their connection to the GUA. Similar assertions may also be made for the driver circuit structure.

Example Assertion (6): error (*-D-D~5)

This assertion is quite similar to assertions (4) and (5). However, this assertion indicates that the receiver circuit structure includes five dynamic gates in parallel (fanout) to the GUA. This is another example of an assertion where the receiver circuit itself includes a plurality of circuit structures. Several notations may be used to indicate the number of structures included in the receiver and their connection to the GUA. Similar assertions may also be made for the driver circuit structure.

Example Assertion (7): connect: ignore (*-D-C)

which asserts that instances of any circuit structure connected to a dynamic circuit structure which is in turn connected to a complementary circuit structure should be ignored. This allows a circuit designer to specify an assertion for a circuit structure without requiring any analysis to be performed for the structure.

As previously described, assertions may be associated with circuit structure at various levels of abstraction. For example, assertions may be associated with nodes at various hierarchy levels of tree 80 depicted in FIG. 4. Assertions analyzer module 112 in conjunction with circuit structures analyzer module 110 determines the assertions to be associated with the various circuit structures, based on assertions associated with the circuit structures and assertions inherited by the circuit structures. The assertions are then provided to circuit design analyzer module 114 for performing the circuit design analysis.

Netlist information reader module 104 is responsible for receiving netlist information from input analyzer module 102 and converting the netlists to a format which can be processed by netlist flattener module 108. Netlist information reader module 104 is capable of reading netlists in various different formats. These formats include hardware description language formats, Spice compliant netlist formats, DSPF and SPEF formats, and other netlist/parasitic formats. Netlist information reader module 104 enables the present invention to be easily integrated with electronic design automation (EDA) and analysis tools which provide netlists in various formats.

Netlist flattener module 108 may be configured to receive a hierarchical netlist from netlist information reader module 104 and to generate a flat wirelist from the hierarchical netlist information. Netlist flattener module 108 is also capable of handling parameterized hierarchical netlist specifications. Flattening the netlist generally involves extracting transistor level information from the input netlist and creating netlist related data structures. Netlist flattener module 108 may also be configured to exclude a module or an instance of a module from the flattening process. Module 108 may also be configured to provide end-of-run statistics on the circuit design, for example, statistics on the distribution of module instantiations in the design. Netlist flattener module 108 may also be configured to append instantiation hierarchy in the flattened signal name for easy identification. The flat wirelist and extracted transistor-level information are then forwarded to circuit structures analyzer module 110 for further processing.

Based on the flattened wirelist transistor-level information and the information stored in the netlist data structures, circuit structures analyzer module 110 receives, identifies andsets signal flow directions through the transistors, classifies the transistors based on their usage, identifies and classifies circuit structures according to a hierarchy from the transistor-level information, and determines the functionality of the circuit structures. As previously stated, the hierarchical classification identifies circuit structures at different levels of abstraction. In one embodiment, the hierarchical information is represented by a circuit structures tree 80 depicted in FIG. 4. After identifying and classifying the circuit structures from the circuit design, circuit analyzer module 110, in conjunction with assertions analyzer module 112, determines the assertions to be associated with the various circuit structures. The circuit structures information and the assertions information is provided to circuit design analyzer module 114 to enable the circuit analysis.

Checks analyzer module 106 is responsible for receiving and processing information specifying the checks to be performed on the circuit design. As previously stated, a check may relate to various aspects of the circuit design including drive strength, noise margin, charge share, topological checks, and other aspects of the circuit design. Checks allow a user of the present invention to check the integrity of the circuit design, and to ensure that the circuit design adheres to standards established or configured by the user via the assertions. For example, checks associated with the drive strength may identify signals with insufficient drive strength as well as signals with excessive drive strength. Effective capacitance load at a node may be compared against worst-case drive strength. Further, capacitance per micron width of the drive may be checked. Checks associated with charge shares may check the ratio of worst-case internal diffusion capacitance to load capacitance. Checks associated with noise margins may determine the allowable noise voltage on the input of a gate so that the output will not be affected. In addition to checks provided by the present invention, the user may also customize or define checks using API module 122.

According to the present invention, the checks may be organized in a hierarchical manner such that a particular check may actually include a plurality of checks, and alternatively a particular check may be included in one or more other checks. FIGS. 7–13 depicts hierarchical relationships between various checks according to an embodiment of the present invention. In the embodiment depicted in FIG. 7, check "ALL" 140 includes all the checks performed by an embodiment of the present invention. Check CRC 142 includes the checks shown in FIG. 8, check DRIVE 144 includes the checks depicted in FIG. 9, check DYNAMIC 146 includes the checks shown in FIG. 10, check CHARE 148 includes the checks shown in FIG. 11, check LIBRARY 150 includes the checks shown in FIG. 12, and check TOPOLOGY 152 includes checks depicted in FIG. 13. For example, if the user specifies that a DRIVE check be performed, then the present invention will perform the checks depicted in FIG. 9. The checks may also include user customized checks 154 specified by the user using API module 122. Check analyzer module 106 is responsible for determining the checks to be performed on the circuit design based on the checks information received from the user.

Table 5 describes the various checks depicted in FIGS. 7 through 13 according to an embodiment of the present invention. These checks are examples of checks which may be performed by the present invention and do not restrict the scope of the present invention. It should be apparent that other types of checks may also be performed by the present invention. The first column of Table 5 titled "CHECK" lists the check identifier, while the second column of Table 5 titled "DESCRIPTION" describes the analysis performed by the check and the assertions used by the check to perform the analysis. The second column also shows exemplary output reports which are generated by the present invention in response to the checks. As previously stated, these output reports typically indicate circuit structures which violate one or more assertions. According to the embodiment described in Table 5, a "do-check" command-line syntax may be used to instruct the present invention to perform the specified check.

TABLE 5

Checks

| CHECK | DESCRIPTION |
| --- | --- |
| ALL | Runs all the analysis checks and displays the results obtained from the analysis. Analysis checks that would result in duplicated reports are excluded. |
| CRC | Related technology file parameters:<br>   psub_nodename, nsub_nodename, n_len, p_len, n_wid, p_wid,<br>   n_fb_len, p_fb_len, n_fb_wid, p_fb_wid<br>Checks several critical electrical circuit rules to ensure that the circuit design complies with both standard circuit rules and design/project specific rules.<br>Running -do crc is equivalent to running all of the following:<br>  -do device[s] → runs the following device checks: -do offspec, -do shorted, -do fbratio<br>  -do grid size → checks transistor width and length<br>  -do mos_usage → checks that pmos is used as pullup and nmos is used as pulldown<br>  -do bad_substrate → checks for bad substrate connections<br>  -do tgate → identifies invalid transmission gate connections |
| Device | Runs the following device checks:<br>  -do offspec → checks for devices whose sizes fall outside of the ranges specified in the technology file, or devices with invalid sizes, such as negative numbers<br>  -do shorted → checks for shorted transistors<br>  -do fbratio → identifies structures with offspec feedback ratios<br>Example report:<br>MC:OFFSPEC: Circuit structures with offspec device sizes<br># spec n_len_[min = 0.180, max = 1.000], n_wid_[min = 1.000, max = 100.000]<br># spec p_len_[min = 0.180, max = 1.000], p_wid_[min = 1.200, max = 100.000]<br># wid  len  type  usage  source  gate  drain  Device_name<br>1.000  1.000  pmos  pu     VDD    NET_8  NET_10  MXU6.M2<br>1.000  1.000  pmos  pu     VDD    NET_7  NET_10  MXU6.M3<br>1.000  1.000  pmos  pu     VDD    NET_5  NET_12  MXU7.M1<br>MC:SHORTED: Circuit structures with shorted drain source terminals<br>  None<br>MC:FBRATIO: Circuit structures with offspec feedback ratios<br>  None<br>Explanation:<br>In this report, the devices flagged fall below the minimum width specification for pmos transistors (their width is 1.000 rather than 1.200) are shown.<br>The abbreviations used under the usage heading may include:<br>  ps → pass device (static, dynamic)<br>  pu → pullup (static, dynamic, ratioed)<br>  pd → pulldown (static, dynamic, ratioed)<br>  tgate → transmission gate (static, dynamic)<br>  prech → precharge (dynamic)<br>  pldpu → p-load pullup (ratioed)<br>  pldpd → p-load pulldown (ratioed)<br>  nldpu → n-load pullup (ratioed)<br>  nldpd → p-load pulldown (ratioed)<br>  pfbpu → p-feedback pullup (static, dynamic)<br>  nfppu → n-feedback pullup (static, dynamic)<br>  pfbpd → p-feedback pulldown (static, dynamic)<br>  nfbpd → n-feedback pulldown (static, dynamic) |
| Offspec | Checks for devices whose sizes fall outside of the ranges specified in the technology file and for devices with invalid sizes, such as negative numbers. Any device (other than a p-feedback pullup or n-feedback pulldown) larger than 10,000 X or smaller than 1/10,000 X is reported as an error. To identify device size violations, the present invention checks the following technology file parameters: n_len, p_len, n_wid, p_wid.<br>To identify offspec precharge devices, the present invention checks the technology file parameters: n_prech_len, n_prech_wid, p_prech_len, p_prech_wid. If no values are supplied for these parameters, the present invention uses the values for the n_len, p_len, n_wid, p_wid parameters.<br>Because p-feedback pullups (pfbpu) and n-feedback put-downs (nfbpd) can be smaller than 1/10,000 X, the present invention refers to the following technology parameters when checking these devices.<br>For pfbpu: p_fb_len, p_fb_wid, p_fb_ratio<br>For nfbpd: n_fb_len, n_fb_wid, n_fb_ratio |
| Shorted | Checks for shorted transistors. Transistors connected to both Vdd and Vss are flagged. |
| Fbratio | Related technology file parameters: p_fb_ratio, n_fb_ratio<br>Identifies circuit structures with offspec feedback ratios. |
| Grid_Size | Related technology file parameters: trans_unit_len trans_unit_wid<br>Checks that transistor width and length is a multiple of the grid size. |
| MOS_Usage | Checks that a pmos transistor is used as pullup and an nmos is used as pulldown. |
| Bad_Substrate | Checks substrate connections in nmos and pmos transistors. Verifies the substrate names in the circuit design against names specified in the technology |

TABLE 5-continued

Checks

| CHECK | DESCRIPTION |
|---|---|
| | file with the "psub_nodename" and "nsub_nodename" parameters. |
| Tgate | Checks for proper gate connections in the transmission gate structure. Also checks for inversion between nmos and pmos gate connections. |
| DRIVE | Related technology file parameters:<br>    n_Cox, p_Cox, n_cap_area, p_cap_area, n_cap_peri, p_cap_peri,<br>    cgbo, cgso, cgdo, cjgaten, cjgatep, cgate_use_coeff, acm, n_len: def<br>    p_len: def, n_wid: def, p_wid: def, drivefast, driveslow<br>Technology file assertions:<br>   drivefast: (n_delay_ratio_min, p_delay_ratio_min) context<br>   driveslow: (n_delay_ratio_max, p_delay_ratio_max) context<br>Identifies nodes with insufficient drive strength and signals with excessive drive strength. This option also identifies drive problems when transmission or pass gate chains are taken into account.<br>Capacitance per micron width of drive is checked against the specified "n_delay_ratios" and "p_delay_ratios" in the technology file. |
| Drivefast | Technology file assertion:<br>   drivefast: (n_delay_ratio_min, p_delay_ratio_min) context<br>Identifies nodes that have excessive drive strengths. Capacitance per micron width of drive is checked against the specified "n_delay_ratios" and "p_delay_ratios" in the technology file. |
| Driveslow | Technology file assertion:<br>   driveslow: (n_delay_ratio_max, p_delay_ratio_max) context<br>Identifies nodes with slow rise and fall times. Capacitance per micron width of drive is checked against the specified "n_delay_ratios" and "p_delay_ratios" in the technology file. |
| Drivefast_Path | Technology file assertion:<br>   drivefast_path: (n_delay_ratio_min, p_delay_ratio_min) context<br>Identifies nodes that have excessive drive strengths taking into consideration the drive load of pass or transmission gates in the path of the driven gate. |
| Driveslow_Path | Technology file assertion:<br>   drivefast_path: (n_delay_ratio_max, p_delay_ratio_max) context<br>Identifies nodes that have insufficient drive strengths taking into consideration the drive load of pass or transmission gates in the path of the driven gate. |
| DYNAMIC | Runs the following checks on dynamic circuits:<br>  -do leakage → runs a leakage ratio check<br>  -do dyn_crc → checks whether a dynamic circuit has a footed clock or a keeper structure (-do dyn_clock, -do dyn_keeper)<br>  -do cshare → identifies circuit structures susceptible to charge share<br>  -do cshare_clk → identifies circuit structures with inconsistent clocking<br>  -do cshare -csharespi → generates a Spice input file for Spice simulation<br>  -do cshare_prech → identifies circuit structures with offspec precharge devices |
| Leakage | Technology file parameters:<br>  pkeep_leakage_ratio: (min, max, tol), nkeep_leakage_ratio: (min, max, tol)<br>Identifies dynamic structures that leak charge when in shutdown mode. The ratio is calculated by dividing the width of the leakage device by the sum of the transistors closest to the output node of the pullup or pulldown devices. When a dynamic structure is in evaluation, with its input low and its output high, the output stays high to the charged up load capacitor. Usually there is subthreshold conduction of the transistor, which is more prominent because of threshold voltage scaling. This causes the charge on the dynamic output node to drain off. For this reason, there is a small pmos or nmos keeper (depending on the topology) placed to contain the leakage on the node that may float high or low (depending on the topology) for extended periods This problem is worse for gates with wide nor structures with many parallel leakage paths.<br>Example report:<br>MC:LEAKAGE: Dynamic output nodes which violate the leakage thresholds<br>  # spec = nkeep_leakage_ratio (min,max,tol)=(0.5000, 1.0000, 0.1000)<br>  # spec = pkeep_leakage_ratio (min,max,tol)=(0.5000, 1.0000, 0.1000)<br>  # Ratio  type  Keeper-Width  Leakage-Width  NodeName<br>  0.1000  p  2.0000  20.0000  DOUT<br>                                    Port IN->(INV2)<br>                                    Port DOUT->(D)<br>Explanation:<br>This report shows that the keeper is too small; the minimum keeper ratio is 0.5, and this keeper has a ratio of 0.1. The present invention calculates this ratio by dividing the keeper width by the leakage width; in this case, 2.0/20.0 = 0.1. |
| Dyn_CRC | Runs the following checks on dynamic circuits:<br>  -do dyn_clock → checks whether a dynamic circuit has a footed clock.<br>  If the primary precharge clock is conditional, the dynamic node should have either a full static latch or a half latch (weak feedback device).<br>  -do dyn_keeper → checks whether a dynamic circuit has a keeper. |

TABLE 5-continued

Checks

Figure 14:
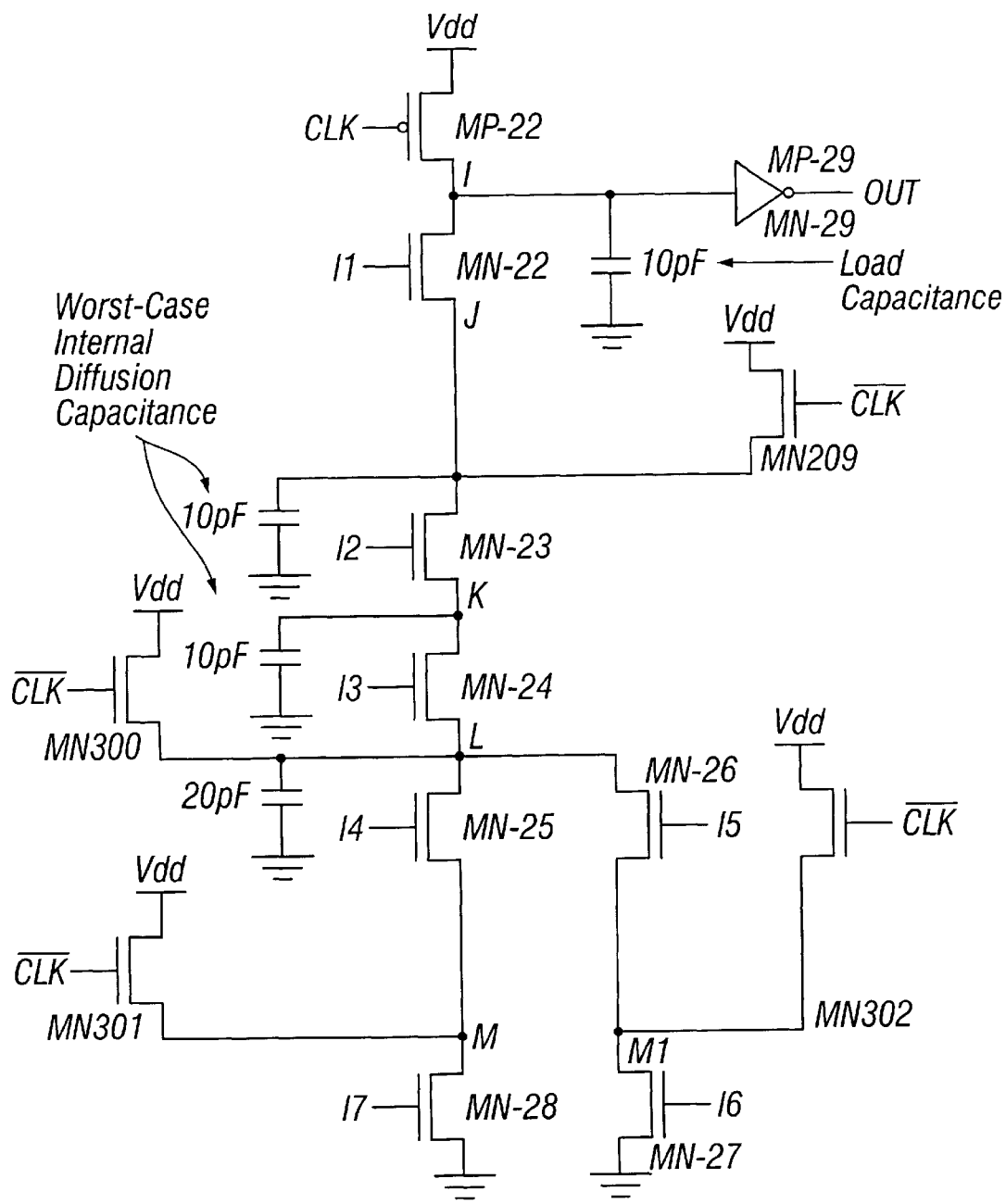

| CHECK | DESCRIPTION |
|---|---|
| Dyn_Clock | Checks whether a dynamic circuit has a footed clock. If the primary precharge clock is conditional, the dynamic node should have either a full static latch or a half latch (weak feedback device). |
| Dyn_Keeper | Checks whether a dynamic circuit has a keeper and whether the keeper is of the correct type. The report also specifies the keeper type required.<br>Example report:<br>MC:DYN_KEEPER: Dynamic circuit structures without keepers and wrong keeper type:<br> # Nodename   Keeper Type Needed<br> DOUT    KEEPER MISMATCH<br>  Port IN->(INV2)<br>  Port DOUT->(D)<br> NET214    PMOS<br>  Port A->(INV)<br>Explanation:<br>This report shows that net DOUT has a keeper, but it is of the wrong type. NET214 does not have a keeper-the keeper type required is a pmos. |
| CSHARE | Related technology file parameters:<br> n_Cox, p_Cox cshare_capsratio, cshare_vdrop_max, n_cap_area(cjn), p_cap_peri (cjswp), n_cap_peri(cjswn), p_cap_area(cjp), hdif(if no drain/source diffusion parameter provided), cgate_use_coeff, ratio_nprech, ratio_prech, clock_nodename cgbo, cgso, cgdo, cjgaten, cjgatep<br>Identifies dynamic structures susceptible to charge share. The -do cshare option checks the ratio of worst-case internal diffusion capacitance to load capacitance. If the diffusion capacitance is comparable to the load capacitance, they may share the charge, which causes the output voltage to drop from the capacitive voltage divider.<br>For example in FIG. 14, the internal diffusion capacitance (indicated by arrows) is 10 pF; the load capacitance, the output of the dynamic node, is 10 pF. If the capacitance ratio specified in the technology file (cshare_capsratio) is 0.10, the present invention will flag a charge share violation in this circuit.<br>To qualify as a dynamic circuit, the following criteria must be met:<br> Clock is present on the primary precharge transistor<br> If the feedback to the dynamic node is a keeper circuit (back-to-back inverter), the feedback inverter device size must be weaker than the forward inverter<br>Example report:<br>MC:CSHARE: Circuit structures susceptible to charge-share:<br># spec = cshare_capsratio=0.10, cshare_vdrop_max=0.50<br>#Vdrop Cratio Cnode Cstack Cgate Cdiff Cwire Ccoup Keeper Nodename<br>0.51* 0.39* 128.64 50.00 8.64 0.00 120.00 0.00  L5<br>0.20 0.31* 128.00 40.00 28.00 0.00 100.00 0.00  I1<br>Explanation:<br>The capacitance ratio is equal to the sum of all stack node capacitances (Cstack) of all the legs of the structure, which do not have a precharge transistor, divided by the load capacitance (Cnode). In this example, the capacitance ratio specified in the technology file is 0.10. Node L5 violates this charge share specification because 50.00 (Cstack) divided by 128.64 is equal to .39.<br>If the -dspf option is used with the -do cshare option, the output report will not include the Cgate and Cwire headings, and it will include the Cnet heading:<br>#Vdrop Cratio Cnode Cstack Cnet Cdiff Ccoup Keeper Nodename<br> where<br> Cnet = Cgate + the sum of the distributed capacitances<br> Cnode = Cnet + Cdiff<br> Cratio = Cstack/Cnode<br> Cstack = diffusion capacitance of the intermediate nodes of dynamic logic |
| Cshare_Clk | Identifies circuit structures with inconsistent clocking; that is, if the primary pre-charge transistor is a pmos, and the intermediate node precharge transistor is an nmos, their input clocks should be at opposite phases-when one is high, the other should be low.<br>Example report:<br> MC:CSHARECLK: Circuit structures with inconsistent clocking:<br># clknode 1 device1name clknode2 prech_device Nodename<br>CLK   MN_43  CLK   MP_35   I<br>Explanation:<br>This report flags inconsistent clocking: the input clocks for both MP_35 and MN_43 are high, rather than at opposite phases. |
| Cshare_Prech | Identifies circuit structures with offspec precharge devices.<br>Example report:<br> MC:CSHARE_PRECH: Circuit structures with offspec precharge devices:<br># spec = ratio_nprech_[min = 6.00, max = 7.00, tol = 0.10] |

TABLE 5-continued

Checks

| CHECK | DESCRIPTION |
|---|---|
| | # spec = ratio_prech_[min = 1.00, max = 1.00, tol = 0.10]<br># Wid   Len   Type   Devicename<br>10.00   0.35   NMOS   MN_43<br>10.00   0.35   NMOS   MN_44<br>Explanation:<br>This report identifies precharge devices MN_43 and MN_44 as violating the technology file parameter<br>   # spec = ratio_nprech_[min = 6.00, max = 7.00, tol = 0.10]<br>This ratio is the width divided by the length of the precharge device. |
| Cshare -Csharespi | Generates a Spice file with input stimulus for circuits that fail the charge share checks. This file may be used input to Spice for a detailed analysis of the failed circuit.<br>The following is a sample Spice file created by the present invention using this option.<br>   Info: Charge Share Spice Simulation File "cshare_ii.sp" written<br>   **********************************************<br>   * cshare_ii.sp<br>   * Spice input file for Cshare spice simulation<br>   * Auto-generated by the present invention<br>   **********************************************<br>   *<br>   .GLOBAL VDD VSS $ Declare global signals<br>   .options brief=1 post=0 autostop $ set simulation options.<br>   .lib '<libfile>' nom $ set and point spice libs.<br>   .lib '<libfile>' process $ set and point spice libs.<br>   *.include "<file.spi>" $ place holder<br>   .option brief=0<br>   *<br>   **********************************************<br>   * Initial simulation Environment (Nominal Corner)<br>   **********************************************<br>   .param vdd=1.53 V $ Set VDD voltage, VSS voltage<br>   .param tfall=0.4 ns $<br>   .param trise=0.4 ns $<br>   .param setup=0.2 ns $<br>   .param tcycle=5 ns $<br>   .temp=100 $ Set temperature<br>   **********************************************<br>   ** Voltage Source declarations<br>   **********************************************<br>   Vvss vss 0 0<br>   Vvdd vdd 0 dc 'vdd'<br>   **********************************************<br>   ** Simulation run(s)<br>   **********************************************<br>   .option post = 2<br>   .tran 5 ps 5 ns $ Set simulation time.<br>   Initialize the node voltages<br>   .IC v(II)=vdd<br>   **********************************************<br>   ** Netlist and Input Signal Generation<br>   **********************************************<br>   MN_29 MM II7 VSS VSS NFET80 W = 0.00 U L= 0.00 U<br>   MN_26 LL II4 MM VSS NFET80 W = 0.00 U L = 0.00 U<br>   MN_23 II II1 LL VSS NFET80 W = 0.00 U L = 0.00 U<br>   VII7 II7 VSS PULSE(0 vdd '0.5*tcycle' 'trise' 'tfall' '0.5*tcycle-trise' 'tcycle')<br>   VII4 II4 VSS PULSE(0 vdd '0.5*tcycle' 'trise' 'tfall' "0.5*tcycle-trise' 'tcycle')<br>   VII1 II1 VSS PULSE(0 vdd '0.5*tcycle' 'trise' 'tfall' '0.5*tcycle-trise' 'tcycle')<br>   MP_22 II CLK VDD VDD PFET80 W = 0.00 U L = 0.00 U<br>   VCLK CLK VSS PULSE (0 vdd 0 ns 'trise' 'tfall' '0.5*tcycle-trise' 'tcycle')<br>   **********************************************<br>   ** Measurements Taken<br>   **********************************************<br>   .MEASURE TRAN max_dyn max V(II) FROM=0.62 n TO=1.0 n $ find max volt-age between 0.62 n and 1.0 n<br>   .MEASURE TRAN min_dyn min V(II) FROM=0.62 n TO=1.0 n $ find min. volt-age between 0.62 n and 1.0 n<br>   .END |
| Cshare -Check_Exclusive | Filters charge share errors based on exclusivity. That is, if the inputs to a dynamic structure are exclusive, with one input on, the present invention checks the capacitance of the leg with the largest stack against the capacitance |

TABLE 5-continued

Checks

| CHECK | DESCRIPTION |
|---|---|
| | ratio (cshare_capsratio) specified in the technology file. If the capacitance of the leg exceeds the value of this parameter, the present invention may flag a violation.<br>If the -check_exclusive option is not used, the present invention checks the sum of the capacitance of all the legs against the capacitance ratio specified in the technology file.<br>The present invention checks for exclusivity in the following ways:<br>(a) -exclusive option<br>If the above option is provided, the present invention runs exclusivity checks on muxes, tristates, and cppls and saves the information in a database e.g. data store 120 (see FIG. 5). The present invention saves runtime by using this information when a charge share check with the -check_exclusive option is run.<br>(b) Command file<br>The nodes can be set to be exclusive using the set_exclusive command.<br>(c) -check_exclusive option to the scharecheck<br>If the -exclusive option is not used, the present invention checks for exclusivity as part of the cshare check. |
| EM | Related technology file parameters:<br>   n_Cox, p_Cox, n_cap_area, p_cap_area, n_cap_peri, p_cap_peri,<br>   cgate_use_coeff, num_metal_layers, em_cap_threshold,<br>   mi_metal_width, mi_dc_iavg, mi_ac_iavg, num_metal_layers,<br>   contact_dc_iavg, contact_ac_iavg, switch_factor, tcycle, cgbo, cgso,<br>   cgdo, cjgaten, cjgatep, via_m1_m2_ac_iavg, via_m2_m3_ac_iavg,<br>   via_m3_m4_ac_iavg, via_m5_m6_ac_iavg<br>Checks for electromigration failure. To identify nodes likely to fail, the present invention calculates the metal widths, the number of contacts, and the number of vias between each metal layer required to keep current flowing through the node.<br>The present invention calculates the average current for all logic signals in the design based on the total capacitive load at the node, the switching propensity of the node, and clock frequency.<br>Example report:<br>MC:EMCHECKS: Circuit structures susceptible to EM failure:<br># spec = em_cap_threshold=50.00 pF; tcycle=4.00 ns; Vdd=2.00 V; metal_layers=6<br>#Wm1  Wm2  Wm3  Wm4  Wm5  Wm6  Iavg(mA)  Ctot(pF)  VIAD<br>M1M2  M2M3  M3M4  M4M5  M5M6  Node<br>490.20  490.20  490.20  270.27  196.08  199.60  5000.00  20000.00  2001<br>N/A  N/A  N/A  N/A  N/A  OUT<br>Explanation:<br>This report shows that for the driver of a given size driving a load of 20000 pF (Ctot), with a cycle time of 4 ns, and Vdd equal to 2 v, the metal widths required would exceed the widths specified in the technology file shown below:<br>    Layer          Width<br>    m1_metal_width  0.350<br>    m2_metal_width  0.350<br>    m3_metal_width  0.350<br>    m4_metal_width  0.450<br>    m5_metal_width  0.950<br>    m6_metal_width  1.700 |
| FANOUT | Related technology file assertion:<br>   fanout: range context<br>Identifies circuit structures with logical fanout violations as specified in the technology file. For example, the following assertion checks that a static transmission gate mux drives a fanout of no more than two inverters:<br>   fanout: ~2 (*-S.M.TG-C.INV)<br>Transmission and pass gates are counted as fanouts. For example, for the structure depicted in FIG. 15, the present invention considers the fanout to be 3; the pass gate is counted.<br>Example report:<br>MC:FANOUT: Circuit structures with fanout violations<br>   # Constrained Fanout Check Specs<br>   # fanout: ~1*<br>         Fanout   Context         Nodename<br>         3        (X-D.NPD-C.INV)  XD.NET289 |
| LIBRARY | Runs the following checks on the library structures in the circuit design:<br>  -do cppl → runs -do cppl_clk, -do cppl_inv, -do cppl_pn, and -do cppl_width<br>  -do cppl_clk → runs clocking checks on cppls<br>  -do cppl_inv → checks the beta ratios of cross-coupled inverters to see if they fall within the values specified in the technology file<br>  -do cppl_pn → checks the beta ratios of each side of the cascode to make sure that they are symmetrical |

TABLE 5-continued

Checks

| CHECK | DESCRIPTION |
|---|---|
| | -do cppl_width → checks that cppl widths fall within the limits specified in the technology file<br>-do latch identifies and analyzes latches<br>-do mux → runs -do mux_connect and -do mux_noise<br>-do mux_connect → identifies muxes that violate specified connectivity rules<br>-do mux_noise → checks muxes for noise<br>-do ram → identifies and analyzes rams<br>-do tristate → runs driver node checks on tristates |
| Cppl | Runs the following checks on cascode cppl (cascade push pull logic) structures with cross-coupled inverters:<br>-do cppl_clk → runs clocking checks on cppls<br>-do cppl_inv → checks the beta ratios of cross-coupled inverters to see if they fall within the values specified in the technology file<br>-do cppl_pn → checks the beta ratios of each side of the cascode to make sure that they are symmetrical<br>-do cppl_width → checks to determine if cppl widths fall within the limits specified in the technology file; this option runs the cppl_nwidth, cppl_pwidth, and cppl_tinvwidth options.<br>If the -exclusive option is used with cppl options, the present invention traces back the logic trees connected to the push-pull inputs of the cppl to determine whether the cppl is exclusive and complementary. The present invention also checks the side inputs of the cppl to determine if they are complementary. If the -exclusive option is not used, the present invention does the cppl classification without the exclusivity checks. |
| Cppl_Clk | Runs the following clocking checks on cascode cppl structures with cross-coupled inverters:<br>Verifies that the cascode cppl structure is connected to a clock<br>If the cross-coupled inverters are pmos, verifies that the cppl is not connected to a clock. |
| Cppl_Inv | Related technology file parameter: cppl_ratio<br>Compares Wp/Wn of the cross-coupled inverters to see if the resulting ratio falls within the minimum and maximum values specified by the cppl_ratio parameter in the technology file. |
| Cppl_Pn | Compares the beta ratios of each side of the cascode to make sure that they are symmetrical. |
| Cppl_Width | Related technology file parameters:<br>cppl_width_ratio, cppl_nwidth_ratio, cppl_tinvpwidth_ratio, cppl_tinvnwidth_ratio<br>Checks to determine if the widths of cppls in the circuit design fall within the limits specified in the technology file.<br>Running -do cppl_width is equivalent to running all of the following:<br>-do cppl_nwidth → checks that the ratio of nmos transistors in the push-pull stacks that have common gate inputs falls within the limits specified in the technology file<br>-do cppl_width → checks that the ratio of the cross-coupled pmos transistors(this includes pmos transistors in cross-coupled inverters) falls within the limits specified in the technology file<br>-do cppl_tinvwidth → checks that the ratios of the nmos and pmos transistors of terminating inverters fall within the limits specified in the technology file |
| Cppl_Nwidth | Related technology file parameter: cppl_nwidth_ratio<br>Checks that the ratio of nmos transistors in the push-pull stacks that have common gate inputs falls within the limits specified in the technology file. |
| Cppl_Pwidth | Related technology file parameter: cppl_pwidth_ratio<br>Checks that the ratio of the cross-coupled pmos transistors (this includes pmos transistors in cross-coupled inverters) falls within the limits specified in the technology file. |
| Cppl_Tinvwidth | Related technology file parameters:<br>cppl_tinvpwidth_ratio, cppl_tinvnwidth_ratio<br>Checks that the ratios of the nmos and pmos transistors of terminating inverters fall within the limits specified in the technology file. |
| Latch | Technology file assertion: betar_path: (min, max, tol) L.S<br>Runs noise margin analysis on latches in the circuit design. |
| MUX | Technology file assertion:<br>betar: (min, max, tol) S.M.PG or S.M.PG.SEL or S.M.TG or S.M.TG.SEL<br>Runs the following checks on muxes:<br>-do mux_connect → identifies muxes that violate specified connectivity<br>-do mux_noise → checks muxes for noise<br>In addition, this option checks muxes in the design for select lines driven by a dynamic circuit or primary input and checks whether a flip-flop or latch output drives a mux control line directly.<br>If the -exclusive option is used with mux options, the present invention traces back the connected logic trees to verify the following: |

TABLE 5-continued

Checks

| CHECK | DESCRIPTION |
|---|---|
| | Only one input to the mux is on; if this is not the case, the present invention classifies the mux as unknown.<br>For transmission gate muxes, the present invention checks that the select line pairs for each transmission gate are complementary and then determines exclusivity on all the select line pairs.<br>For pass gate muxes, the present invention checks whether select lines are exclusive.<br>The present invention does not check for exclusivity of the select line if the-exclusive option is not used. |
| MUX_Connect | Checks muxes in the design for connectivity violations.<br>Checks muxes in the design for select lines driven by a dynamic circuit or primary input. Also checks whether a flip-flop or latch output drives a mux control line directly. |
| MUX_Noise | Technology file assertions:<br>    betar: (min, max, tol) S.M.PG or S.M.TG<br>Runs a noise check on muxes in the circuit design. |
| RAM | Technology file parameters:<br>    ram_mode, ram_ratio_npd_nps, ram_ratio_ppu_nps<br>Technology file assertion:<br>    betar: (min, max, tol) RAM<br>Compares any multi-ported 6T Ram cells in the circuit design to the present invention's built-in ram library. The present invention flags any rams that violate parameters specified in the technology file. Specifically, the present invention does the following:<br>Checks inverter sizes and (Wp/Lp)/Wn/Ln) ratios for ram inverter cells<br>Compares the sizes of the pass transistors to the pulldown and pullup sizes of the cross-coupled inverters (this ensures proper noise margins and cross-over currents during port switching in a multi-port cell)<br>The driver and receiver context is ignored for rams, so the ram is printed as follows in the output: (X-RAM.number-X). |
| RAM_Noise | Technology file assertion:<br>    betar: (min, max, tol) RAM<br>Checks for noise by comparing the sizes of the pass transistors to the pulldown and pullup sizes of the cross-coupled inverters (this ensures proper noise margins and cross-over currents during port switching in a multi-port cell). |
| RAM_Offspec | Related technology file parameters:<br>ram_mode, ram_ratio_npd_nps, ram_ratio_ppu_nps<br>Checks inverter sizes and ((Wp/Wl)/Wn/Ln) ratios for RAM inverter cells. |
| Tristate | Related technology file parameters: betar: (min, max, tol) S.TS<br>Identifies tristate structures in the circuit design and verifies whether they have holding latches. The present invention also checks for exclusivity between enable signals. The present invention compares tristates in the design with the tristates in its built-in library. To list non-complementary enable signals, use the -list tristate option.<br>Example report:<br>MC:TRISTATE: Tristate driver nodes checks:<br>No holding latch at node: OUT<br>Non-exclusive enables XTOP.X0.EN2B XTOP.EN2 at node:    OUT<br>Non-exclusive enables XTOP.X0.EN1B XTOP.EN1 at node:    OUT<br>Non-exclusive enables XTOP.X0.EN0B XTOP EN0 at node:    OUT<br>Explanation:<br>This report shows that there is no holding latch at node OUT and that three enable signals at node OUT are not exclusive. |
| NOISE | Related technology file assertions:<br>    betar: (min, max, tol) context<br>    betar_path: (min, max, tol) context<br>Checks that the following structures do not exceed the static noise margin range specified in the technology file:<br>  static complementary<br>  dynamic<br>  latch<br>  mux<br>  tristate inverter<br>  cppl<br>  ram<br>This option allows determination of the allowable noise voltage on the input of a gate so that the output will not be affected. The present invention identifies noise violations by computing beta ratio values for the circuit design and comparing them to the values specified in the technology file.<br>The following are some example circuits and their corresponding technology file assertions.<br>Static complementary<br>The present invention determines a noise violation by dividing the effective width of the pmos transistor by the effective width of nmos transistor |

TABLE 5-continued

Checks

Figure 22:
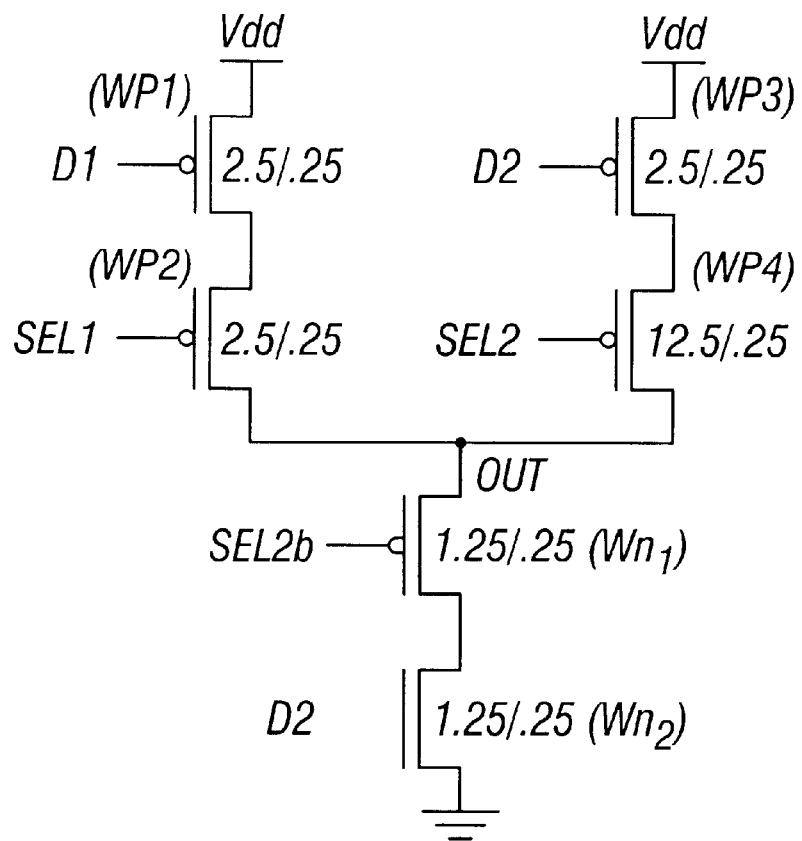

| CHECK | DESCRIPTION |
|---|---|
| | (Wpeff/Wneff) and comparing the resulting value with the min/max values specified in the technology file. The technology file assertion for this noise check is |
| |    betar: (min, max, tol) C |
| | For example, for the static complementary complex logic gate shown in FIG. 16, the present invention determines noise violations as follows: |
| |    If A and B are on |
| |    Wpmax is effective betap, which the present invention gets by merging the series-parallel path: Weff(Wp1, Wp2) in series with Wp3. Wpmin is the minimum of Weff(Wp1, Wp3) or Weff(Wp2, Wp3). For Wnmax, the present invention finds the rmos transistor that is closest to the output node; its corresponding pmos transistor should be the closest to the output. In this case, Wnmax is Wn3. Wnmin = Wnmax. |
| | Transmission gate |
| | For a circuit as shown in FIG. 17, the present invention determines a noise violation by dividing the width of the pmos transistor by the width of the nmos transistor (Wp/Wn) and comparing the resulting value with the min/max values specified in the technology file. The technology file assertion for this noise check is |
| |    betar: (min, max, tol) TG |
| | Nand3 (exemplary circuit depicted in FIG. 18) |
| | The present invention determines a noise violation by dividing the effective width of the pmos transistor by the effective width of the nmos transistor (Wpeff/Wneff) and comparing the resulting value with the min/max values specified in the technology file. The technology file assertion for this noise check is |
| |    betar: (min, max, tol) C.NAND.3 |
| | Nor3 (exemplary circuit depicted in FIG. 19) |
| | The present invention determines a noise violation by dividing the effective width of the pmos transistor by the effective width of the nmos transistor (Wpeff/Wneff) and comparing the resulting value with the min/max values specified in the technology file. The technology file assertion for this noise check is |
| |    betar: (min, max, tol) C.NOR.3 |
| | Dynamic |
| | The present invention determines a noise violation by dividing the effective width of the pmos transistor by the effective width of the nmos transistor (Wpeff/Wneff) and comparing the resulting value with the min/max values specified in the technology file. |
| | Latch |
| | To determine noise violations for latches, the present invention runs a betar_path check. The ratio is calculated based on the driver and the gate under analysis. In the example depicted in FIG. 20, the present invention determines a noise violation by dividing the effective width of the n-block and the pass gate by the width of the p-feedback and comparing the resulting value with the min/max values specified in the technology file. |
| | The following is the acceptable betar_path ratio for a pass gate latch with a p-feedback: |
| |    betar_path: (4.00, 6.00, 0.100) L.S.PFB_PG |
| | In the example depicted in FIG. 21, the present invention determines a noise violation by dividing the effective width of the p-block and the pass gate by the width of the n-feedback: |
| | The following is the acceptable betar_path ratio for a transmission gate latch with a p-feedback: |
| |    betar_path: (4.00, 6.00, 0.100) L.S.PFB_TG |
| | Full Latch |
| | When a transmission or pass gate full latch is the gate under analysis, the default noise check is calculated by Wnpd/Wpfb (width of the n-pulldown divided by the width of the p-feedback). The betar_path ratio of the p-driver path for the n-feedback can be found using the following in the assertion: |
| |    L.S.FBINV_TG.N |
| | If L.S.FBINV_TG.N is the gate under analysis, noise is calculated by Wpu/Wnfb (width of the pullup divided by the width of the n-feedback). |
| | Transmission gate mux |
| | The present invention determines a noise violation by dividing the effective width of the pmos transistor by the effective width of the nmos transistor (Wpeff/Wneff) and comparing the resulting value with the min/max values specified in the technology file. The technology file assertion for this noise check is |
| |    betar: (min, max, tol) S.M.2 |
| | For the example structure depicted in FIG. 22, the present invention figures the beta ratios as follows: |
| | Wpmax = Weff of WP3 and WP4 |
| | Wpmin = Weff of WP1 and WP2 |

TABLE 5-continued

Checks

Figure 23:
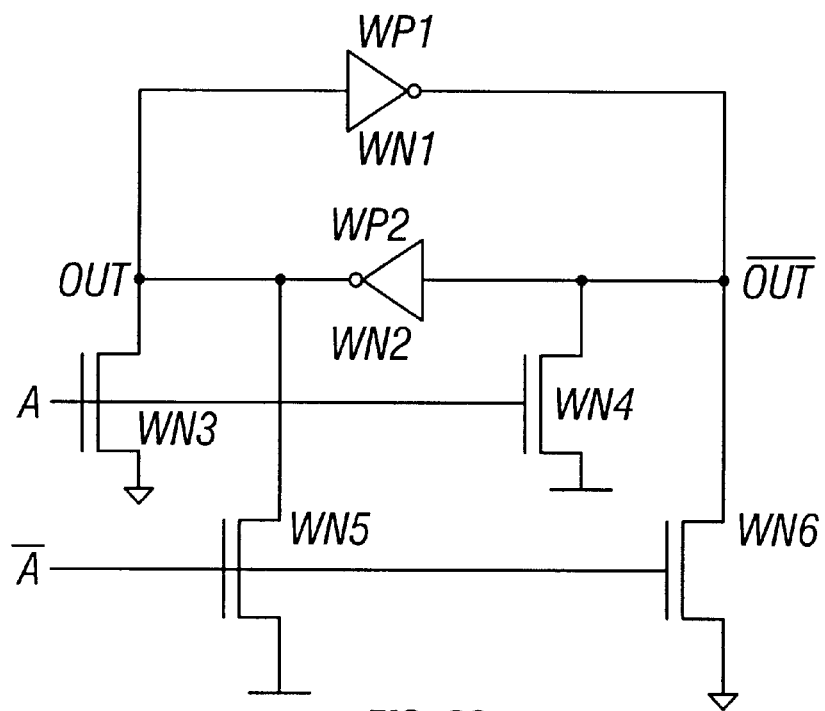
Figure 24:
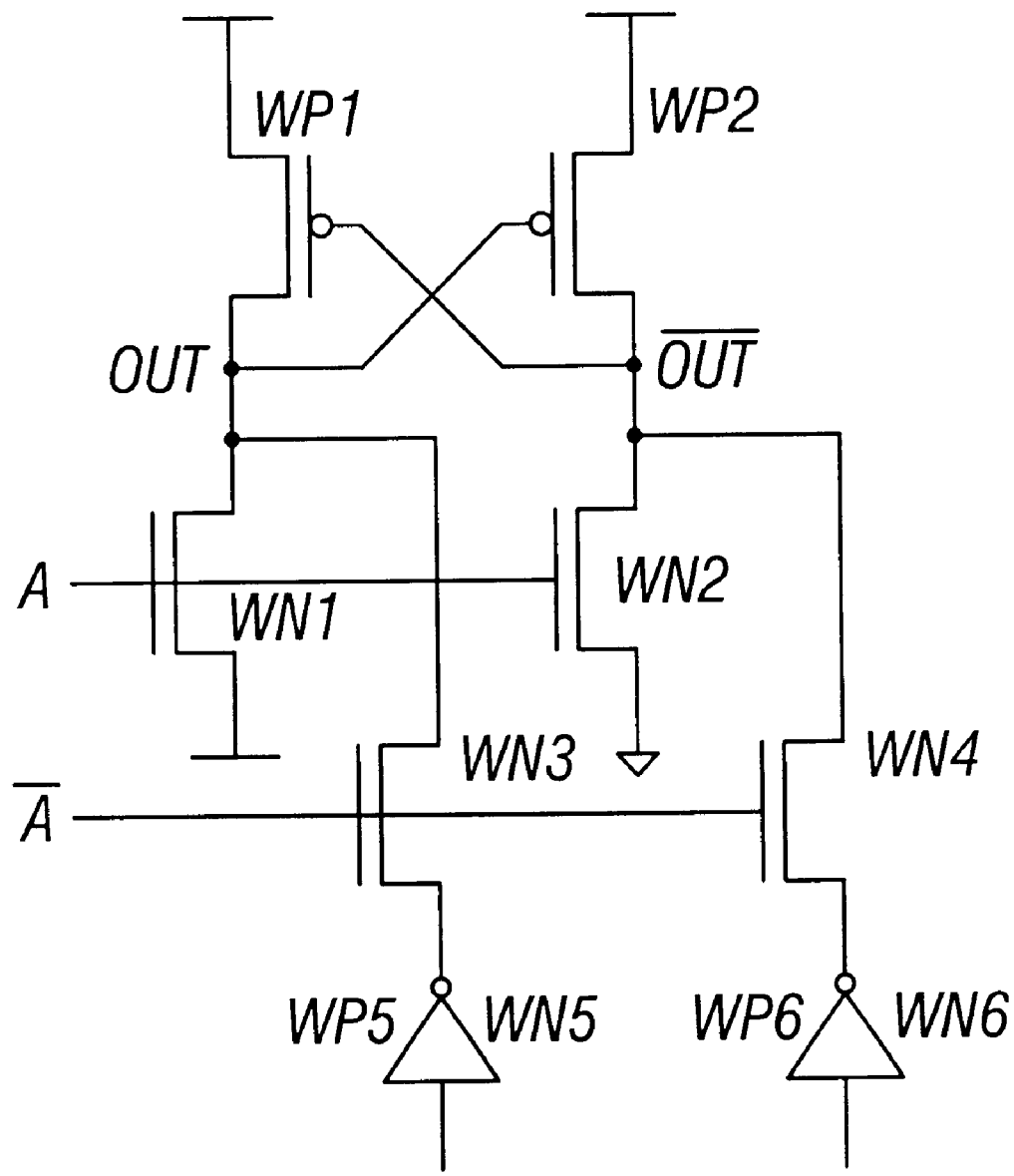

| CHECK | DESCRIPTION |
|---|---|
| | Wnmax = Weff of Wn1 and Wn2, which in this case is equal to Wnmin |
| | Cppl (cascode push pull logic) |
| | The present invention determines a noise violation by dividing the effective width of the pmos transistor by the effective width of the nmos transistor (Wpeff/Wneff) and comparing the resulting value with the min/max values specified in the technology file. |
| | For a CAS.CPPL, the technology file assertion for this noise check is |
| |    betar: (min, max, tol) CAS.CPPL |
| | For the exemplary structure shown in FIG. 23, the present invention figures the beta ratios as follows: |
| |    WP1/Wn1 and WP2/Wn2 |
| | For a CAS.CPPL.TINV, the technology file assertion for this noise check is |
| |    betar: (min, max, tol) CAS.CPPL.TINV |
| | For a CAS.CPPL.PN, the technology file assertion for this noise check is |
| |    betar: (min, max, tol) CAS.CPPL.PN |
| | For the exemplary structure shown in FIG. 24, the present invention figures the beta ratios as follows: |
| |    WP1/Weff(Wn3 + Wn5) and WP2/Weff(Wn4 + Wn6) |
| | Ram |
| | The present invention compares the sizes of the pass transistors to the pulldown and pullup sizes of the cross-coupled inverters (this ensures proper noise margins and cross-over currents during port switching in a multi-port cell). |
| | The related technology file assertion for this noise check is |
| |    betar: (min, max, tol) RAM |
| | The driver and receiver context is ignored for rams, so the ram is printed as follows in The present invention output: (X-RAM.number-X). |
| | Example report: |
| | MC:NOISE: Circuit structures with low noise margins |
| |   #Constrained Noise Specs |
| |   #betar: (0.50, 4.00, 0.100) * |
| |   #betar: (0.50, 4.00, 0.100) C |
| |   #betar: (0.01, 4.00, 0.100) C.INV |
| |   #betar: (1.00, 4.00, 0.100) (C.INV-C.NAND-L.S.FBINV_TG) |
| |   #betar: (1.00, 4.00, 0.100) C.NOR |
| |   #betar: (4.00, 6.00, 0.100) S.M |
| |   #betar: (0.50, 1.00, 0.100) L.S.FBINV_TG |
| |   #betar: (0.75, 1.00, 0.100) L.S.FBINV_PG |
| |   #betar: (0.75, 1.00, 0.100) L.S.PFB_PG |
| |   #betar: (0.20, 0.50, 0.100) RAM_INV |
| |   #betar: (1.00, 2.00, 0.100) TG |
| |   #betar_path: (4.00, 6.00, 0.100) PFB |
| |   #betar_path: (4.00, 6.00, 0.100) L.S.FBINV_TG |
| |   #betar_path: (4.00, 6.00, 0.100) L.S.FBINV_PG |
| |  #BetaType BetaMax BetaMin WpMax WpMin WnMax WnMin Context Nodename |
| |  betar 6.000 6.000 18.171 18.171 3.029 3.029 (X-C.INV-C.NAND.04) A |
| |  betar 2.000 0.789 18.171 7.171 9.086 9.086 (C.INV-C.NAND.04-L.S.FBINV_TG) Z |
| |  betarpath 0.556 0.556 1.800 1.800 1.000 1.000 (C.INV-L.S.FBINV_TG-C.INV) G1 |
| |  betar 20.000 0.350 9.000 0.900 2.571 0.450 (C.INV-S.M.02-C.INV) MUXNODE |
| | Explanation: |
| | In this report, node A violates beta ratio: betar: (0.01, 4.00, 0.100) C.INV. |
| | Z violates betar: (1.00, 4.00, 0.100) (C.INV-C.NAND-L.S.FBINV_TG). |
| | G1 violates betar_path: (4.00, 6.00, 0.100) L.S.FBINV_TG. |
| | Muxnode violates betar: (4.00, 6.00, 0.100) S.M. |
| TOPOLOGY | Related technology file parameters: |
| |    nstack_height, pstack_height nstack_taper, pstack_taper, nstack_width, pstack_width, weak_nodes, connect |
| | Technology file assertions: |
| |    nstack_height: integer context |
| |    nstack_height: integer~ context |
| |    nstack_height: ~interger context |
| |    nstack_height: (min_integer..max_integer) context |
| |    pstack_height: integer context |
| |    pstack_height: integer~ context |
| |    pstack_height: ~integer context |
| |    pstack_height: (min_integer..max_integer) context |
| |    nstack_taper: (min, max, tol) context |
| |    pstack_taper: (min, max, tol) context |
| |    nstack_width: integer context |
| |    nstack_width: integer~ context |

TABLE 5-continued

Checks

| CHECK | DESCRIPTION |
|---|---|
| | nstack_width: ~integer context |
| | nstack_width: (min_integer..max_integer) context |
| | pstack_width: integer context |
| | pstack_width: integer~ context |
| | pstack_width: ~integer context |
| | pstack_width: (min_integer..max_integer) context |
| | connect: error context |
| | connect: warn context |
| | connect: ignore context |
| | weak_nodes: error context |
| | weak_nodes: warn context |
| | weak_nodes: ignore context |
| | Check several critical electrical circuit rules to ensure that the circuit design complies with both standard circuit rules and design/project specific rules. Running -do topology is equivalent to running all of the following: |
| |   -do stacks → checks stack parameters, consisting of the following checks |
| |     -do nstack_height, -do pstack_height, -do nstack_taper, |
| |     -do pstack_taper, -do nstack_width, -do pstack_width |
| |   -do storage → identifies storage nodes that are outside of storage structures |
| |   -do no_depath → identifies circuits without a DC path to power or ground |
| |   -do no_connect → checks for unconnected devices |
| |   -do weak → identifies circuits with weak logic levels |
| |   -do connect → checks connectivity |
| Connect | Related technology file assertions: |
| |   connect: error context |
| |   connect: warn context |
| |   connect: ignore context |
| | Runs a connectivity check on the circuit structures in the circuit design. |
| | Example report: |
| | MC:CONNECT: Circuit structures violating specified connectivity constraints: |
| |   # Connect Specs |
| |   # connect: ignore* |
| |   # connect: error(*-D-D) |
| |   # Status    Constraint  Context                           Nodename |
| |   ERROR     (*-D-D)     (PRI.INPUT-D.NPD-NPD.NAND.03)    NET289 |
| |                                                                  NET289->(D) |
| | Connectivity on mux select lines can be verified using the S.M.TG.SEL.# and S.M.PG.SEL.# assertions. For example, to verify that a dynamic structure is driving a mux select line, use the following assertion in the technology file: |
| |   connect: warn (D-S.M.TG.SEL.2-*). |
| No_Connect | Related technology file parameters: none |
| | Checks for circuit structures that have dangling or unconnected nodes. This option flags the following: |
| |   A node that is not connected to any transistors, often this is a dangling capacitor |
| |   A primary input or output that is not at the top level of the design hierarchy |
| |   A primary input or output attached only to a pass gate |
| |   A primary input or output attached only to a transfer gate |
| |   An unconnected drain on a PPU, PPD, NPU, or NPD transistor |
| | Example report: |
| | MC NO_CONNECT: Circuit structures with unconnected signals: |
| | #Ctot(ff)    Cgate    Cwire    Cdiff    Ccoup    Failure-Type  Nodename |
| | 0.000        0.000    0.000    0.000    0.000    PG-Input      D |
| |                                                                                D->(D) |
| | 10.000      10.000   0.000    0.000    0.000    PG-Input      IN3 |
| |                                                                                Port IN3->(D) |
| | Explanation: |
| | In this report, a primary input, D, is attached only to a pass gate. |
| | The failures listed under the failure-type heading may include: |
| |   Abbreviation → Meaning |
| |   No-Trans-Connect → no transistor connections to the node |
| |   Input-below-top → node appears to be an unconnected input that is below the top-level of the hierarchy |
| |   Output-below-top → node appears to be an unconnected output that is below the top-level of the hierarchy |
| |   PG-Input → unconnected pass gate input |
| |   PG-Output → unconnected pass gate output |
| |   TG-Input → unconnected transfer gate input |
| |   TG-Output → unconnected transfer gate output |
| |   Dangling-NPU → node connected to a dangling n-pullup |

TABLE 5-continued

Checks

Figure 25:
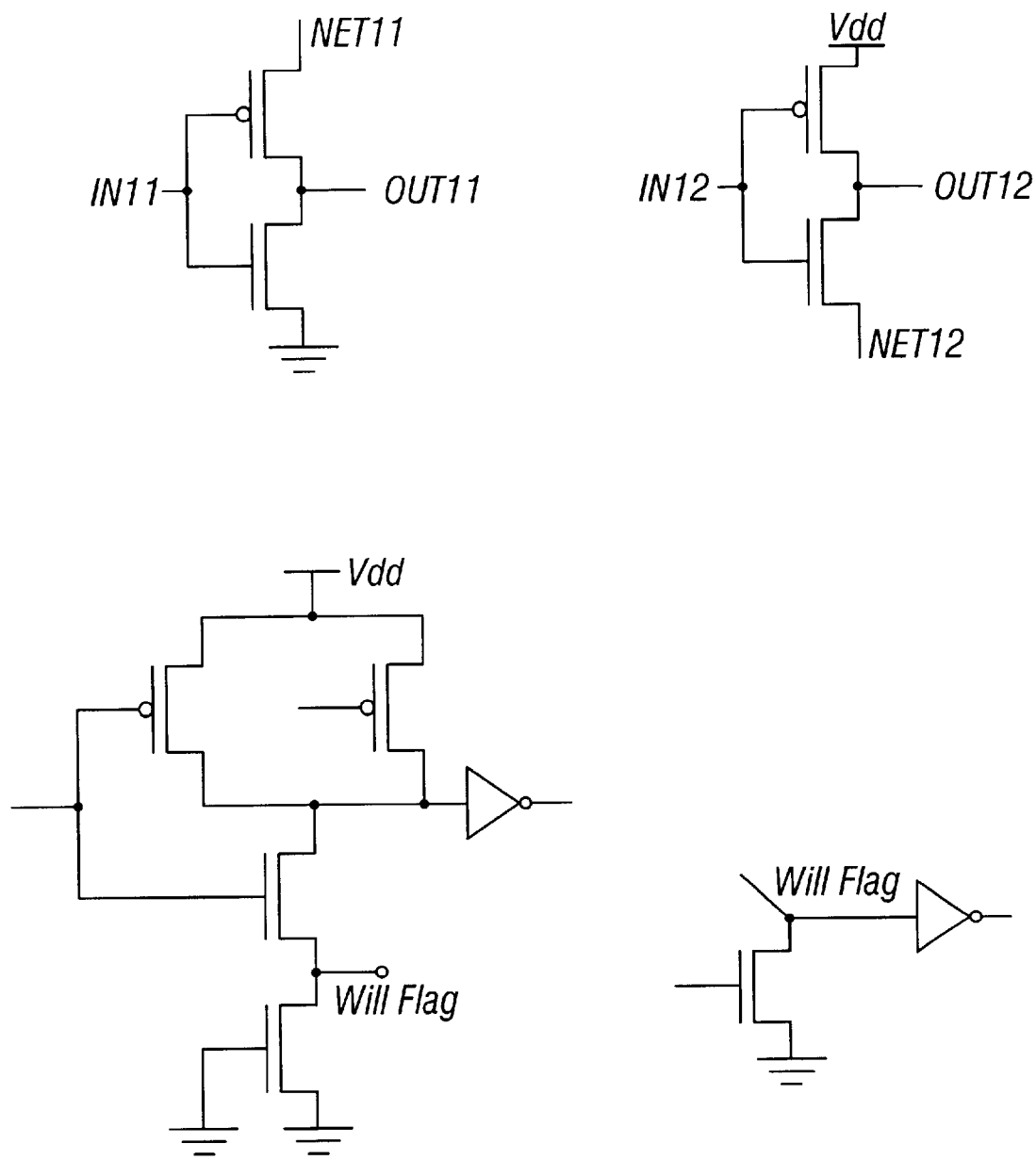
Figure 26:
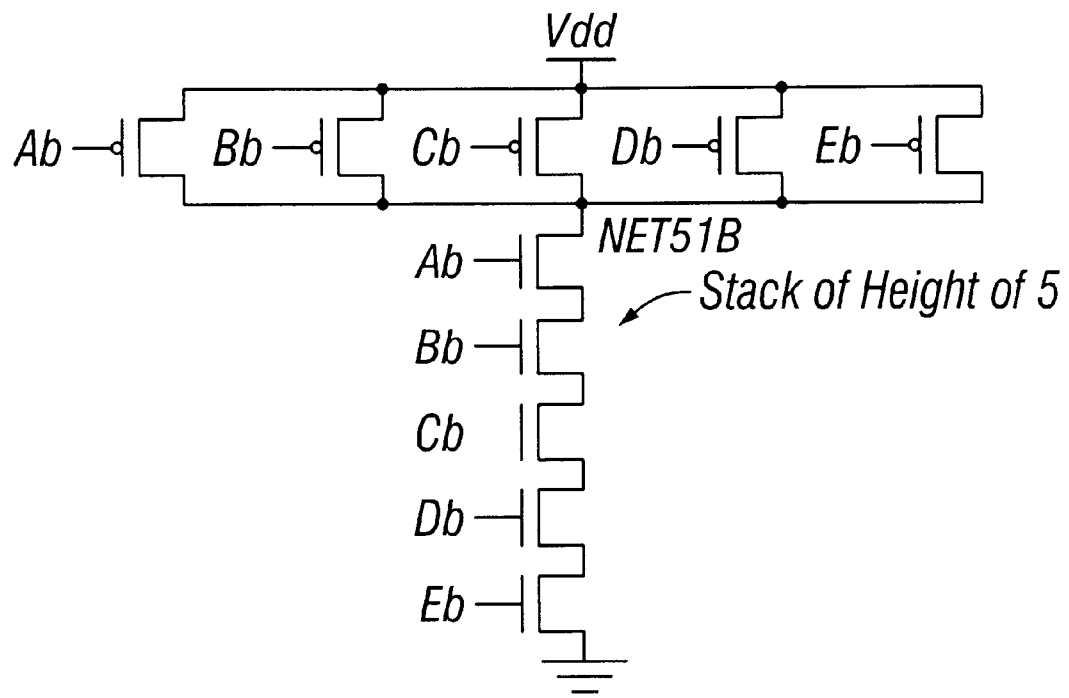
Figure 27:
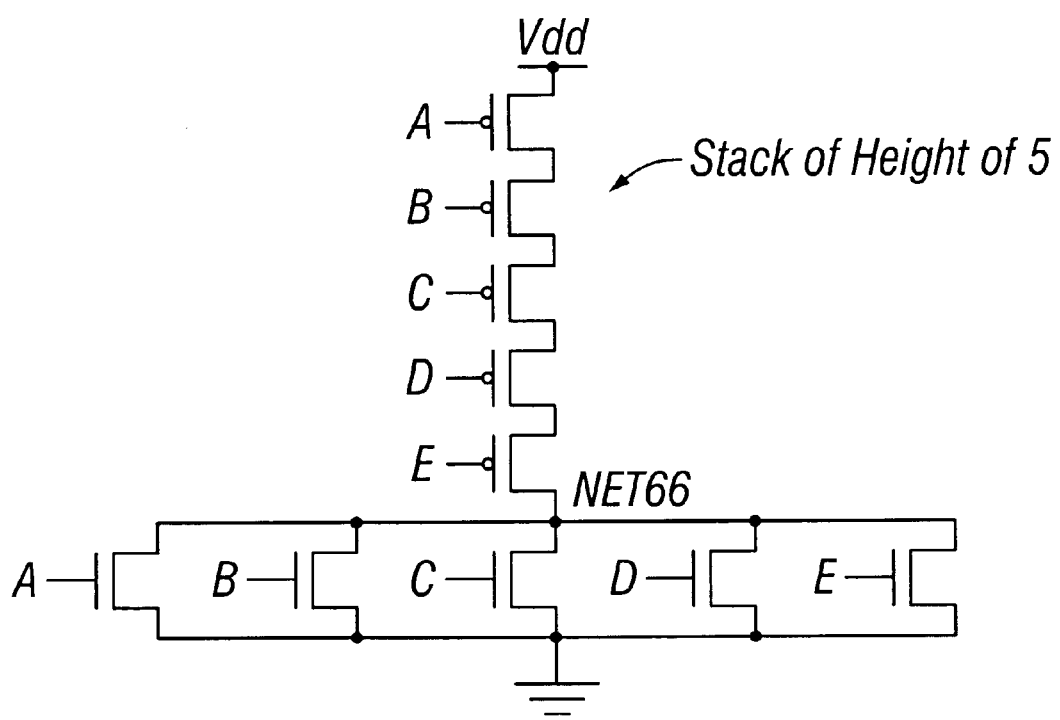
Figure 28:
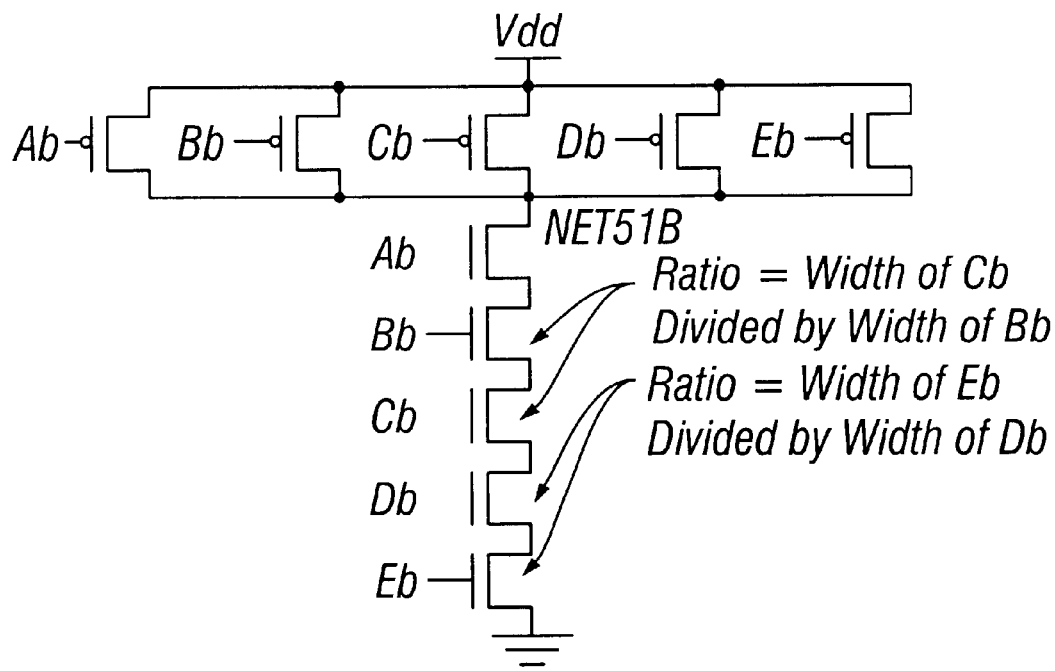

| CHECK | DESCRIPTION |
|---|---|
| | Dangling-NPD → node connected to a dangling n-pulldown<br>Dangling-PPU → node connected to a dangling p-pullup<br>Dangling-PPD → node connected to a dangling p-pulldown<br>Dangling-Drain → node connected to a dangling transistor (no specifics known) |
| No_DCPath | Related technology file parameters: none<br>Checks for circuit structures, such as those shown in FIG. 25, that do not have a path to ground and power.<br>Example report:<br>MC: NO_DCPATH: Circuit structures with no DC path to ground or power:<br>#Ctot(ff)   Cgate   Cwire   Cdiff   Ccoup   Nodename<br>0.000       0.000   0.000   0.000   0.000   NET12 |
| Stack | Performs checks on logic stacks for both N-stacks and P-stacks. Running -do stacks is equivalent to running all of the following:<br>   -do nstack_height<br>   -do pstack_height<br>   -do nstack_taper<br>   -do pstack_taper<br>   -do nstack_width<br>   -do pstack_width<br>The stack height checks may not apply to cascode cppl structures because they are fixed structures. |
| Nstack_Height | Related technology file assertions:<br>   nstack_height  :   integer context<br>   nstack_height  :   integer context<br>   nstack_height  :   ~integer context<br>   nstack_height  :   (min_integer..max_integer) context<br>Checks for circuit structures (for example, the structure depicted in FIG. 26) that violate the specified N-stack height range. This is useful in limiting the body effect on the threshold voltage.<br>Example report:<br>MC:NSTACK_HEIGHT: Circuit structures violating the specified N stack height range<br>  #    Stack Height Specs<br>  #    nstack_height: (1.. 4) *<br>  #    nstack_height: (1.. 3) C<br>  #    nstack_height: (1.. 4) D<br>    #Depth   Context                    Nodename<br>    4         (C.INV-C.NAND.05-C.INV)  NET51B<br>Explanation:<br>The technology file specifies a maximum N-stack height of 3 for complementary structures and 4 for dynamic structures. NET51B violates the limit for complementary structures. |
| Pstack_Height | Technology file assertions:<br>   pstack_height: integer context<br>   pstack_height: ~integer context<br>   pstack_height: (min_integer..max_integer) context<br>Checks for circuit structures (for example, the structure shown in FIG. 27) that violate the specified P-stack height range. This is useful for limiting the body effect on the threshold voltage.<br>Example report:<br>MC:PSTACK_HEIGHT: Circuit structures violating the specified P stack height range<br>#Stack Height Specs<br>#pstack_height: (1.. 4) *<br>#pstack_height: (1.. 4) C<br>#Depth         Context              Nodename<br>5              (X-C.NOR.05-X)      NET66<br>Explanation:<br>The technology file specifies a maximum P-stack height of 4 for complementary structures. With a stack height of 5, NET66 violates this limit. |
| Nstack_Taper | Technology file assertion:<br>    nstack_taper: (min, max, tol) context<br>Compares adjacent transistor size ratio from ground to output node and flags violations of the taper assertion. For example, the structure depicted in FIG. 28.<br>Example report:<br>MC:NSTACK_TAPER_RATIO: Circuit structures violating the specified N stack taper ratio range<br>  #Stack Taper Specs<br>  #nstack_taper: (1.00, 1.50, 0.001) *<br>  #MaxTaper   MinTaper   Height   Context                 Nodename<br>  1.00          0.50         5       (X-C.NAND.05-D.NPD)  NET51B<br>Explanation: |

TABLE 5-continued

Checks

Figure 29:
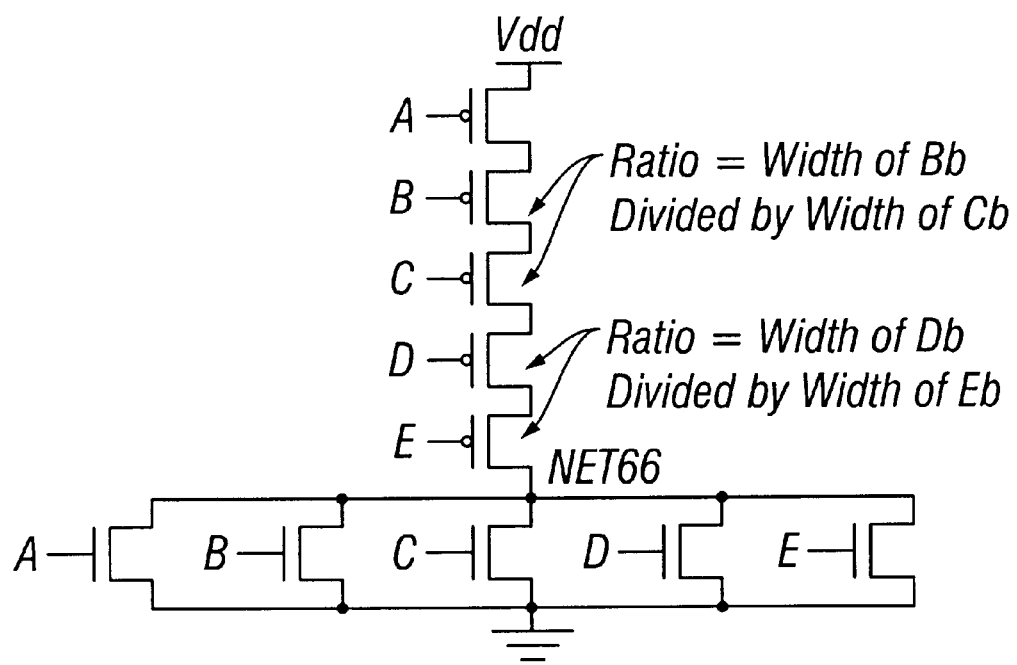
Figure 30:
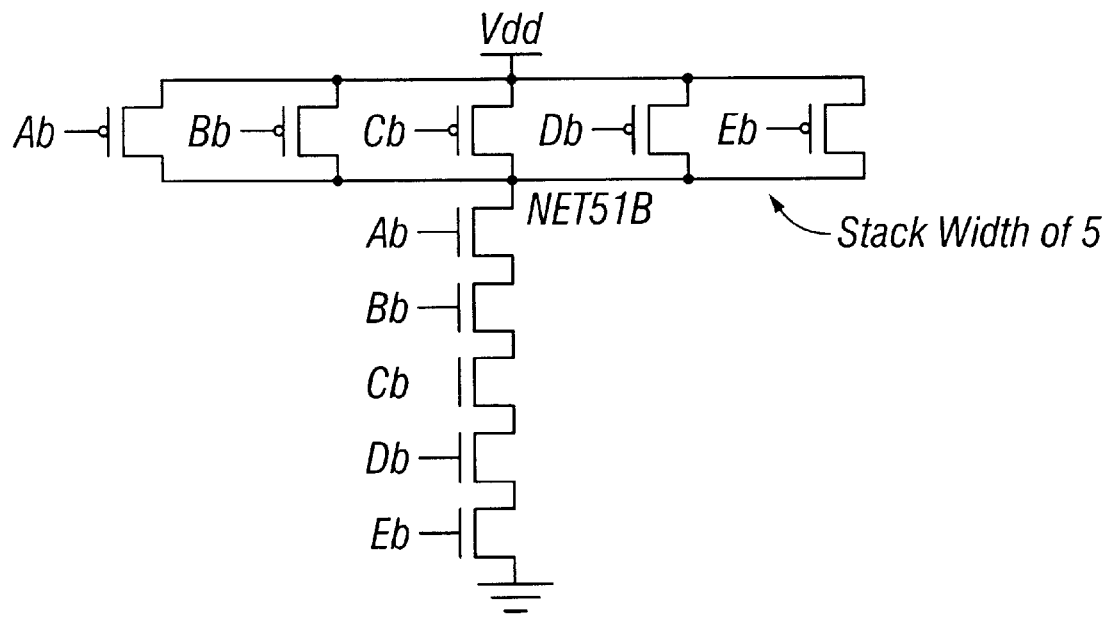
Figure 31:
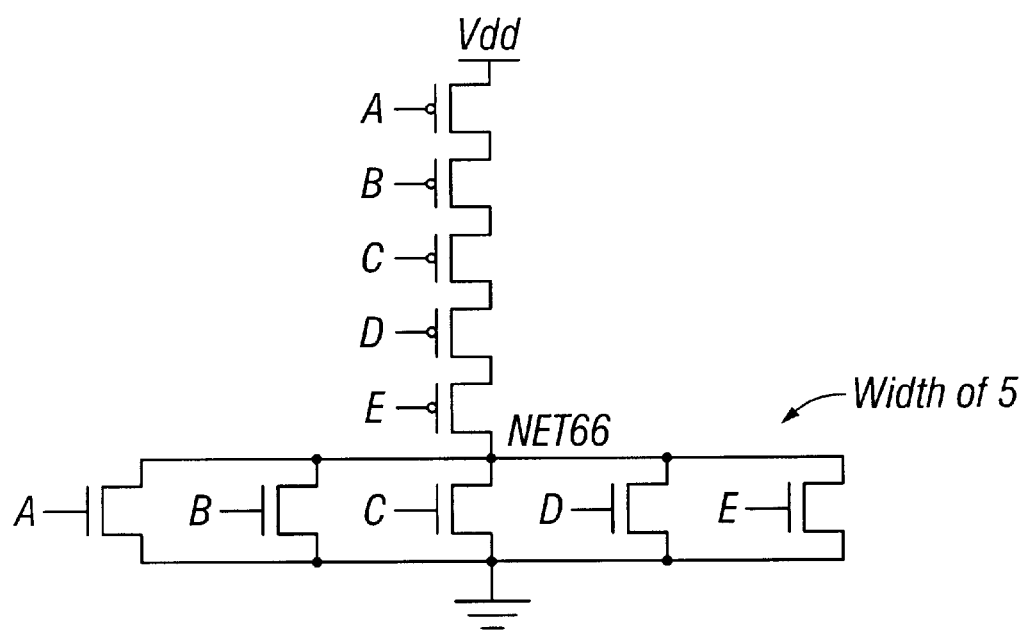
Figure 32:
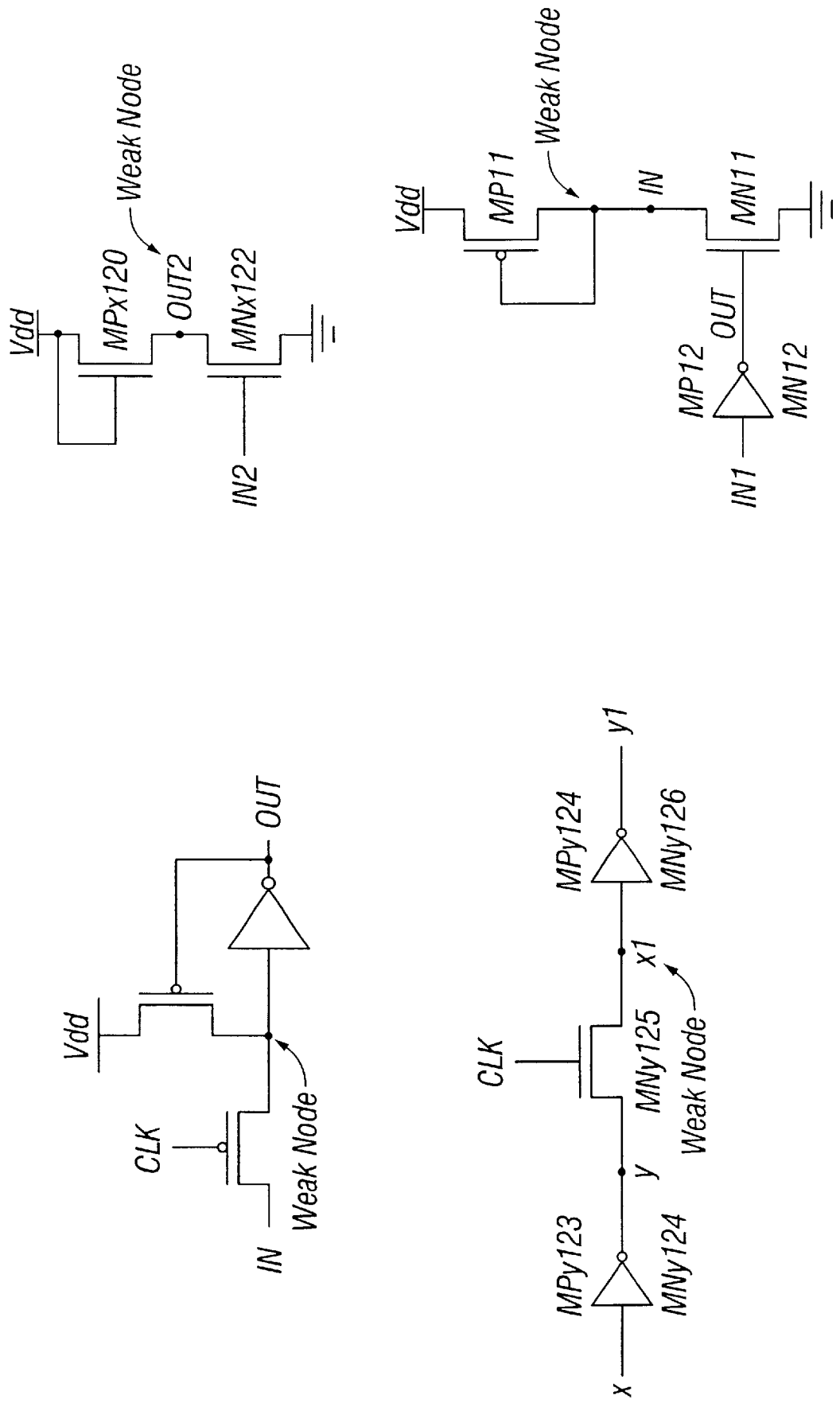

| CHECK | DESCRIPTION |
|---|---|
| | This report identifies NET51B as violating the minimum N-stack taper ratio of 1.50. |
| Pstack_Taper | Technology file assertion:<br>   pstack_taper: (min, max, tol) context<br>Compares adjacent transistor size ratio from ground to output node and flags violations of the taper assertion (for example, for the structure shown in FIG. 29)<br>Example report:<br>MC:PSTACK_TAPER_RATIO: Circuit structures violating the specified P stack taper ratio range<br>  #Stack Taper Specs<br>  #pstack_taper: (1.10, 1.50, 0.001) *<br>  #MaxTaper  MinTaper  Height  Context            Nodename<br>  1.00         1.00         5        (X-C.NOR.05-X)   NET66<br>Explanation:<br>This report identifies NET66 as violating the minimum P-stack taper ratio of 1.50. |
| Nstack_Width | Technology file assertions:<br>   nstack_width: integer context<br>   nstack_width: integer~ context<br>   nstack_width: ~integer context<br>   nstack_width: (min_integer..max_integer) context<br>Checks for circuit structures (for example, the structure depicted in FIG. 30) that violate the specified N-stack width range.<br>Example report:<br>MC:NSTACK_WIDTH: Circuit structures violating the specified N stack width range<br>  #Stack Width Specs<br>  #nstack_width: ~2*<br>  #Width   Context            Nodename<br>  5        (X-C.NAND.05-X)   NET51B<br>Explanation:<br>This report identifies NET51B as violating the N-stack width limit of 2. |
| Pstack_Width | Technology file assertions:<br>   pstack_width: integer context<br>   pstack_width: integer~ context<br>   pstack_width: ~integer context<br>   pstack_width: (min_integer..max_integer) context<br>Checks for circuit structures (for example, the structure shown in FIG. 31) that violate the specified P-stack width range.<br>Example report:<br>MC:PSTACK_WIDTH: Circuit structures violating the specified P stack width range<br>  #Stack Width Specs<br>  #pstack_width: ~2*<br>  #pstack_width: ~8 (C.INV-*-L)<br>  #pstack_width: ~8 (X-*-*)<br>  #Width   Context                Nodename<br>  8        (C.INV-C.NOR.05-C.INV)   NET66<br>Explanation:<br>This report identifies NET66 as violating the P-stack width limit of 2. |
| Storage | Identifies floating storage nodes. The present invention defines a floating storage node as a node of a feedback inverter that does not belong to a storage structure such as a ram, latch, or cascode.<br>Example report:<br>MC:STORAGE: Storage nodes found outside of storage structures<br>#Type   NodeName<br>C.INV   SUM<br>C.INV   SUMN<br>PFB     XADDL_SSELSUB.12<br>PFB     XADDL_SSELSUB.19<br>If the -skip rams or -skip latches options are used, the -do storage option flags latches and rams as floating storage nodes. Also note that keeper structures are currently identified as floating storage nodes. |
| Weak | Technology file assertions:<br>    weak_nodes:   error context<br>    weak_nodes:   warn context<br>    weak_nodes:   ignore context<br>Identifies circuit structures and devices with weak logic levels. See FIG. 32 for examples.<br>Example report:<br>MC:WEAK_NODES: Circuit nodes with weak logic levels:<br>#Weak Node Specs<br>#weak_nodes: error *<br>#Status   Context            Outputname   Nodename |

TABLE 5-continued

Checks

| CHECK | DESCRIPTION |
|---|---|
| | ERROR (X-C.INV-X) OUT[108] N2[108] |
| | ERROR (X-C.INV-X) M5 L5 |
| | ERROR (X-C.INV-X) G5 F5 |
| | ERROR (X-C.INV-X) G2 F2 |
| | ERROR (X-C.INV-X) H G |
| VT | Technology file parameters: vt_class |
| | Checks for voltage threshold violations by verifying the class of the |
| | transistors. The vt check does not apply to storage elements (latches, rams, |
| | keepers, nfb_[tg, pg], pfb_[tg, pg]). |
| | The following is an example of an assertion that performs a vt check. It |
| | verifies whether transmission gate muxes use transistors with the model name |
| | TNX. |
| | vt_class: 2 (c.inv - s.m.tg - *) |
| | Each transistor has the associated model name for the vt class in the Spice |
| | netlist. |
| | For example the techfile parameter |
| | n_modelname(1) NMOS1 |
| | would be associated with vtn(1) 0.250 |
| | Example report: |
| | MC:VT: Circuit structures with vt violations |
| | #Constrained Vt Check Specs |
| | #vt_class: 1 * |
| | #Vt Context Nodename |
| | 2 (RAM.02-RAM.02-C.INV) X |
| | 2 (RAM.02-RAM.02-PG.01) X |
| | 2 (RAM.02-RAM.02-C.INV) Y |
| | 2 (RAM.02-RAM.02-PG.01) Y |
| | Explanation: |
| | This report flags nodes X and Y because they are constructed with vt 2 |
| | transistors rather than vt 1 transistors, as specified in the technology file |
| | (vt_class: 1 *). |
| User customized | Checks defined by the users. These may be based on checks provided by the |
| | present invention, or may include new checks provided/configured by the user |
| | using API module 122 (see FIG. 5). |

Several options may also be used to customize the manner in which the present invention performs the analysis checks. According to an embodiment of the present invention, the options include: -estcaps, -exclusive, -keep, -merge, -merge_stacks, -names, -path_spi, -skip, -tedge, and -usehierinfo options. Table 6 (located at the end of this section) provides further information on the options according to an embodiment of the present invention. It should be apparent that other options may also be used by the present invention.

TABLE 6

Options for customizing checks (of Table 5)

| OPTION | DESCRIPTION |
|---|---|
| -estcaps | Calculates diffusion capacitance. Used during pre-layout analysis to ensure correct results. |
| -exclusive | Analyzes every logic tree connected to select lines for exclusivity. May be used for muxes, cascode cppls, tristates, etc. |
| | Muxes |
| | The present invention traces back the connected logic trees to verify the following: |
| | That only one input to the mux is on. If this is not the case, the present invention classifies the mux as unknown. |
| | For transmission gate muxes, the present invention checks that the select line pairs for each transmission gate are complementary and then determines exclusivity on all the select line pairs. |
| | For pass gate muxes, the present invention checks that select lines are exclusive. |
| | If the -exclusive option is not specified, the present invention classifies a mux as a mux, but does not run these checks. |
| | Cppl |
| | The present invention traces back the logic trees connected to the push-pull inputs of the cppl to determine whether the cppl is exclusive and complementary; the present invention also checks the side inputs of the cppl to determine if they are complementary. If the -exclusive option is not specified, the present invention classifies a cppl as a cppl, but does not run these checks. |
| | Tristate |
| | The present invention checks whether enable and enablebar signals are complementary. If they are, the present invention qualifies the structure as a tristate. |

TABLE 6-continued

Options for customizing checks (of Table 5)

| OPTION | DESCRIPTION |
|---|---|
| -keep | Preserves the order of drain, gate, and source terminals in the input file. |
| -merge | Merges parallel transistors (src=src, drn=drn, gat=gat, type=type, independent of width and length). |
| -merge_stacks | Merges both parallel transistors and transistor stacks. Stacks within stacks are not merged. |
| -names | Enables the present invention to recognize proprietary structures defined by the user in a "names file." A names file is typically a text file in which a user can assign a name to the subcircuit and define subcircuit input and output relationships as well as internal node names. All names defined in a names file are case-insensitive. Comments are indicated with a double backslash (//); all text following the comment string for the remainder of the line is a comment. According to one convention, the file is called "file.nam", where file is the base name of the corresponding Spice input file.<br>Example names file:<br>The following names file, called "mynames.nam" defines a group (or class) of subcircuits called CLASS_1. Within this group, there is one named subcircuit called SUB_1. (Note that you can have multiple names within a group.) Subcircuits recognized as CLASS_1 must have an output named Out1 and an input named In1:<br>  subckt<br>  CLASS_1(SUB_1)<br>    {<br>      output invout: Out1;<br>      input invin: In1;<br>    }<br>  where<br>  CLASS-group name of subcircuit<br>  SUB_1-name recognized in this group<br>  Section between the braces-subcircuit node names<br>When this example file is used, the present invention recognizes the structures defined in the file; and they are no longer classified as unknown.<br>For example, if you run the present invention with this names file and use the -list names option, the output lists the subcircuits that match the definition in the names file:<br>MC:NAMES-Names File Listing with Identified Matches<br>  # Subcircuit Name Matches: 1<br>  # Subcircuit  Subcircuit Name Group<br>  SUB_1      CLASS_1<br>  # Subcircuit Name Group Count: 1<br>    # Node name matches for subcircuit group CLASS_1:2<br>    # Subcircuit Node Name  Subcircuit Node Name Group<br>      Out1                     0 INVOUT<br>      In1                      I INVIN<br>    #Node name groups defined for subcircuit group CLASS_1:2<br>    #Subcircuit Node Name Group<br>      Out INVOUT<br>      #Actual Matching Subcircuit Nodes: 1<br>      #Nno  Instance  Subckt  Port-Name  Type      Node-Name<br>      1539    X5        SUB_1   O1          C.INV     X3.N100<br>      1537    X70      SUB_1   O1          C.INV     X3.N102<br>      1536    X69      SUB_1   O1          C.INV     X3.N103 . . . |
| -path_spi | Extracts a path or a portion of the design, so that a detailed analysis of it can be performed (for example, using HSpice). When the -path_spi option is used, a command file that specifies the nodes of interested is used. The pathinfo command in the command file may be used to specify the nodes.<br>The present invention outputs the minimum set of transistors that are associated with the nodes listed in the command file. For example, if a listed node is the output of a logic gate, the present invention extracts the entire gate. If the input nodes to this gate are not listed in the command file, the present invention applies a default stimulus by instantiating a voltage source. If the listed node drives other gates whose output nodes are not in the command file, the present invention terminates the gates with a capacitance equal to the gate capacitance.<br>With pass and transmission gates, the present invention traverses up to 10 levels of pass gates and transmission gates searching for a node in the pathinfo list. If the present invention finds a specified node, it extracts the pass gates and transmission gates and applies voltages to ensure that the gates are on or conducting current. The present invention traverses through the drain/source and gate terminals.<br>Example command files:<br>The following command file gives a list of nodes:<br>  -pathinfo(MY_FIRST_PATR) {<br>    (A)<br>    (O1)<br>    (O4)<br>    (out)<br>  }<br>The following command file defines stimulus (E1) as a piecewise linear function. The stimulus can be applied to any of the nodes in the list.<br>  pathinfo(PATH_TEST1) { |

TABLE 6-continued

Options for customizing checks (of Table 5)

| OPTION | DESCRIPTION |
|---|---|
| | E1 = "pwl"<br>(A = E1)<br>(X2.2)<br>(X2.10)<br>(DATA2)<br>(X4.I1)<br>(X4.I2)<br>(OUT)<br>}<br>The output using this command file would be as follows:<br>  DESIGN "PATH_TEST1"<br>  GLOBAL VDD VSS<br>  MX2.X1.MP_1 X2.2 A VDD VDD PMOS L=0.25 U W=1.00 U<br>  MX2.X1.MN_1 X2.2 A VSS VSS NMOS L=0.25 U W=1.00 U<br>  CX2.2 X2.2 VSS 2.00 F<br>  MX2.X7.MP1 X2.9 CB3 X2.4 VDD PMOS L=0.25 U W=10.00 U<br>  CX2.9 X2.9 VSS 9.000 F<br>  MX2.X7.MN1 X2.9 C3 X2.4 VSS NMOS L=0.25 U W=10.00 U<br>  MX2.X4.MN1 X2.4 X2.2 X2.3 VSS NMOS L=0.25 U W=1.00 U<br>  CX2.4 X2.4 VSS 4.000 F<br>  MX2.X8.MP_1 X2.10 X2.6 VDD VDD PMOS L=0.25 U W=10.00 U<br>  MX2.X8.MP_2 X2.10 X2.9 VDD VDD PMOS L=0.25 U W=10.00 U<br>  MX2.X8.MN_1 X2.10 X2.9 X2.X8.A1 VSS NMOS L=0.25 U W=10.00 U<br>  MX2.X8.MN_2 X2.X8.A1 X2.6 VSS VSS NMOS L=0.25 U W=10.00 U<br>  CX2.10 X2.10 VSS 10.00 F<br>  MX2.X13.MN1 X2.14 C6 X2.13 VSS NMOS L=0.25 U W=1.00 U<br>  CX2.14 X2.14 VSS 14.000 F<br>  MX2.X12.MN1 X2.13 C5 X2.12 VSS NMOS L=0.25 U W=1.00 U<br>  CX2.13 X2.13 VSS 13.000 F<br>  MX2.X11.MN1 X2.12 C4 X2.11 VSS NMOS L=0.25 U W=1.00 U<br>  CX2.12 X2.12 VSS 12.000 F<br>  MX2.X10.MP1 X2.11 X2.10 X2.8 VSS PMOS L=0.25 U W=1.00 U<br>  CX2.11 X2.11 VSS 11.000 F<br>  MX2.X14.MP_1 DATA2 X2.14 VDD VDD PMOS L=0.25 U W=1.00 U<br>  MX2.X14.MN_1 DATA2 X2.14 VSS VSS NMOS L=0.25 U W=1.00 U<br>  MX4.MP1 X4.I1 DATA2 VDD VDD PMOS L=0.25 U W=1.00 U<br>  MX4.MP2 OUT EN_X4.I1 VDD PMOS L=0.25 U W=1.00 U<br>  MX4.MN1 X4.I2 DATA2 VSS VSS NMOS L=0.25 U W=1.00 U<br>  MX4.MN2 OUT EN X4.I2 VSS NMOS L=0.25 U W=1.00 U<br>  VEN    EN    VSS    0 * no stimulus using default<br>  VCB3    CB3    VSS    0<br>  VC3    C3    VSS    VDD<br>  VC4    C4    VSS    VDD<br>  VX2.3    X2.3    VSS    0 * no stimulus using default<br>  VC5    C5    VSS    VDD<br>  VC6    C6    VSS    VDD<br>  VEN_    EN_    VSS    0 * no stimulus using default<br>  VX2.6    X2.6    VSS    0 * no stimulus using default<br>  VX2.8    X2.8    VSS    0 * no stimulus using default<br>  VA    A    VSS    PWL |
| -skip | Usage: -skip library element<br>Suppresses checks on the specified structure. For example, if the circuit design has higher-level structures such as latches, rams, muxes, tristates, or cascode cppls that do not match those in the present invention's built-in library, this option can be used to avoid clashes with the corresponding built-in structure.<br>The present invention can check the subcircuits in the skipped structures. For example, even if latches are skipped, assertions may be written to check the inverters, transmission gates, and pass gates in the latch.<br>For example, the following assertion checks the strength of the level restore node. It compares the pulldown stack of the driver, C, with the width of the p-feedback:<br>    betar_path: (4.00, 6.00, 0.100) (C-PFB_PG-*)<br>  where<br>    betar_path-keyword<br>    4.00-minimum value<br>    6.00-maximum value<br>    0.100-tolerance<br>    C-driver<br>    PFB_PG-gate under analysis<br>    *-receiver<br>To perform the same check with the present invention's built-in latches, either of the following assertions may be used:<br>    betar_path: (4.00, 6.00, 0.100) L.S.PFB_PG<br>    betar_path: (4.00, 6.00, 0.100) L.S.PFB_TG<br>The following lists the latch subcircuits which can be checked by writing assertions using the keyword betar_path. |

TABLE 6-continued

Options for customizing checks (of Table 5)

| OPTION | DESCRIPTION | |
|---|---|---|
| | Subcircuit | Subcircuit abbreviation to use in assertion |
| | P-feedback with a pass gate | [L.S.]PFB_PG |
| | P-feedback with a transmission gate | [L.S.]PFB_TG |
| | N-feedback with a pass gate | [L.S.]NFB_PG |
| | N-feedback with a transmission gate | [L.S.]NFB_TG |
| | Back-to-back inverters with a pass gate | [L.S.]FBINV_PG |
| | Back-to-back inverters with transmission gate | [L.S.]FBINV_TG |
| | The following lists latch subcircuits that may be checked by writing assertions using the keyword betar. | |
| | Subcircuit | Subcircuit abbreviation to use in assertion |
| | Back-to-back inverters with a pass gate | [L.S.]FBINV_PG |
| | Back-to-back inverters with transmission gate | [L.S.]FBINV_TG |
| -tedge | Usage: -tedge nanosec | |
| | Sets the rising and falling edge rates to the specified nanosec value. | |
| -usehierinfo | Reads primary inputs and outputs from the top-level .subckt line in the netlist. Typically, this option may be used if the present invention does not correctly identify the primary inputs and outputs in the circuit design. | |

Referring back to FIG. 5, circuit design analyzer module 114 performs circuit analysis based on information related to the checks, circuit structures, and assertions associated with the circuit structures. Circuit design analyzer 114 may also access data store 120 to retrieve library/component information, user-specific information, user customized information, and other information which may be used for performing the analysis. The analysis performed by circuit designer analyzer module 114 corresponding to the various checks and the related assertions have been described in Table 5 and Table 6 (see above) for an embodiment of the present invention.

As previously stated, the circuit design analysis techniques provided by the present invention may be performed at the pre-layout stage of the circuit design and/or at the post-layout stage of the circuit design. Examples of pre-layout checks relate to transistor sizing, beta-ratios, static noise margins, drive strength, charge-sharing effects, keeper nodes, pre-charge clocking schemes, proper connections of devices, exclusivity assertions of control signals, connectivity of logic types, fan-out limits, stack height and width, taper-ratios, electrical properties, clock phase propagation and associated checks, first order electromigration analysis, boundary values of allowed electrical parameters, checks which involve device size, capacitance and wire-load models which are not dependent solely upon extracted parasitic data, and others.

During the post-layout phase further refinement of the pre-layout checks and noise assertions with the actual parasitic data may be conducted to determine which nodes failed the safe assertions. Nets which violate one or more assertions may be marked as candidates for detailed simulation. For example, SPICE net lists with input stimulus and measurement statements may be generated for circuit simulation and analysis of both the magnitude of noise and the effect of noise on delay. The net selection may take into account the originating points of the signals and the clock phase associated with them. In this manner, false errors are reduced. Results of timing analysis tools may be input to annotate the signal arrival times at the input of the drivers in order to further eliminate false errors. This analysis eliminates the need to sift through a large amount of verification data by focussing only on the nets that can actually cause design errors.

According to an embodiment, the present invention may be configured to check for signal noise caused by coupling capacitance in a post-layout design. The circuit design analyzer module 114 analyzes coupling violations on a net-by-net basis using a static, i.e. vector independent method. Circuit design analyzer module 114 uses the input information including the parasitics information to identify nodes in the circuit design with noise problems. This is determined by calculating coupling ratios and comparing them to limits specified by the parameters in the technology file. The options described in Table 7 may be used to check for signal noise caused by coupling capacitances in the circuit design.

TABLE 7

Options for post-layout checks

| OPTIONS | DESCRIPTION |
|---|---|
| coup | Classifies signals into static and dynamic circuit types, identifies exclusivity relationships (BDD), and identifies victim nodes. As stated above, the present invention checks coupling violations on a net-by-net basis. In order to determine the effective capacitance (Ceff) of the net under analysis, the present invention takes into account all grounded capacitances on the net and the gate capacitances of transistors that are driven by the net. The total load on the net under analysis is computed by Cdiff + Cwire(Ceff).<br>The present invention identifies coupling violations based on the following parameters which may be specified in the technology file:<br>coup_vrise_max and coup_vfall_max |

TABLE 7-continued

Options for post-layout checks

| OPTIONS | DESCRIPTION |
|---|---|
| | The present invention reports nodes whose coupling capacitances exceed the values specified by the coup_vrise_max and coup_vfall_max parameters. The present invention computes the voltage spike and drop of the victim based on the aggressor changing at a rate specified by the minimum tedge_rise and tedge_fall parameters. The coupling capacitance for the victim node is the sum of all capacitances that couple to the node.<br>coup_static_ratio and coup_dynamic_ratio<br>The present invention compares the capacitance ratio, which is Ccoup/(Cnode + Ccoup), to the technology file parameters coup_static_ratio and coup_dynamic_ratio to identify nodes with noise problems. The static and dynamic refer to the type of the victim's output node. To determine the nominal edge rate allowed at the node, the present invention uses the minimum value for the tedge_rise and tedge_fall parameters.<br>coup_cap_threshold<br>This parameter is used in the -do coup -coupto check to set a threshold for reporting coupled-to aggressors. Any coupling capacitance lower than the total coupling capacitance on a net multiplied by the value specified by this parameter (which is a percentage between 0.0 and 1.0) is not reported.<br>Example Report:<br>The following is a sample coupling violation report<br>MC:COUP: Circuit structures susceptible to coupling:<br>    # spec = coup_static_ratio=0.20, coup_dynamic_ratio=0.10<br>    # spec = tedge_rise: (min=0.8 ns, max=1 ns, typ=0.5 ns)<br>    # spec = tedge_fall: (min=0.8 ns, max=1 ns, typ=0.5 ns)<br>`#Vspike  Vdrop  Cratio  Cnode  Cdiff  Cwire  Ccoup   faninp:n  type    Nodename`<br>`1.46     1.57   0.84    18.61  3.65   14.96  100.00  1:1       static  NET15`<br>`                                                      Port IN0->(STDINV_1X)`<br>`                                                      Port Y->(STDINV_1X)`<br>`1.17     1.36   0.79    11.60  3.65   7.95   44.00   1:1       static  NET18`<br>`                                                      Port IN0->(STDINV_1X)`<br>`                                                      Port Y->(STDINV_1X)`<br>`0.78     1.00   0.66    10.32  3.65   6.67   20.00   1:1       static  NET10`<br>`                                                      Port IN0->(STDINV_1X)`<br>`                                                      Port Y->(STDINV_1X)`<br>`0.50     0.66   0.45    14.69  3.65   11.04  12.00   1:1       static  NET2`<br>`                                                      Port IN0->(STDINV_1X)`<br>`                                                      Port Y->(STDINV_1X)`<br>`0.49     0.64   0.43    15.72  3.65   12.07  12.00   1:1       static  NET4`<br>`                                                      Port IN0->(STDINV_1X)`<br>`                                                      Port Y->(STDINV_1X)`<br>`0.30     0.46   0.39    9.56   3.65   5.91   6.00    1:1       static  NET11`<br>`                                                      Port IN0->(STDINV_1X)`<br>`                                                      Port Y->(STDINV_1X)`<br>`0.25     0.33   0.23    20.35  3.65   16.71  6.00    1:1       static  NET9`<br>`                                                      Port IN0->(STDINV 1X)`<br>`                                                      Port Y->(STDINV_1X)`<br>This report lists nodes likely to have noise problems, victim nodes, under the heading Nodename. In this report, the victim nodes, NET15, NET18, NET10, NET2, NET4, NET11, and NET9 are all static nodes. They have capacitance ratios (Cratio) higher than the 0.20 limit specified in the technology file. For example, with the capacitance ratio figured as follows,<br>Cratio = Ccoup/(Cnode + Ccoup)<br>the Cratio for NET15 would be 100.00/(18.61 + 100.00) = 0.84 |
| coup -coupto | Identifies both victim nodes and the aggressors on victim nodes<br>Example Report<br>The following is a sample report listing victim nodes under the heading Nodename. Aggressors coupled to a victim are listed after the victim. For example, for the victim NET15, the aggressors are NET18, NET10, NET4, NET2, NET11, and NET9. The present invention flags nets on the same clock phase.<br>MC:COUP: Circuit structures susceptible to coupling:<br># spec = coup_static_ratio=0.20, coup_dynamic_ratio=0.10<br># spec = tedge_rise: (min=0.2 ns, max=0.2 ns, typ=0.2 ns)<br># spec = tedge_fall: (min=0.2 ns, max=0.2 ns, typ=0.2 ns)<br>`#Vspike  Vdrop  Cratio  Cnode  Cdiff  Cwire  Ccoup   faninp:n  type    Nodename`<br>`1.59     1.64   0.84    18.61  3.65   14.96  100.00  1:1       static  NET15`<br>MC:COUPTO: Aggressors coupled to victim:<br>`# Ccoup  Timing  Filtered  Nodename`<br>`44.00    (0:0)             NET18`<br>`20.00    (0:0)             NET10`<br>`12.00    (0:0)             NET4`<br>`12.00    (0:0)             NET2`<br>`6.00     (0:0)             NET11`<br>`6.00     (0:0)             NET9`<br>                                                Port IN0->(STDINV_1X) |

TABLE 7-continued

Options for post-layout checks

| OPTIONS | DESCRIPTION |
|---|---|

```
                                                             Port Y->(STDINV_1X)
       1.40     1.49    0.79    11.60    3.65     7.95    44.00    1:1    static    NET18
       MC:COUPTO: Aggressors coupled to victim:
       # Ccoup   Timing  Filtered  Nodename
       44.00     (0:0)             NET15
                                                             Port IN0->(STDINV_1X)
                                                             Port Y->(STDINV_1X)
       1.05     1.18    0.66    10.32    3.65     6.67    20.00    1:1    static    NET10
       MC:COUPTO: Aggressors coupled to victim:
       # Ccoup   Timing  Filtered  Nodename
       20.00     (0:0)             NET15
                                                             Port IN0->(STDINV_1X)
                                                             Port Y->(STDINV_1X)
       0.70     0.79    0.45    14.69    3.65    11.04    12.00    1:1    static    NET2
       MC:COUPTO: Aggressors coupled to victim:
            # Ccoup   Timing  Filtered  Nodename
            12.00     (0:0)             NET15
       Port IN0->(STDINV_1X)
       Port Y->(STDINV_1X)
       0.68     0.77    0.43    15.72    3.65    12.07    12.00    1:1    static
                NET4
```

| coup -exclusivity filter | Refines the search for nodes with noise problems and filters out false errors. Filters aggressors driven by exclusive logic. This option refines violation reporting by filtering out aggressors that are driven by exclusive logic. For all aggressors that couple to a node, the present invention does a pair-wise complementary check and groups aggressors that have a common input. Within these groups, aggressors are categorized as exclusive or non-exclusive. For each group of aggressors, the present invention takes the larger of the two categories, either exclusive or non-exclusive. The sum of these capacitances over all groups is the coupling capacitance used in the analysis.<br>Example Report:<br>The following is an example of a report that has been filtered using the -exclusivity_filter option. As in the previous coupling reports, nodes that exceed the coupling capacitance limit are listed in the Nodename column of the report. Aggressors coupled to a victim net are listed after the victim. But in this report, aggressors driven by exclusive logic are filtered out. This means that their capacitance is not figured into the total capacitance for the victim net. Filtered aggressors are indicated by an asterisk. In this report NET2, NET11, and NET9 are filtered out of the capacitance calculation for victim NET15.<br>MC:COUP: Circuit structures susceptible to coupling:<br># spec = coup_static_ratio=0.20, coup_dynamic_ratio=0.10<br># spec = tedge_rise: (min=0.2 ns, max=0.2 ns, typ=0.2 ns)<br># spec = tedge_fall: (min=0.2 ns, max=0.2 ns, typ=0.2 ns) |
|---|---|

```
       #Vspike  Vdrop   Cratio   Cnode    Cdiff    Cwire    Ccoup    faninp:n    type
                Nodename
       1.49     1.55    0.80    18.61    3.65    14.96    76.00    1:1    static
                NET15
       MC:COUPTO: Aggressors coupled to victim:
            # Ccoup   Timing   Filtered   Nodename
            44.00     (0:0)               NET18
            20.00     (0:0)               NET10
            12.00     (0:0)               NET4
            12.00     (0:0)      *        NET2
             6.00     (0:0)      *        NET11
             6.00     (0:0)      *        NET9
       (Aggressors filtered out because driven by exclusive logic)
                                                             Port IN0->(STDINV_1X)
                                                             Port Y->(STDFNV_1X)
       1.40     1.49    0.79    11.60    3.65     7.95    44.00    1:1    static    NET18
       MC:COUPTO: Aggressors coupled to victim:
            # Ccoup   Timing   Filtered   Nodename
            44.00     (0:0)               NET15
                                                             Port IN0->(STDFNV_1X)
                                                             Port Y->(STDINV_1X)
       1.05     1.18    0.66    10.32    3.65     6.67    20.00    1:1    static    NET10
       MC:COUPTO: Aggressors coupled to victim:
            #Ccoup    Timing   Filtered   Nodename
            20.00     (0:0)               NET15
                                                             Port IN0->(STDINV_1X)
                                                             Port Y->(STDFNV_1X)
       0.70     0.79    0.45    14.69    3.65    11.04    12.00    1:1    static    NET2
       MC:COUPTO: Aggressors coupled to victim:
            # Ccoup   Timing   Filtered   Nodename
            12.00     (0:0)               NET15
                                                             Port IN0->(STDFNV_1X)
```

TABLE 7-continued

Options for post-layout checks

| OPTIONS | DESCRIPTION |
|---|---|
| | Port Y->(STDINV_1X) |
| | 0.68   0.77   0.43   15.72   3.65   12.07   12.00   1:1   static   NET4 |
| | MC:COUPTO: Aggressors coupled to victim: |
| |   # Ccoup   Timing   Filtered   Nodename |
| |   12.00   (0:0)   NET15 |
| |   Port IN0->(STDINV_1X) |
| |   Port Y->(STDINV_1X) |
| | 0.51   0.62   0.39   9.56   3.65   5.91   6.00   1:1   static   NET11 |
| | MC:COUPTO: Aggressors coupled to victim: |
| |   # Ccoup   Timing   Filtered   Nodename |
| |   6.00   (0:0)   NET15 |
| |   Port IN0->(STDINV_1X) |
| |   Port Y->(STDNV_1X) |
| | 0.35   0.40   0.23   20.35   3.65   16.71   6.00   1:1   static   NET9 |
| | MC:COUPTO: Aggressors coupled to victim: |
| |   # Ccoup   Timing   Filtered   Nodename |
| |   6.00   (0:0)   NET15 |
| |   Port IN0->(STDINV_1X) |
| |   Port Y->(STDINV_1X) |
| coup -coup_spi | Generates a Spice file with input stimulus for circuits that fail coupling checks. This file can be used as input to Spice for a detailed analysis of the failed circuit.<br>Example Spice File<br>The following is an excerpt from a generated Spice file. Note that in the subcircuit definition of the failed net, NET18, the inputs and outputs of both the victim (NET18) and the aggressor (NET15) are listed. G4 is the output of the receiver of the victim, G3 is the output of the receiver of the aggressor, NET14 is the input of the driver of the aggressor, and NET17 is the input of the driver of the victim<br>  DESIGN "NSXC0"***<br>  .GLOBAL VDD VSS<br>  .options post=2<br>  .param vdd=2.000<br>  .lib '/VENDOR/LIB/MC_LIB' BSIM3_TYPICAL<br>  .temp = 25.0<br>  VVDD VDD 0 dc 2.000<br>  VVSS VSS 0 dc 0V<br>/Failed net, NET 18/<br>  .SUBCKT NET18 G4 G3 NET14 NET17<br>/Drivers of victim/<br>  MXU17.M0 U17:Z NET17 VSS VSS NMOS L=0.24 U W=1.04 U<br>  MXU17.M1 U17:Z NET17 VDD VDD PMOS L=0.24 U W=1.48 U<br>/Resistors and capacitors to ground victim/<br>  R18_3 U18:A S40 0.100000<br>  R18_2 S40 S39 0.050000<br>  R18_1 S39 U17:Z 0.200000<br>  C18_4 U18:A VSS 5.000e-16<br>  C18_3 S40 VSS 3.000e-15<br>  C18_2 S39 VSS 2.000e-16<br>  C18_1 U17:Z VSS 2.000e-15<br>/Receivers of victim/<br>  MXU18.M0 G4 U18:A VSS VSS NMOS L=0.24 U W=1.04 U<br>  MXU18.M1 G4 U18:A VDD VDD PMOS L=0.24 U W=1.48 U<br>  CG4 G4 VSS 4.00 F<br>  CC6 S35 S40 3.90e-14<br>  CC5 S33 U18:A 5.00e-15<br>  Aggressor nets<br>/Drivers of aggressors/<br>  MXU15.M0 U15:Z NET14 VSS VSS NMOS L=0.24 U W=1.04 U<br>  MXU15.M1 U15:Z NET14 VDD VDD PMOS L=0.24 U W=1.48 U<br>/Resistors and capacitors to ground aggressors/<br>  R15_5 U16:A S36 0.080000<br>  R15_4 S36 S35 1.500000<br>  R15_3 S35 S34 0.050000<br>  R15_2 S34 S33 1.500000<br>  R15_1 S33 U15:Z 0.100000<br>  C15_6 U16:A VSS 5.500e-15<br>  C15_5 S36 VSS 2.500e-15<br>  C15_4 S35 VSS 2.200e-15<br>  C15_3 S34 VSS 2.300e-15<br>  C15_2 S33 VSS 1.500e-15<br>  C15_1 U15:Z VSS 2.500e-15<br>/Receivers of aggressors**/ |

TABLE 7-continued

Options for post-layout checks

| OPTIONS | DESCRIPTION |
|---|---|
| | MXU16.M0 G3 U16:A VSS VSS NMOS L=0.24 U W=1.04 U |
| | MXU16.M1 63 U16:A VDD VDD PMOS L=0.24 U W=1.48 U |
| | .ENDS NET18 |
| | /** Vectors **/ |
| | /Measure Statements/ |

Referring back to FIG. 5, actions module 116 may then perform a plurality of actions based on the results of the analysis performed by circuit design analyzer module 114. These actions may include flagging portions of the circuit design which violate the assertions, performing further analysis of the circuit design using the present invention or using other analysis tools such as HSpice, suggesting techniques for "repairing" the violation, and the like. For example, if an analysis shows a delay in a path due to noise or slow drive, as appropriate buffer size may be used to remedy (repair) the problem.

Output module 118 is responsible for presenting the results of the analysis to the user. Typically, the results are presented to the user via interface module 100. Alternatively, the results may also be written to an output file which may be stored in data store 120 which is accessible to the user. According to an embodiment, the results of the analysis are presented to the user in the form of reports generated by the present invention. The reports are typically sorted based on the degree of violation of an assertion, which is ascertained by determining by how much a violation deviates from the specification or constraints specified in the assertions. The present invention processes all the violations, sorts the violations based on severity or based on any other user-specified criteria, and then reports the violations to the user.

Examples of sample reports are provided in Tables 5, 6, and 7 under the headings "Example Report." The present invention also provides several features to customize the contents of the reports. For example, options are provided to limit the number of reported violations based on specific categories such has violations related to charge share or drive characteristics. Options are also provided for limiting the number of violations for one or more categories. Many other options may also be used by the present invention.

In addition to reporting violations, the present invention may also be configured to display information about the circuit design and the technology file to the user. For example, the present invention provides features to report information related to primary input signals, primary output signals, technology file parameters, signal capacitances, nodes and their associated attributes, transistors and their associated attributes, circuit classification, clocknodes, rams, latches, muxes, tristates, complementaries, exclusive signals, static complementary logic output signals, merged transistor stacks, fanouts, electrical fanouts, netlists, and the like. Examples of the various options provided by an embodiment of the present invention for customizing reports are documented in Table 8. It should be apparent that other customization options are also included within the scope of the present invention.

TABLE 8

Report Options

| Report/List Options | Description |
|---|---|
| common | Determines the number of violations printed based on hierarchical information from the Spice netlist. For example, if the common ancestor limit is set to 1, the present invention prints a violation (for e.g. a weak node violation) if the violation can be traced to a common element in the subcircuit declaration. If the circuit occurs more than once in the circuit design, the present invention may be configured to report the violation only once is all weak nodes can be traced back to the same input node of the subcircuit inv. |
| limit | Sets the number of violations listed per analysis category to a specified number. |
| stats | Produces end-of-analysis statistics. For example:<br>MC: Statistics:<br>  Total Transistors    = 112 (+ 0 merged)<br>  Total Nodes    = 87<br>  Latch Points    = 2<br>      inv_fb    = 1<br>      pfb    = 1<br>      dynlatch    = 1<br>  Inputs    = 32<br>  Outputs    = 3<br>  Static Nodes    = 21<br>    Inverter's    = 17<br>    Nand's    = 4<br>  Dynamic Nodes    = 4<br>    Logic Output Nodes    = 3<br>      Nand's    = 1<br>      Complex    = 2<br>    Internal Prech Nodes    = 1<br>  Ratioed Nodes    = 1 |

TABLE 8-continued

|  |  |  |
|---|---|---|
|  | Report Options |  |
|  | Complex | = 1 |
|  | Cascode Structures | = 1 |
|  | Non-Clocked Cppl | = 1 |
|  | Tgate Muxes | = 2 |
|  | Tgates | = 6 | statsonly — Lists basic design statistics, without running analysis terse — Reports only violations and suppresses the additional information associated with the violations.

all — Lists all circuit design details.

caps — Calculates and produces a sorted list of non-zero signal capacitances. The report produced by -list caps also lists the following:
Cgate
Pre-layout estimated wire capacitances (Cwire) for schematic-based netlists
Diffusion capacitances (Cdiff) for source/drain connections at logic nodes
Relevant coupling capacitance components (Ccoup)
Each node listed is identified by its name as well as by its number (this number is the number shown for the node when the -list nodes option is executed).
Example report:
MC: Signal capacitances (sorted, non-zero, print_threshold=10.00F):

| num | Ctot(ff) | Cgate | Cwire | Cdiff | Ccoup | Nodename |
|---|---|---|---|---|---|---|
| 71 | 205.096 | 0.000 | 200.000 | 5.096 | 0.000 | H3 |
| 21 | 150.026 | 28.000 | 100.000 | 22.026 | 0.000 | I1 |
| 88 | 140.042 | 8.640 | 120.000 | 1.402 | 0.000 | L5 |

The capacitance calculation is as follows:
Ctot = Cdiffusion + Cgate + Cwire + Ccoup
Cdiffusion:
hdif/acm/geo-based estimation if the -estcaps option in pre-layout analysis is used
Uses area/perimeter of source and drain terminals if available in extracted Spice netlists
Cgate:
Uses n_Cox, p_Cox, and device size to calculate gate capacitance
Empirically derived coefficients are used if available and specified in the technology file (with cgate_use_coeff)
Accounts for output fanouts
Cwire:
Is the capacitance defined in the netlist, command file, technology file, or the calculated effective capacitance from a distributed RC network described in a DSPF file.
Cc:
Is the capacitance between two nets (not just victims) provided through the extracted netlist; it is treated as a capacitance to ground (Vss) for the -do cshare option.

classify — Displays the present invention's classification of the structures in the circuit design. This option lists transistors and their attributes as well as the class and the group they belong to.
Example report:
MC: Transistor Classification:

| group | width | len | spec | misc | Vt | attr | TransName |
|---|---|---|---|---|---|---|---|
| latch 1 | 5.000 | 0.180 | n04-w---- | ps |  | 1 | MXD.MN6 |
| latch 1 | 1.100 | 0.500 | n02------ | pd |  | 1 | MXD.MN10 |
| latch 1 | 1.000 | 0.600 | p01--- ^-- | pu |  | 1 | MXD.MP7 |
| latch 2 | 2.000 | 0.160 | n27------ | ps |  | 1 | MXD.MN9 |
| latch 2 | 2.500 | 0.160 | p01--p ^fb | pfbpu |  | 1 | MXD.MP4 |
| latch 2 | 2.500 | 0.160 | n02------ | pd |  | 1 | MXD.MN8 |
| latch 2 | 5.000 | 0.160 | p01--- ^-- | pu |  | 1 | MXD.MP6 |
| latch 3 | 1.000 | 0.160 | n02----fb | pd |  | 1 | MXD.MN1 |
| latch 3 | 2.000 | 0.160 | p01--- ^fb | pu |  | 1 | MXD.MP0 |
| latch 3 | 2.000 | 0.160 | n04-w---- | ps |  | 1 | MXD.MN0 |
| latch 3 | 2.500 | 0.160 | n02------ | pd |  | 1 | MXD.MN4 |
| latch 3 | 5.000 | 0.160 | p01--- ^-- | pu |  | 1 | MXD.MP5 |
| cascode | 11.200 | 0.180 | p01--- ^fb | pu |  | 1 | MXD.XI96.MP0 |
| cascode | 11.100 | 0.180 | n02----fb | pd |  | 1 | MXD.XI96.MN0 |

The entries under the spec heading are strings made up of 9 characters. The following defines the meanings of the characters in the strings:
Character → Meaning
First character either n or p → n-type or p-type character
Second and third characters → internal signal flow direction setting
Fourth character: m or dash (-) → m if transistor is merged, dash if not merged
Fifth character: w, f; u, or dash (-) → set/unset bit; w if direction is set by the present invention with a "weak" rule, meaning direction is correct for most circuits; f if direction is forced by user (with set input/output in a command file); u if unset; dash if set
Sixth character: e, n, or dash (-) → e if eval transistor in a dynamic gate; n if n-feedback is pulldown; p if p-feed-back is pullup; dash if none of the above
Seventh character: caret ( ^ ) or dash (-) → caret if sigflowflip is flipped; dash if not
Eighth and ninth characters: fb or
double-dash (--) → fb if feedback; double-dash if not
The following defines the abbreviations used under the misc heading:

| Abbreviation | Meaning |
|---|---|
| ps | pass device (static, dynamic) |
| pu | pullup (static, dynamic, ratioed) |

TABLE 8-continued

Report Options

| | | |
|---|---|---|
| | pd | pulldown (static, dynamic, ratioed) |
| | tgate | transmission gate (static, dynamic) |
| | prech | precharge (dynamic) |
| | pldpu | p-load pullup (ratioed) |
| | pldpd | p-load pulldown (ratioed) |
| | nldpu | n-load pullup (ratioed) |
| | nldpd | p-load pulldown (ratioed) |
| | pfbpu | p-feedback pullup (static, dynamic) |
| | nfppu | n-feedback pullup (static, dynamic) |
| | pfbpd | p-feedback pulldown (static, dynamic) |
| | nfbpd | n-feedback pulldown (static, dynamic) |
| clocknodes | Traverses the nodes in the circuit design and reports nodes associated with clock signals. | |
| complementary | Lists user-defined complementary nodes (i.e., any nodes specified as complementary in a command file). This option also lists any two nodes that are complementary. | |
| efanout | Lists all electrical (capacitance based) fanouts on static gates. The electrical fanout is derived by calculating the ratio of Cout/Cin. | |
| exclusive | Lists user-defined exclusive nodes (i.e., any nodes specified as exclusive in a command file). | |
| fanout | Lists logical (gate) fanouts on static gates in the circuit design. Transmission gates and pass gates are counted as fanouts. | |
| input | Lists information about primary input signals. This report provides input capacitance information to help size drivers, flags inputs that are dangling logic wires, and helps identify primary inputs that do not adhere to signal naming conventions.<br>Example report:<br>MC: Primary Input Signals:<br><pre>Ctot(ff) Cgate   Cwire  Cdiff  Ccoup  Misc  Timing  Nodename
98.000   98.000  0.000  0.000  0.000        1:0     CLK
76.320   76.320  0.000  0.000  0.000        0:0     B
68.400   68.400  0.000  0.000  0.000        0:0     C</pre> | |
| latch | Identifies and lists latch storage nodes. Both the storage node and its complement node are listed. The report also lists the type of latch (static or dynamic), input information on the latch, i.e. whether it is a pass gate latch (pstrans) or a transmission gate latch (tgate), and feedback information on the latch, whether it is a tristate inverter feedback (tsinvfb), a feedback inverter (invfb), or a o feedback (pfb).<br>Example report:<br>MC: List of LATCH structures:<br><pre>#Type    Config1  Config2  Clock  Input  Output  LatchNode
dynamic  pstrans           CLK    Z      G5      F5
static   tgate    tsinvfb  CLKB   E4     G4      F4
dynamic  tgate             CLKB   E3     G3      F3
dynamic  pstrans           CLK    E2     G2      F2
static   tgate    invfb    CLKB   E1     G1      F1
static   pstrans  pfb      CLK    E0     G0      F0
static   tgate    invfb    CLKB   Z      F       E</pre> | |
| merged_devices | Lists merged transistors. In the report, the indented transistor is merged into the transistor shown above it. For example, in the following report<br>MH_1<br>  MH_2<br>MH_2 is the transistor that is merged into MH_1. | |
| mux | Lists mux output nodes.<br>Example report:<br>MC: Mux Output Nodes:<br><pre>Ctot(ff)  Cgate  Cwire  Cdiff  Ccoup  Misc  Nodename
3.750     3.750  0.000  0.000  0.000        MUXNODE</pre> | |
| names | Lists structures in the circuit design that are defined in a names file created by the user. Typically, these are proprietary structures that would be classified as unknown without the names file. | |
| netlist | Writes out a flat netlist derived from a hierarchical Spice netlist which is used as input to the present invention. The present invention names the flat netlist same as the name of the hierarchical netlist with a .mos extension, for example, "mydesign.mos." The present invention displays the flat netlist name to the screen. The flat netlist includes comments about the hierarchy. Resistors, area, and perimeter parameters are not included in the flat netlist. | |
| node | Lists nodes and their associated capacitances.<br>Example report:<br>MC: Nodes in design:<br><pre>num  Ctot(ff)  Cgate   Cwire  Cdiff  Ccoup  Timing  Nodename
1    9.025     9.025   0.000  0.000  0.000  0:0     VDD
2    0.000     0.000   0.000  0.000  0.000  0:0     VSS
3    0.720     0.720   0.000  0.000  0.000  0:0     SE
4    98.000    98.000  0.000  0.000  0.000  1:0     CLK</pre> | |
| output | Lists information about primary output signals. Provides output load capacitance information to help identify critical wires, flags outputs that are dangling logic wires, and helps identify primary outputs that do not adhere to signal naming conventions.<br>Example report:<br>MC: Primary Output Signals:<br><pre>Ctot(ff)  Cgate  Cwire    Cdiff  Ccoup  Misc  Nodename
200.000   0.000  200.000  0.000  0.000        H3</pre> | |

TABLE 8-continued

| | | | | | Report Options | |
|---|---|---|---|---|---|---|
| | 100.000 | 0.000 | 100.000 | 0.000 | 0.000 | H |
| | 100.000 | 0.000 | 100.000 | 0.000 | 0.000 | H1 | ram     Identifies and lists all single and multiported 6tram cells. Both the storage node and its complement node are listed.
Example report:
MC: List of RAM structures:
    2-port 6tram @ (X, Y)

static     Lists static complementary logic output signals.
Example report:
MC: Static complementary logic output signals:
  X1.10
  X1.5
  X1.15
  DATA1
  X2.8
  X2.5
  X2.3
  X2.2
  DATA2
  X1.13
  X1.12
  X1.7
  X1.3
  X2.10
  X1.11 tech     Lists parameters specified in the technology file.

tran     Lists transistors and their associated attributes.
Example report:
MC: Transistor usage and configuration:

| tno | width | len | spec | misc | source | gate | drain | TransName |
|---|---|---|---|---|---|---|---|---|
| 1 | 36.343 | 0.180 | n00---- | pd | VSS | D | N_1 | MN_1 |
| 2 | 36.343 | 0.180 | n01---- | pd | N_1 | C | N_2 | MN_2 |
| 3 | 36.343 | 0.180 | n01---- | pd | N_2 | B | N_3 | MN_3 |

The entries under the spec heading are strings which may have the following meanings:
Character → Meaning
First character: either n or p → n-type or p-type character
Second and third characters → internal signal flow direction setting
Fourth character: m or dash (-) → m if transistor is merged, dash if not merged
Fifth character: w, f, u, or dash (-) → set/unset bit; w if direction is set by the present invention with a "weak" rule, meaning direction is correct for most circuits; f if direction is forced by user (with set input/output in a command file); u if unset; dash if set
Sixth character: e, n, or dash (-) → e if eval transistor in a dynamic gate; n if n-feedback is pulldown; p if p-feed-back is pullup; dash if none of the above
Seventh character: caret ( ^ ) or dash (-) → caret if sigflowflip is flipped; dash if not
Eighth and ninth characters: fb or double-dash (--) → fb if feedback; double-dash if not
The following defines the abbreviations used under the misc heading:
Abbreviation → Meaning
  ps          pass device (static, dynamic)
  pu          pullup (static, dynamic, ratioed)
  pd          pulldown (static, dynamic, ratioed)
  tgate        transmission gate (static, dynamic)
  prech       precharge (dynamic)
  pldpu       p-load pullup (ratioed)
  pldpd       p-load pulldown (ratioed)
  nldpu       n-load pullup (ratioed)
  nldpd       p-load pulldown (ratioed)
  pfbpu       p-feedback pullup (static, dynamic)
  nfppu       n-feedback pullup (static, dynamic)
  pfbpd       p-feedback pulldown (static, dynamic)
  nfbpd       n-feedback pulldown (static, dynamic)

tristate     Lists tristate output nodes and their associated signals.
Example report:
MC: tristate nodes:

| OutNode | Enable1 | Enable2 | InputNode |
|---|---|---|---|
| F4 | ENB | EN | G4 | unclassified     Displays information about circuit structures in the circuit design that the present invention classifies as "Unknown." Unknown structures are those that do not fit into the present invention's classification tree (for e.g. the tree shown in FIG. 4). Typically, "unknowns" include proprietary user structures.
Example report:
MC: Unclassified Transistor Clusters
  Total Unclassified Clusters in Cell "CATCHALL":2
  # Cluster 1 (9 Transistors)

| #tno | width | len | spec | misc | source | gate | drain | TransName |
|---|---|---|---|---|---|---|---|---|
| 74 | 1.200 | 0.180 | p01---^-- | pu | VDD | XD.DYN1OUT | XD.D1OUT | MXD.X3.MP0 |
| 73 | 1.100 | 0.180 | n02------ | pd | VSS | XD.DYN1OUT | XD.D1OU | MXD.X3.MN0 |
| 66 | 10.000 | 0.180 | p01---^-- | pu prech | VDD | CLK | XD.NET284 | MXD.MP21 |

TABLE 8-continued

|  |  |  |  | Report Options |  |  |  |  |
|---|---|---|---|---|---|---|---|---|
| 49 | 5.000 | 0.180 | n01---^-- pd | VSS | CLK |  | XD.NET319 | MXD.MN24 |
| 5 | 5.000 | 0.250 | p02------- pu prech | VDD | CLK |  | XD.D1OUT | MXD.MP200 |
| 4 | 10.000 | 0.250 | n04------- pd | XD.A1 | IN11 |  | XD.D1OUT | MXD.MN200 |
| 3 | 10.000 | 0.250 | n02------- pd | VSS | IN12 |  | XD.A1 | MXD.MN201 |
| 2 | 10.000 | 0.250 | n04------- pd | XD.B1 | IN13 |  | XD.D1OUT | MXD.MN202 |
| 1 | 10.000 | 0.250 | n02------- pd | VSS | IN14 |  | XD.B1 | MXD.MN203 |
| # |  | Cluster 2 (1 Transistors) |  |  |  |  |  |  |
| #tno | width | len | spec misc | source | gate |  | drain | TransName |
| 61 | 10.000 | 0.180 | p01---^-- pu pload | VDD | VSS |  | XD.NET348 | MXD.MP9 |

The entries under the spec heading are strings with the following meanings
Character → Meaning
First character: either n or p → n-type or p-type character
Second and third characters → internal signal flow direction setting
Fourth character: m or dash (-) → m if transistor is merged, dash if not merged
Fifth character: w, f, u, or dash (-) → set/unset bit; w if direction is set by the present invention with a "weak" rule, meaning direction is correct for most circuits; f if direction is forced by user (with set input/output in a command file); u if unset; dash if set
Sixth character: e, n, or dash (-) → e if eval transistor in a dynamic gate; n if n-feedback is pulldown; p if p-feed-back is pullup; dash if none of the above
Seventh character: caret (^) or dash (-) → caret if sigflowflip is flipped; dash if not
Eighth and ninth characters: fb or
double-dash (--) → fb if feedback; double-dash if not
The following table defines the abbreviations used under the misc heading:

| Abbreviation | Meaning |
|---|---|
| ps | pass device (static, dynamic) |
| pu | pullup (static, dynamic, ratioed) |
| pd | pulldown (static, dynamic, ratioed) |
| tgate | transmission gate (static, dynamic) |
| prech | precharge (dynamic) |
| pldpu | p-load pullup (ratioed) |
| pldpd | p-load pulldown (ratioed) |
| nldpu | n-load pullup (ratioed) |
| nldpd | n-load pulldown (ratioed) |
| pfbpu | p-feedback pullup (static, dynamic) |
| nfppu | n-feedback pullup (static, dynamic) |
| pfbpd | p-feedback pulldown (static, dynamic) |
| nfbpd | n-feedback pulldown (static, dynamic) |

Referring back to FIG. 5, applications programming interface module 122 enables circuit designers to extend the capability of the present invention by configuring user-defined/customized checks, circuit structures, and actions. The circuit designer may use API module 122 to define circuit structures based on circuit structures internally recognized by the present invention, circuit structured declared via libraries, or the designer's proprietary circuit structures. A naming convention may be defined for defining the circuit structures. Likewise, the circuit designer may define/customize additional checks or actions. In the case of structures which are not built into the present invention, a circuit designer can specify user circuits through a pattern matching capability. The pattern matching capability does isomorphic sub-graph recognition. The present invention accepts an assertion such as connect: error (C-User.1-C)

where "User. 1" is user defined circuit type and applies the assertion to it. The user circuit designs are captured in netlist representation format, such as HSPICE netlist, and are provided to the present invention for recognition of the presence (or even absence) of the user defined circuits. Embedded in the description of these netlists are declarations of attributes on the elements of the circuit pattern. These declarations help to "morph" these circuits to any of the built-in structures recognized by the present invention so that the standard checks can be applied to it or the elements of the circuit pattern may be "mapped" to anchor points for API based programs allowing the users to write their own checks.

As described above, the present invention provides techniques for performing static circuit analysis at various phases of the design cycle. The invention is particularly beneficial for improving the quality of the circuit design by identifying problems during the early phases of the circuit design, thus reducing unnecessary circuit simulation which improving the reliability and performance of the circuit design. The analysis may be performed at various levels of abstraction of the circuit including at the transistor level, macro level, block level, and chip level. The invention is well suited for performing analysis and verification of DSM circuit designs. The present invention provides an enhanced circuit design methodology which increases the predictability of the circuit design, which significantly reduces design iterations typically associated with conventional analysis techniques, and which in turn reduces the time to market. Techniques provided by the present invention thus allow for higher level of integration and performance in silicon.

The assertions allow a circuit designer to specify assumptions and expectations of a "good" circuit design based on the designer's circuit design experience. The present invention thus improves a circuit designer's confidence in the circuit implementation. By associating with specific circuit structures, the present invention allows a circuit designer to analyze the circuit design on a per circuit structure basis, rather than analyzing the whole circuit design. This "divide-and-conquer" approach to circuit design analysis significantly reduces the costs, time, and expensive resources needed for performing circuit design analysis. The assertion based technology provides a preventive approach to avoiding the pitfalls of costly iterative design cycles by decreasing the risks of design errors and by limiting the total amount of verification effort required in the backend of the circuit design cycle. The present invention supports various industry-standard APIs and data formats and thus can be easily integrated with existing tools, processes, or methodologies. In addition, the present invention provides various APIs allowing the circuit designer to expand the capabilities and analysis features of the present invention.

Although specific embodiments of the invention have been described, various modifications, alterations, alternative constructions, and equivalents are also encompassed within the scope of the invention. The described invention is not restricted to operation within certain specific data processing environments, but is free to operate within a plurality of data processing environments. Additionally, although the present invention has been described using a particular series of transactions and steps, it should be apparent to those skilled in the art that the scope of the present invention is not limited to the described series of transactions and steps. In one embodiment, the present invention is incorporated in products and services offered by Moscape, Inc. located in Santa Clara, Calif. Additional features of the present invention are described in Appendix A, the entire contents of which are herein incorporated by reference for all purposes.

Further, while the present invention has been described using a particular combination of hardware and software, it should be recognized that other combinations of hardware and software are also within the scope of the present invention. The present invention may be implemented only in hardware, or only in software, or using combinations thereof.

The specification and drawings are, accordingly, to be regarded in an illustrative rather than a restrictive sense. It will, however, be evident that additions, subtractions, deletions, and other modifications and changes may be made thereunto without departing from the broader spirit and scope of the invention as set forth in the claims.

What is claimed is:

1. A computer implemented method for analyzing a circuit design, the method comprising:
    receiving circuit design information describing the circuit design to be analyzed, the circuit design including a plurality of circuit structures;
    specifying an assertion for a first circuit structure from the plurality of circuit structures, the assertion indicating a context of the circuit design in which the first circuit structure is to be analyzed, an attribute associated with the first circuit structure, and a constraint associated with the attribute;
    receiving a check to be applied to the circuit design; and
    analyzing the circuit design based on the check and the assertion to generate analysis results data, the analysis results data including an instance of the first circuit structure in the circuit design which does not satisfy the constraint specified in the assertion specified for the first circuit structure.

2. The method of claim 1 wherein the analysis results data includes multiple instances of the first circuit structure in the circuit design which do not satisfy the constraint indicated in the assertion for the first circuit structure.

3. The method of claim 2 wherein the analysis results data is formatted as report listing the instances of the first circuit structure according to extent by which the constraint was not satisfied.

4. The method of claim 1 wherein the analysis results data includes information about the plurality of circuit structures.

5. The method of claim 1 wherein the assertion further indicates an action to be performed if the first circuit structure does not satisfy the constraint specified in the assertion.

6. The method of claim 5 wherein the assertion is specified as:

Word1: Word2 Word3 Word4 where "Word1" indicates the attribute associated with the first circuit structure, "Word2" indicates the constraint associated with the attribute, "Word3" indicates the action to be performed if the first circuit structure does not satisfy the constraint indicated in the assertion, and "Word4" indicates the context of the circuit design in which the first circuit structure is to be analyzed.

7. The method of claim 5 further comprising performing the action specified in the assertion when the first circuit structure does not satisfy the constraint specified in the assertion.

8. The method of claim 7 wherein performing the action comprises generating a circuit representation corresponding to a portion of the circuit design including the instance of the first circuit structure which does not satisfy the constraint specified in the assertion to facilitate analysis of the portion.

9. The method of claim 8 wherein performing the action further comprises generating stimuli for analyzing the circuit representation corresponding to the portion.

10. The method of claim 5 further comprising providing an application programming interface enabling a user to configure user defined checks, user defined circuit structures, and user defined actions.

11. The method of claim 1 wherein receiving the circuit design information comprises receiving netlist information describing the circuit design and parasitics information for the circuit design.

12. The method of claim 1 wherein the plurality of circuit structures include circuit structures selectable from a group of circuit structures comprising logic circuit structures, RAM circuit structures, transmission gate circuit structures, pass gate circuit structures, latches, static circuit structures, dynamic circuit structures, cascode circuit structures, ratioed circuit structures, multiplexers, tristates, complementary circuit structures, inverters, AND gates, OR gates, NAND gates, NOR gates, or user-defined circuit structures.

13. The method of claim 1 wherein the check is selectable from a plurality of checks for analyzing drive strength, circuit integrity, charge share, noise margins, electromigration, or coupling noise analysis.

14. The method of claim 1 wherein the context in which the first circuit structure is to be analyzed includes a driver structure connected to the first circuit structure and a receiver structure connected to the first circuit structure, wherein the driver structure drives signals to the first circuit structure and the receiver structure receives signals from the first circuit structure.

15. The method of claim 14 wherein the driver structure comprises a second plurality of circuit structures.

16. The method of claim 15 wherein the second plurality of circuit structures are serially connected to the first circuit structure.

17. The method of claim 15 wherein the second plurality of circuit structures are connected in parallel to the first circuit structure.

18. The method of claim 14 wherein the receiver structure comprises a third plurality of circuit structures.

19. The method of claim 18 wherein the third plurality of circuit structures are serially connected to the first circuit structure.

20. The method of claim 18 wherein the third plurality of circuit structures are connected in parallel to the first circuit structure.

21. The method of claim 14 wherein analyzing the circuit design based on the check and the assertion comprises:

determining transistor-level information from the circuit design information;

determining signal flow direction in the circuit design based on the transistor-level information; and identifying the plurality of circuit structures from the transistor-level information, the plurality of circuit structures including the first circuit structure, the driver structure, and the receiver structure.

22. The method of claim 21 further comprising:

providing hierarchically related classes of circuit structures; and wherein identifying the plurality of circuit structures comprises classifying the first circuit structure into a first class of circuit structures.

23. The method of claim 22 wherein the classes of circuit structures include user-defined classes.

24. The method of claim 22 wherein the assertion is associated with the first class of circuit structures and is inherited by all classes of circuit structures which are hierarchical descendants of the first class of circuit structures.

25. The method of claim 22 wherein the assertion is associated with a second class of circuit structures which is hierarchically an ancestor of the first class of circuit structures, and the assertion is inherited by the first class of circuit structures from the second class of circuit structures.

26. The method of claim 21 wherein identifying the plurality of circuit structures comprises recognizing the circuit structures using circuit pattern mapping techniques.

27. A computer implemented method for analyzing a circuit design, the method comprising:

receiving circuit design information describing the circuit design to be analyzed, the circuit design including a first plurality of circuit structures;

specifying assertions for a second plurality of circuit structures, the second plurality of circuit structures included in the first plurality of circuit structures, wherein for each circuit structure in the second plurality of circuit structures, the assertion indicates a context of the circuit design in which the circuit structure is to be analyzed, an attribute associated with the circuit structure, and a constraint associated with the attribute; and analyzing the circuit design based on the assertions to identify circuit structures in the first plurality of circuit structures for which assertions have not been specified.

28. A computer program product for analyzing a circuit design, the computer program product comprising:

code for receiving circuit design information describing the circuit design to be analyzed, the circuit design including a plurality of circuit structures;

code for specifying an assertion for a first circuit structure from the plurality of circuit structures, the assertion indicating a context of the circuit design in which the first circuit structure is to be analyzed, an attribute associated with the first circuit structure, and a constraint associated with the attribute;

code for receiving a check to be applied to the circuit design;

code for analyzing the circuit design based on the check and the assertion to generate analysis results data, the analysis results data including an instance of the first circuit structure in the circuit design which does not satisfy the constraint specified in the assertion specified for the first circuit structure; and a computer readable storage medium for storing the codes.

29. The computer program product of claim 28 wherein the analysis results data includes multiple instances of the first circuit structure in the circuit design which do not satisfy the constraint indicated in the assertion for the first circuit structure.

30. The computer program product of claim 29 wherein the analysis results data is formatted as report listing the instances of the first circuit structure according to extent by which the constraint was not satisfied.

31. The computer program product of claim 28 wherein the analysis results data includes information about the plurality of circuit structures.

32. The computer program product of claim 28 wherein the assertion further indicates an action to be performed if the first circuit structure does not satisfy the constraint specified in the assertion.

33. The computer program product of claim 32 wherein the assertion is specified as:

Word1: Word2 Word3 Word4 where "Word1" indicates the attribute associated with the first circuit structure, "Word2" indicates the constraint associated with the attribute, "Word3" indicates the action to be performed if the first circuit structure does not satisfy the constraint indicated in the assertion, and "Word4" indicates the context of the circuit design in which the first circuit structure is to be analyzed.

34. The computer program product of claim 32 further comprising code for performing the action specified in the assertion when the first circuit structure does not satisfy the constraint specified in the assertion.

35. The computer program product of claim 32 wherein the code for performing the action comprises code for generating a circuit representation corresponding to a portion of the circuit design including the instance of the first circuit structure which does not satisfy the constraint specified in the assertion to facilitate analysis of the portion.

36. The computer program product of claim 35 wherein the code for performing the action further comprises code for generating stimuli for analyzing the circuit representation corresponding to the portion.

37. The computer program product of claim 28 further comprising code for providing an application programming interface enabling a user to configure user defined checks, user defined circuit structures, and user defined actions.

38. The computer program product of claim 28 wherein the code for receiving the circuit design information comprises code for receiving netlist information describing the circuit design and parasitics information for the circuit design.

39. The computer program product of claim 28 wherein the plurality of circuit structures include circuit structures selectable from a group of circuit structures comprising logic circuit structures, RAM circuit structures, transmission gate circuit structures, pass gate circuit structures, latches, static circuit structures, dynamic circuit structures, cascode circuit structures, ratioed circuit structures, multiplexers, tristates, complementary circuit structures, inverters, AND gates, OR gates, NAND gates, NOR gates, or user-defined circuit structures.

40. The computer program product of claim 28 wherein the check is selectable from a plurality of checks for analyzing drive strength, circuit integrity, charge share, noise margins, electromigration, or coupling noise analysis.

41. The computer program product of claim 28 wherein the context in which the first circuit structure is to be analyzed includes a driver structure connected to the first circuit structure and a receiver structure connected to the first circuit structure, wherein the driver structure drives signals to the first circuit structure and the receiver structure receives signals from the first circuit structure.

42. The computer program product of claim 41 wherein the driver structure comprises a second plurality of circuit structures.

43. The computer program product of claim 42 wherein the second plurality of circuit structures are serially connected to the first circuit structure.

44. The computer program product of claim 42 wherein the second plurality of circuit structures are connected in parallel to the first circuit structure.

45. The computer program product of claim 41 wherein the receiver structure comprises a third plurality of circuit structures.

46. The computer program product of claim 45 wherein the third plurality of circuit structures are serially connected to the first circuit structure.

47. The computer program product of claim 45 wherein the third plurality of circuit structures are connected in parallel to the first circuit structure.

48. The computer program product of claim 41 wherein the code for analyzing the circuit design based on the check and the assertion comprises:

code for determining transistor-level information from the circuit design information;

code for determining signal flow direction in the circuit design based on the transistor-level information; and code for identifying the plurality of circuit structures from the transistor-level information, the plurality of circuit structures including the first circuit structure, the driver structure, and the receiver structure.

49. The computer program product of claim 48 further comprising:

code for providing hierarchically related classes of circuit structures; and wherein the code for identifying the plurality of circuit structures comprises code for classifying the first circuit structure into a first class of circuit structures.

50. The computer program product of claim 49 wherein the classes of circuit structures include user-defined classes.

51. The computer program product of claim 49 wherein the assertion is associated with the first class of circuit structures and is inherited by all classes of circuit structures which are hierarchical descendants of the first class of circuit structures.

52. The computer program product of claim 49 wherein the assertion is associated with a second class of circuit structures which is hierarchically an ancestor of the first class of circuit structures, and the assertion is inherited by the first class of circuit structures from the second class of circuit structures.

53. The computer program product of claim 48 wherein the code for identifying the plurality of circuit structures comprises code for recognizing the circuit structures using circuit pattern mapping techniques.

54. A computer program product for analyzing a circuit design, the computer program product comprising:

code for receiving circuit design information describing the circuit design to be analyzed, the circuit design including a first plurality of circuit structures;

code for specifying assertions for a second plurality of circuit structures, the second plurality of circuit structures included in the first plurality of circuit structures, wherein for each circuit structure in the second plurality of circuit structures, the assertion indicates a context of the circuit design in which the circuit structure is to be analyzed, an attribute associated with the circuit structure, and a constraint associated with the attribute;

code for analyzing the circuit design based on the assertions to identify circuit structures in the first plurality of circuit structures for which assertions have not been specified; and a computer readable medium for storing the codes.

55. A circuit analyzer for analyzing a circuit design, the circuit analyzer comprising:

a memory;

a data processor coupled to the memory, the data processor configured to:

receive circuit design information describing the circuit design to be analyzed, the circuit design including a plurality of circuit structures;

receive an assertion for a first circuit structure from the plurality of circuit structures, the assertion indicating a context of the circuit design in which the first circuit structure is to be analyzed, an attribute associated with the first circuit structure, and a constraint associated with the attribute;

receive a check to be applied to the circuit design; and analyze the circuit design based on the check and the assertion to generate analysis results data, the analysis results data including an instance of the first circuit structure in the circuit design which does not satisfy the constraint specified in the assertion specified for the first circuit structure.

56. The circuit analyzer of claim 55 wherein the analysis results data includes multiple instances of the first circuit structure in the circuit design which do not satisfy the constraint indicated in the assertion for the first circuit structure.

57. The circuit analyzer of claim 56 wherein the analysis results data is formatted as report listing the instances of the first circuit structure according to extent by which the constraint was not satisfied.

58. The circuit analyzer of claim 55 wherein the analysis results data includes information about the plurality of circuit structures.

59. The circuit analyzer of claim 55 wherein the assertion further indicates an action to be performed if the first circuit structure does not satisfy the constraint specified in the assertion.

60. The circuit analyzer of claim 59 wherein the assertion is specified as:

Word1: Word2 Word3 Word4 where "Word1" indicates the attribute associated with the first circuit structure, "Word2" indicates the constraint associated with the attribute, "Word3" indicates the action to be performed if the first circuit structure does not satisfy the constraint indicated in the assertion, and "Word4" indicates the context of the circuit design in which the first circuit structure is to be analyzed.

61. The circuit analyzer of claim 59 wherein the data processor is configured to perform the action specified in the assertion when the first circuit structure does not satisfy the constraint indicated in the assertion.

62. The circuit analyzer of claim 61 wherein the data processor is configured to perform the action by generating a circuit representation corresponding to a portion of the circuit design including the instance of the first circuit structure which does not satisfy the constraint specified in the assertion to facilitate analysis of the portion.

63. The circuit analyzer of claim 62 wherein the data processor is further configured to perform the action by generating stimuli for analyzing the circuit representation corresponding to the portion.

64. The circuit analyzer of claim 59 further configured to provide an application programming interface enabling a user to configure user defined checks, user defined circuit structures, and user defined actions.

65. The circuit analyzer of claim 55 wherein the data processor receives the circuit design by receiving netlist information describing the circuit design and parasitics information for the circuit design.

66. The circuit analyzer of claim 55 wherein the plurality of circuit structures include circuit structures selectable from a group of circuit structures comprising logic circuit structures, RAM circuit structures, transmission gate circuit structures, pass gate circuit structures, latches, static circuit structures, dynamic circuit structures, cascode circuit structures, ratioed circuit structures, multiplexers, tristates, complementary circuit structures, inverters, AND gates, OR gates, NAND gates, NOR gates, or user-defined circuit structures.

67. The circuit analyzer of claim 55 wherein the check is selectable from a plurality of checks for analyzing drive strength, circuit integrity, charge share, noise margins, electromigration, or coupling noise analysis.

68. The circuit analyzer of claim 55 wherein the context in which the first circuit structure is to be analyzed includes a driver structure connected to the first circuit structure and a receiver structure connected to the first circuit structure, wherein the driver structure drives signals to the first circuit structure and the receiver structure receives signals from the first circuit structure.

69. The circuit analyzer of claim 68 wherein the driver structure comprises a second plurality of circuit structures.

70. The circuit analyzer of claim 69 wherein the second plurality of circuit structures are serially connected to the first circuit structure.

71. The circuit analyzer of claim 69 wherein the second plurality of circuit structures are connected in parallel to the first circuit structure.

72. The circuit analyzer of claim 68 wherein the receiver structure comprises a third plurality of circuit structures.

73. The circuit analyzer of claim 72 wherein the third plurality of circuit structures are serially connected to the first circuit structure.

74. The circuit analyzer of claim 72 wherein the third plurality of circuit structures are connected in parallel to the first circuit structure.

75. The circuit analyzer of claim 68 wherein in order to analyze the circuit design based on the check and the assertion, the data processor is configured to:

determine transistor-level information from the circuit design information;

determine signal flow direction in the circuit design based on the transistor-level information; and identify the plurality of circuit structures from the transistor-level information, the plurality of circuit structures including the first circuit structure, the driver structure, and the receiver structure.

76. The circuit analyzer of claim 75 wherein the data processor is further configured to receive hierarchically related classes of circuit structures, and to identify the plurality of circuit structures by classifying the first circuit structure into a first class of circuit structures.

77. The circuit analyzer of claim 76 wherein the classes of circuit structures include user-defined classes.

78. The circuit analyzer of claim 76 wherein the assertion is associated with the first class of circuit structures and is inherited by all classes of circuit structures which are hierarchical descendants of the first class of circuit structures.

79. The circuit analyzer of claim 76 wherein the assertion is associated with a second class of circuit structures which is hierarchically an ancestor of the first class of circuit structures, and the assertion is inherited by the first class of circuit structures from the second class of circuit structures.

80. The circuit analyzer of claim 75 wherein the data processor is configured to identify the plurality of circuit structures by recognizing the circuit structures using circuit pattern mapping techniques.

81. A computer system for analyzing a circuit design, the system comprising:

a data processor; and a memory coupled to the data processor, the memory storing modules for execution by the data processor; the modules including:

a first receiving module for receiving circuit design information describing the circuit design to be analyzed, the circuit design including a first plurality of circuit structures;

a second receiving module for receiving assertions for a second plurality of circuit structures, the second plurality of circuit structures included in the first plurality of circuit structures, wherein for each circuit structure in the second plurality of circuit structures, the assertion indicates a context of the circuit design in which the circuit structure is to be analyzed, an attribute associated with the circuit structure, and a constraint associated with the attribute; and an analyzer module for analyzing the circuit design based on the assertions to identify circuit structures in the first plurality of circuit structures for which assertions have not been specified.

* * * * *